(12) United States Patent
Gluschenkov et al.

(10) Patent No.: US 10,510,617 B2
(45) Date of Patent: Dec. 17, 2019

(54) CMOS VFET CONTACTS WITH TRENCH SOLID AND LIQUID PHASE EPITAXY

(71) Applicant: INTERNATIONAL BUSINESS MACHINES CORPORATION, Armonk, NY (US)

(72) Inventors: Oleg Gluschenkov, Tannersville, NY (US); Zuoguang Liu, Schenectady, NY (US); Shogo Mochizuki, Clifton Park, NY (US); Hiroaki Niimi, Cahoes, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/918,077

(22) Filed: Mar. 12, 2018

(65) Prior Publication Data
US 2019/0279913 A1 Sep. 12, 2019

(51) Int. Cl.
| | |
|---|---|
| *H01L 21/8238* | (2006.01) |
| *H01L 27/092* | (2006.01) |
| *H01L 29/78* | (2006.01) |
| *H01L 29/51* | (2006.01) |
| *H01L 29/24* | (2006.01) |
| *H01L 29/161* | (2006.01) |

(52) U.S. Cl.
CPC ........ *H01L 21/823814* (2013.01); *H01L 21/823885* (2013.01); *H01L 27/092* (2013.01); *H01L 29/161* (2013.01); *H01L 29/24* (2013.01); *H01L 29/513* (2013.01); *H01L 29/517* (2013.01); *H01L 29/7827* (2013.01)

(58) Field of Classification Search
CPC ..... H01L 21/823814; H01L 21/823885; H01L 27/092; H01L 29/7827; H01L 29/517; H01L 29/24; H01L 21/161; H01L 29/513
See application file for complete search history.

(56) References Cited

U.S. PATENT DOCUMENTS

| | | | |
|---|---|---|---|
| 9,337,255 B1 | 5/2016 | Basu et al. | |
| 9,543,216 B2 | 1/2017 | Niimi et al. | |
| 9,680,473 B1 | 6/2017 | Anderson et al. | |
| 9,755,073 B1 * | 9/2017 | Cheng | H01L 29/7843 |
| 10,068,987 B1 * | 9/2018 | Zang | H01L 29/66666 |

(Continued)

*Primary Examiner* — Galina G Yushina
(74) *Attorney, Agent, or Firm* — Cantor Colburn LLP; Grant Johnson

(57) ABSTRACT

Embodiments are directed to a complementary metal oxide semiconductor having source and drain contacts formed using trench. An n-type field effect transistor (NFET) includes a p-type semiconductor fin vertically extending from an n-type bottom source or drain region disposed on the substrate. A p-type FET (PFET) includes an n-type semiconductor fin vertically extending from a p-type bottom source or drain region disposed on the substrate. A first gate of the NFET is formed around a channel region of the p-type semiconductor fin and a second gate of the PFET is formed around a channel region of the n-type semiconductor fin. The first gate and the second gate include a dipole layer. The NFET and PFET each has a threshold voltage of about 150 mV to about 250 mV and a difference between the threshold voltages of the NFET and PFET is less than about 50 mV.

19 Claims, 39 Drawing Sheets

(56) References Cited

U.S. PATENT DOCUMENTS

| | | |
|---|---|---|
| 2001/0017392 A1 | 8/2001 | Comfort et al. |
| 2010/0155854 A1* | 6/2010 | Stahrenberg ...... H01L 21/82345 |
| | | 257/392 |
| 2012/0098067 A1* | 4/2012 | Yin ................... H01L 21/76254 |
| | | 257/351 |
| 2017/0110182 A1* | 4/2017 | Liaw ........................ G11C 8/16 |
| 2017/0179116 A1 | 6/2017 | Anderson et al. |
| 2017/0222021 A1* | 8/2017 | Mallela ............... H01L 27/0924 |
| 2017/0256544 A1* | 9/2017 | Chai ................. H01L 21/30604 |

* cited by examiner

CMOS VFET CONTACTS WITH TRENCH SOLID AND LIQUID PHASE EPITAXY

BACKGROUND

The present invention generally relates to fabrication methods and resulting structures for semiconductor devices. More specifically, the present invention relates to complementary metal oxide semiconductor (CMOS) vertical field effect transistors (VFETs) having source and drain contacts formed using trench solid or liquid phase epitaxy (SPE/LPE).

Field effect transistors (FETs) have been known for a number of years and are now the transistor of choice for use in complex integrated digital circuits. In general, field effect transistors can be fabricated somewhat more simply and with larger process windows than bipolar transistors and, additionally, allow simplified circuit and device design. Constraints on transistor footprint size and current-carrying capacity are continually increasing to satisfy demands for higher digital switching performance, increased functionality and economy of manufacture.

CMOS technology is currently the dominant technology for the manufacture of inverters and other logic gates used in digital integrated circuits, including microprocessors, microcontrollers, or static random access memory (SRAM). The word "complementary" refers to the fact that a typical CMOS circuit use complementary pairs of hole-type (positive) and electron-type (negative) FETs, i.e., p-FETs and n-FETs, respectively. In the "on" state, the n-FET uses electrons as the current carriers in its channel in combination with n-doped source and drain junctions. In the "on" state, the p-FET uses holes as the current carriers in its channel in combination with p-doped source and drain junctions. In the "off" state, the n-FET and p-FET channels are void or fully depleted of electrons and holes, respectively. The transistor channels are typically made from a lightly doped semiconductor of opposite type: p-type for n-FET and n-type for p-FET to ensure the absence of conduction in the "off" state. Furthermore, in combination with the channel doping, respective n-FET and p-FET gates are made from different materials to properly set n-FET and p-FET threshold voltages, the respective gate voltages at which these transistors transition from the "off" state to the "on" state.

Traditional CMOS fabrication techniques include process flows for constructing planar transistors. With planar transistors, transistor density can be increased by decreasing the pitch between transistor gate elements. However, with planar transistors, the ability to decrease gate pitch is limited by the required gate length and spacer thickness. In recent years, there has been significant research and development with regard to nonplanar transistor architectures. Some non-planar transistor architectures, such as VFETs, employ semiconductor fins and side-gates that can be contacted outside the active region, resulting in increased device density and some increased performance over lateral devices. In VFETs the source to drain current flows in a direction that is perpendicular to a major surface of the substrate. For example, in a known VFET configuration a major substrate surface is horizontal and a vertical fin or nanowire extends upward from the substrate surface. The fin or nanowire forms the channel region of the transistor. A source region and a drain region are situated in electrical contact with the top and bottom ends of the channel region, while the gate is disposed on one or more of the fin or nanowire sidewalls.

Decoupling the gate length from the gate pitch greatly improves the scaling of transistor density. With VFETs device scaling is determined by how closely conductive via contacts can be placed to source/drain and gate regions of the transistor. Unlike planar transistors, however, aggressive scaling of the VFET architecture has placed practical constraints on the maximum available width for the bottom source/drain (S/D) contact. Decreasing the width of the bottom S/D contact to satisfy progressively smaller VFET scaling factors has resulted in a gradual increase of the bottom S/D contact resistance, and consequently, to reductions in device performance. In addition, reducing contact via dimensions has resulted in an increase of the top S/D contact resistance, further degrading device performance. Accordingly, high-performance scaled-down VFET architectures require forming highly-doped and highly-activated semiconducting S/D regions that enable a good conduction into the channel and a low contact resistance between metallic via and semiconducting S/D materials. Because forming S/D regions and/or contacts occurs after forming transistor gates, there is also a practical constraint on the thermal budget for S/D and contact processes imposed by the stability of gate materials, often expressed as a maximum allowable transistor threshold voltage shift of several tens of millivolts.

SUMMARY

Embodiments of the present invention are directed to a method for fabricating a complementary metal oxide semiconductor (CMOS) device having source and drain contacts with trench solid or liquid phase epitaxy (SPE/LPE). A non-limiting example of the method includes forming an NFET on a substrate. The NFET includes a p-type semiconductor fin vertically extending from an n-type bottom source or drain region of the substrate. A PFET is also formed on the substrate. The PFET includes an n-type semiconductor fin vertically extending from a p-type bottom source or drain region of the substrate. A first gate is formed over a channel region of the p-type semiconductor fin and a second gate is formed over a channel region of the n-type semiconductor fin. The first gate and the second gate include a common dipole layer. The NFET and PFET each include a threshold voltage of about 150 mV to about 250 mV and a difference between the threshold voltages of the NFET and PFET is less than about 50 mV.

Embodiments of the present invention are directed to a method for fabricating a CMOS device having source and drain contacts with trench SPE/LPE. A non-limiting example of the method includes forming a first gate over a channel region of a p-type semiconductor fin. The first gate includes a high-k gate dielectric film formed on sidewalls of the p-type semiconductor fin, a first dipole layer formed on the high-k gate dielectric film, and an n-type work function metal (WFM) formed on the first dipole layer. A second gate is formed over a channel region of an n-type semiconductor fin. The second gate includes a high-k gate dielectric film formed on sidewalls of the n-type semiconductor fin, a second dipole layer formed on the high-k gate dielectric film, and a p-type WFM formed on the second dipole layer. The first and second dipole layers include a same material. The first and second gates each include a threshold voltage of about 150 mV to about 250 mV and a difference between the threshold voltages of the first and second gates is less than about 50 mV. A first solid or liquid phase epitaxy (SPE/LPE) layer is formed over the p-type semiconductor fin. The first SPE/LPE layer includes an n-type metastable alloy. A second SPE/LPE layer is formed over the n-type semiconductor fin. The second SPE/LPE layer includes a p-type metastable alloy. The SPE/LPE layers reduce the contact resistivity of source or drain contacts of the CMOS device. The combination of common dipole layers and SPE/LPE layers provides the technical benefit of a CMOS compatible integration of trench epitaxy contacts with a threshold voltage centering scheme.

Embodiments of the invention are directed to semiconductor device. A non-limiting example of the semiconductor device includes an NFET formed on a substrate. The NFET includes a p-type semiconductor fin vertically extending from an n-type bottom source or drain region disposed on the substrate. The semiconductor device also includes a PFET formed on the substrate. The PFET includes an n-type semiconductor fin vertically extending from a p-type bottom source or drain region disposed on the substrate. A first gate is formed over a channel region of the p-type semiconductor fin and a second gate is formed over a channel region of the n-type semiconductor fin. The gates include a common dipole layer. The NFET and PFET each has a threshold voltage of about 150 mV to about 250 mV and a difference between the threshold voltages of the NFET and PFET is less than about 50 mV.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1 depicts a cross-sectional view of a semiconductor structure after a processing operation according to one or more embodiments of the invention;

FIG. 2 depicts a cross-sectional view of the semiconductor structure after a processing operation according to one or more embodiments of the invention;

FIG. 3 depicts a cross-sectional view of the semiconductor structure after a processing operation according to one or more embodiments of the invention;

FIG. 4 depicts a cross-sectional view of the semiconductor structure after a processing operation according to one or more embodiments of the invention;

FIG. 5 depicts a cross-sectional view of the semiconductor structure after a processing operation according to one or more embodiments of the invention;

FIG. 6 depicts a cross-sectional view of the semiconductor structure after a processing operation according to one or more embodiments of the invention;

FIG. 7 depicts a cross-sectional view of the semiconductor structure after a processing operation according to one or more embodiments of the invention;

FIG. 8 depicts a cross-sectional view of the semiconductor structure after a processing operation according to one or more embodiments of the invention;

FIG. 9 depicts a cross-sectional view of the semiconductor structure after a processing operation according to one or more embodiments of the invention;

FIG. 10 depicts a cross-sectional view of the semiconductor structure after a processing operation according to one or more embodiments of the invention;

FIG. 11 depicts a cross-sectional view of the semiconductor structure after a processing operation according to one or more embodiments of the invention;

FIG. 12 depicts a cross-sectional view of a semiconductor structure after a processing operation according to one or more embodiments of the invention;

FIG. 13 depicts a cross-sectional view of a semiconductor structure after a processing operation according to one or more embodiments of the invention;

FIG. 14 depicts a cross-sectional view of the semiconductor structure after a processing operation according to one or more embodiments of the invention;

FIG. 15 depicts a cross-sectional view of the semiconductor structure after a processing operation according to one or more embodiments of the invention;

FIG. 16 depicts a cross-sectional view of the semiconductor structure after a processing operation according to one or more embodiments of the invention;

FIG. 17 depicts a cross-sectional view of the semiconductor structure after a processing operation according to one or more embodiments of the invention;

FIG. 18 depicts a cross-sectional view of the semiconductor structure after a processing operation according to one or more embodiments of the invention;

FIG. 19 depicts a cross-sectional view of the semiconductor structure after a processing operation according to one or more embodiments of the invention;

FIG. 20 depicts a cross-sectional view of the semiconductor structure after a processing operation according to one or more embodiments of the invention;

FIG. 21 depicts a cross-sectional view of the semiconductor structure after a processing operation according to one or more embodiments of the invention;

FIG. 22 depicts a cross-sectional view of the semiconductor structure after a processing operation according to one or more embodiments of the invention;

FIG. 23 depicts a cross-sectional view of the semiconductor structure after a processing operation according to one or more embodiments of the invention;

FIG. 24 depicts a cross-sectional view of the semiconductor structure after a processing operation according to one or more embodiments of the invention;

FIG. 25 depicts a cross-sectional view of the semiconductor structure after a processing operation according to one or more embodiments of the invention;

FIG. 26 depicts a cross-sectional view of the semiconductor structure after a processing operation according to one or more embodiments of the invention;

FIG. 27 depicts a cross-sectional view of the semiconductor structure after a processing operation according to one or more embodiments of the invention;

FIG. 28 depicts a cross-sectional view of the semiconductor structure after a processing operation according to one or more embodiments of the invention;

FIG. 29 depicts a cross-sectional view of the semiconductor structure after a processing operation according to one or more embodiments of the invention;

FIG. 30 depicts a cross-sectional view of the semiconductor structure after a processing operation according to one or more embodiments of the invention;

FIG. 31 depicts a cross-sectional view of the semiconductor structure after a processing operation according to one or more embodiments of the invention;

FIG. 32 depicts a cross-sectional view of the semiconductor structure after a processing operation according to one or more embodiments of the invention;

FIG. 33 depicts a cross-sectional view of the semiconductor structure after a processing operation according to one or more embodiments of the invention;

FIG. 34 depicts a cross-sectional view of the semiconductor structure after a processing operation according to one or more embodiments of the invention;

FIG. 35 depicts a cross-sectional view of the semiconductor structure after a processing operation according to one or more embodiments of the invention;

FIG. 36 depicts a cross-sectional view of the semiconductor structure after a processing operation according to one or more embodiments of the invention;

FIG. 37 depicts a cross-sectional view of the semiconductor structure after a processing operation according to one or more embodiments of the invention;

Figure 1:
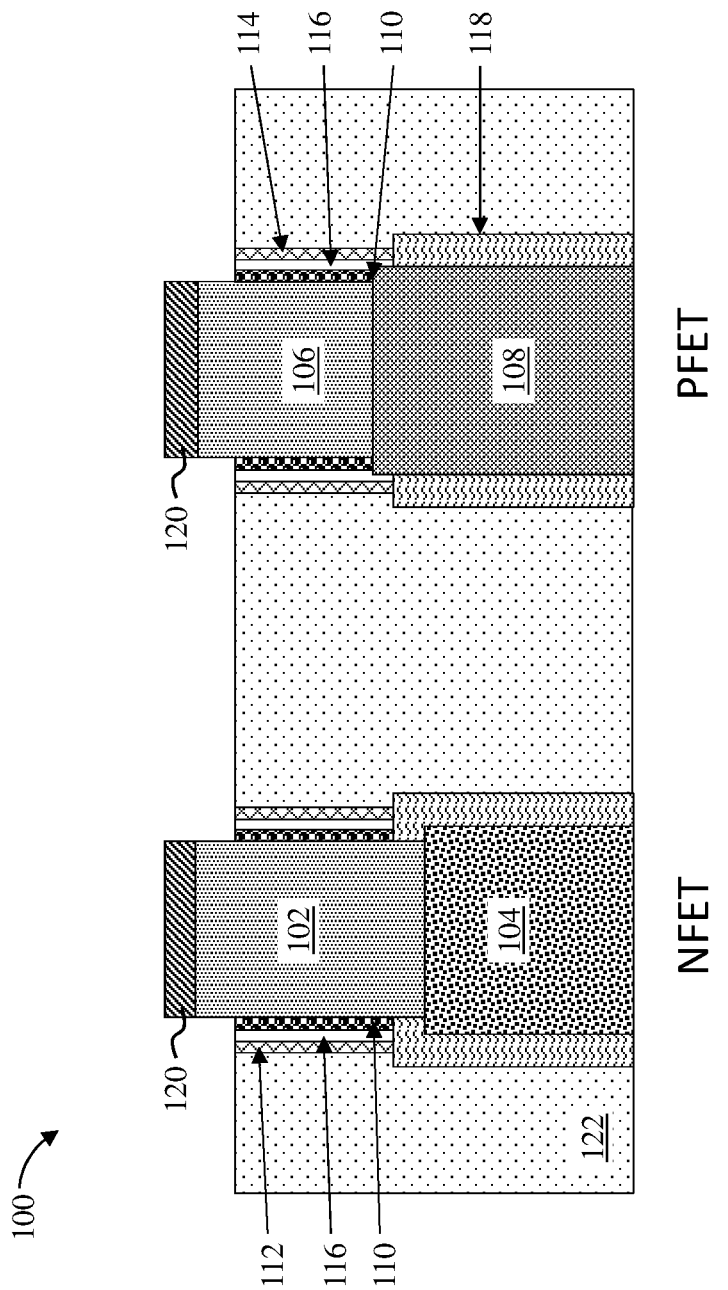
FIGS. 1-12 depict cross-sectional views of a first embodiment of a semiconductor structure after various processing operations according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as previously noted herein, progressively scaling VFET footprints has resulted in a gradual increase of the bottom S/D contact resistance, and consequently, to reductions in device performance. There are challenges, however, in reducing the VFET S/D contact resistance for both n-FETs and p-FETs beyond the 10 nm node. Conventional VFETs employ contacts formed using a combination of through trench implantation and solid, liquid, or gas phase epitaxy. The solid and liquid epitaxial re-growth is referred to as SPE and LPE, respectively. Gas-phase epitaxial growth from gaseous precursors is referred to as an epitaxial growth. Such contacts are referred to herein as "trench epitaxy" contacts. Trench epitaxy contacts formed in this manner have shown very low contact resistivities of less than about $2\times10^{-9}$ ohm-cm$^2$ for both n-FETs and p-FETs. Conventional trench epitaxy contacts, however, require a thermal process that induces a positive threshold voltage shift in n-FETs and a negative threshold voltage shift, measured in its absolute value, in p-FETs. For example, laser spike annealing (LSA) at about 900 degrees Celsius is needed to enable trench SPE and results in an n-FET or p-FET threshold voltage shift of about ±40 to 50 mV (n-FET increases, p-FET absolute value decreases).

High-performance CMOS technologies often require a low threshold voltage nFET and pFET to speed up data transfer along certain critical circuits or data paths. To enable this feature, the process technology for high-performance CMOS devices supports transistors with multiple threshold voltages, offering to the circuit designers standard threshold voltage transistors as well as reduced threshold voltage transistors. Advantageously, the reduced threshold voltage nFETs and pFETs have their respective linear threshold voltage targets, measured in absolute values, selected from about 150 mV to about 250 mV and to within 50 mV or less of each other for opposite polarity FETs. One way to build transistors with multiple threshold voltages is to incorporate a dipole layer into the gate structures that shifts threshold voltages to a lower absolute value or closer to zero. However, dissimilar dipole layers are required in conventional CMOS devices to lower threshold voltages of the nFET and pFET because the dipole layer that lowers nFET threshold voltage increase the absolute value of pFET threshold voltage and vise versa. An alternative way to build transistors with multiple threshold voltages is to employ silicon germanium (SiGe) channels with varying content of Ge. Higher Ge content in the channel lowers the absolute value of pFET threshold voltage and increases the nFET threshold voltage.

Turning now to an overview of aspects of the present invention, one or more embodiments of the invention provide CMOS compatible methods for employing trench epitaxy SPE and/or LPE methods in NFET and PFET source and drain contacts with centered and reduced threshold voltages. To center the NFET and PFET threshold voltages around similar and low-absolute-value targets, conventional trench epitaxy SPE/LPE techniques are modified by a gate stack engineering process that adds a common dipole layer to both nFET and pFET gate stacks. The process begins with a conventional CMOS device having n-type and p-type semiconductor fins formed on bottom source/drain regions. An n-FET gate having a dipole gate dielectric layer (also known as a metal oxide layer, or simply, a dipole layer) is formed over channel regions of the p-type fin and a p-FET gate having a common (i.e., the same) dipole layer is formed over channel regions of the n-type fin. In some embodiments of the present invention, the common dipole layer includes MgO, LaO, or YO. The dipole layer includes dipoles that will center threshold voltages around targets with similar absolute values. For example, the common dipole layer in the n-FET gate decreases a threshold voltage of the n-FET gate by about 40 to 50 mV while the same dipole layer in the p-FET gate increases a threshold voltage of the p-FET gate, measured by its absolute value, by about 40 to 50 mV. While introducing the common dipole layer moves the absolute values of nFET and pFET threshold voltages in opposite directions, the end result will be centering nFET and pFET threshold voltages around targets with similar absolute values.

Trench epitaxy layers are then formed over the fins and annealed to form SPE/LPE layers. As discussed previously herein, the trench epitaxy anneal results in a threshold voltage shift of ±40 to 50 mV. This threshold voltage shift is countered by the threshold voltage centering of the common dipole layers. In other words, the dipole layers counteract the conventional threshold voltage shifts resulting from the anneal. In this manner, the S/D contact resistance can be reduced in both the n-FET and p-FET of a CMOS device while partially or completely mitigating the threshold voltage shift associated with conventional trench epitaxy SPE/LPE methods. This process is particularly useful for the reduced threshold voltage nFETs and pFETs due to a synergetic benefit of increased nFET and pFET "on" currents through the combination of reduced contact resistance and reduced threshold voltage. Furthermore, this process benefits CMOS circuits with reduced threshold voltage FETs in applications having pFETs with SiGe-channels. While well-suited to VFETs due to the top S/D being formed by trench epitaxy (i.e., the trench epitaxy contact is naturally the contact structure), this modified process for providing trench epitaxy contacts with centered threshold voltages is applicable to finFETs, planar transistors, and nanosheet transistors (NSFETs).

Turning now to a more detailed description of aspects of the present invention, the VFET structure detailed in FIGS. 1-12 employs two soft block masks for creating high-performance nFETs and pFETs with low contact resistance structures enabled by respective SPE and/or LPE layers and with centered threshold voltages enabled by a common dipole layer.

FIG. 1 depicts a cross-sectional view of a VFET structure 100 having a NFET region and a PFET region after a gate stack recess during an intermediate operation of a method of fabricating a semiconductor device according to one or more embodiments of the invention. As depicted in FIG. 1, a partially fabricated semiconductor device can include one or more NFET devices having p-type vertical fins 102 (hereinafter fin 102) formed on a bottom n-type S/D region 104 and one or more PFET devices having n-type fins 106 (hereinafter fin 106) formed on a bottom p-type S/D region 108. The bottom S/D regions 104 and 108 can be formed in or on a substrate (not depicted). Each of the fins 102 and 106 can have a height ranging from 1 nm to 150 nm, for example, from 10 nm to 50 nm. Each of the fins 102 and 106 can have a width ranging from 5 nm to 40 nm, for example, from 10 nm to 20 nm. Adjacent fins can be separated by a pitch ranging from 20 nm to 100 nm, for example, from 30 nm to 50 nm. The fins 102 can be made of any suitable NFET material, such as, for example, Si. The fins 106 can be made of any suitable PFET material, such as, for example, SiGe. SiGe is preferable for PFETs due to a lower absolute value of pFET threshold voltage and a lower hole effective mass that coupled with the incorporation of compressive strain into the channel, significantly increases hole mobility. In some embodiments of the present invention, the fins 102 are Si and the fins 106 are SiGe. In some embodiments, the fins 106 are SiGe with Ge content of from about 1 to about 50 atomic percent, for example, from 5 to 25 atomic percent.

The substrate can be any suitable substrate material, such as, for example, monocrystalline Si, SiGe, SiC, III-V compound semiconductor, II-VI compound semiconductor, or semiconductor-on-insulator (SOI). In some embodiments of the invention, the substrate includes a buried oxide layer (not depicted). The fins 102 and 106 can be electrically isolated from other regions of the substrate by a shallow trench isolation (STI). The STI (not depicted) can be of any suitable dielectric material, such as, for example, a silicon oxide.

The bottom S/D regions 104 and 108 can be source or drain regions formed in the substrate by a variety of methods, such as, for example, in-situ doped epitaxy, doped following the epitaxy, or by implantation and plasma doping, and can be annealed and activated by a variety of rapid thermal processing methods such as, for example, rapid thermal annealing, flash annealing, and laser annealing. In some embodiments of the present invention, the bottom S/D region 104 is an n-type bottom S/D and the bottom S/D region 108 is a p-type bottom S/D. In some embodiments of the present invention, the bottom S/D region 104 includes SiP and the bottom S/D region 108 includes SiGe.

The bottom S/D regions 104 and 108 can be formed by any suitable process, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), and MBE. In some embodiments of the invention, the bottom S/D regions 104 and 108 include epitaxial semiconductor materials grown from gaseous or liquid precursors. In some embodiments of the invention, epitaxial regions are epitaxially grown over the substrate. Epitaxial semiconductor materials can be grown using vapor-phase epitaxy (VPE), MBE, liquid-phase epitaxy (LPE), or other suitable processes. Epitaxial silicon, SiGe, and/or carbon doped silicon (Si:C) can be doped during deposition (in-situ doped) by adding dopants, n-type dopants (e.g., phosphorus or arsenic) or p-type dopants (e.g., Ga, B, $BF_2$, or Al). The dopant concentration in the doped regions can range from $1 \times 10^{19}$ cm$^{-3}$ to $2 \times 10^{21}$ cm$^{-3}$, or between $1 \times 10^{20}$ cm$^{-3}$ and $1 \times 10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surface, and generally do not deposit material on exposed surfaces, such as silicon dioxide or silicon nitride surfaces.

In some embodiments of the invention, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments of the invention, the doped regions include silicon. In some embodiments of the invention, the doped regions include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Gates are formed over channel regions (i.e., sidewalls) of the fins 102 and 106. In some embodiments of the invention, the gates can be high-k metal gates (HKMG) and can include, for example, one or more high-k gate dielectric film 110, one or more work function metals (n-type WFM 112 and p-type WFM 114), and a common dipole layer 116. The high-k gate dielectric film 110, common dipole layer 116, and n-type WFM 112 collectively define a first gate stack in the NFET region, while the high-k gate dielectric film 110, common dipole layer 116, and p-type WFM 114 collectively define a second gate stack in the PFET region.

The high-k gate dielectric film 110 includes dielectric materials having a dielectric constant greater than 3.9, 7.0, or 10.0. Non-limiting examples of suitable materials for the dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. Other metal oxides (e.g., of the type AO) include NiO, AlON, $Ta_2O_5$, $SrTiO_3$, $LaAlO_3$, $ZrO_2$, $Gd_2O_3$, MgO, MgNO, hafnium silicates (HfSiOx), hafnium silicon oxynitrides (HfSiON), $HfLaO_x$, $HfLaSiO_x$, $HfLaSiON_x$, or multilayers thereof. The high-k gate dielectric film 110 can further include dopants such as, for example, lanthanum and aluminum. The gate dielectric material can be formed by suitable deposition processes, for example, CVD, PECVD, atomic layer deposition (ALD), evaporation, physical vapor deposition (PVD), chemical solution deposition, or other like processes. The thickness of the dielectric material can vary depending on the deposition process as well as the composition and number of high-k dielectric materials used. The dielectric material layer can have a thickness in a range from about 0.5 to about 20 nm.

The common dipole layer 116 is formed over the high-k gate dielectric layer 110. As discussed previously herein, one challenge in conventional trench epitaxy SPE/LPE is addressing the threshold voltage shift of about ±40 to 50 mV (n-FET increases, p-FET absolute value decreases) induced by the annealing process. The common dipole layer 116 includes fixed charge materials or embedded dipoles that tune or otherwise shift the threshold voltage of the NFET and PFET gates in a direction opposite the shift caused by the conventional trench epitaxy anneal. In other words, the common dipole layer 116 serves to center the threshold voltage of the NFET and PFET gates around the same or similar absolute value by adding dipoles to the gate dielectric. The fixed charge materials or dipoles can be intrinsic to the materials selected for the spacers or can be added later, using, for example, doping. In some embodiments of the present invention, the common dipole layer 116 includes a dielectric material with a dielectric constant (k-value) greater than that of SiN (e.g., k greater than about 7.0), oxides of the lanthanide series (e.g., LaO, LuO), oxides of alkaline earth metals (e.g., MgO), or other metal oxides of the type AO, such as, for example, YO, HfON, $Al_2O_3$, $TiO_2$, $HfO_2$, NiO, AlON, $Ta_2O_5$, $SrTiO_3$, $LaAlO_3$, $ZrO_2$, $Gd_2O_3$, MgNO, hafnium silicates ($HfSiO_x$), hafnium silicon oxynitrides (HfSiON), $HfLaO_x$, $HfLaSiO_x$, $HfLaSiON_x$, or multilayers thereof. The common dipole layer 116 can be deposited by a suitable deposition process, for example, ALD, CVD, PECVD, PVD, plating, thermal or e-beam evaporation, and sputtering. In some embodiments of the present invention, the common dipole layer 116 includes MgO, LaO, or YO deposited over 5 to 7 blanket ALD cycles. For example, MgO is well-suited to applications requiring smaller threshold voltage shifts while LaO is often employed for inducing larger threshold voltage shifts. This is due to a much higher rate of incorporating La atoms versus Mg atoms into respective oxides per each ALD cycle.

The n-type WFM 112 and p-type WFM 114 can be disposed over the gate dielectric material including the common dipole layer 116. The type of work function metal depends on the type of transistor and can be the same or differ between the nFET and pFET devices. Non-limiting examples of suitable work function metals include p-type work function metals and n-type work function metals. P-type work function metals include compositions such as ruthenium, palladium, platinum, cobalt, nickel, and conductive metal oxides or nitrides, or any combination thereof. N-type work function metals include compositions such as hafnium, zirconium, titanium, tantalum, aluminum, metal carbides (e.g., hafnium carbide, zirconium carbide, titanium carbide, and aluminum carbide), nitrides, aluminides, or any combination thereof. The n-type WFM 112 and p-type WFM 114 can also include a conductive metallic element formed over a work function setting element to boost the conductivity of the gates. The conductive metallic element can include, for example, tungsten, ruthenium, palladium, platinum, cobalt, nickel, or aluminum. The n-type WFM 112 and p-type WFM 114 can be deposited by a suitable deposition process, for example, CVD, PECVD, PVD, plating, thermal or e-beam evaporation, and sputtering and etched by known etching processes.

In some embodiments of the present invention, a bottom primary horizontal spacer 118 is formed between the gates (i.e., the high-k gate dielectric film 110, the WFMs 112 and 114, and the common dipole layer 116) and the bottom S/D regions 104 and 108. The bottom spacer 118 can be also formed on sidewalls of the bottom S/D regions 104 and 108 but its primary function is to vertically isolate conductive gate layers (i.e., n-type WFM 112 and p-type WFM 114) from respective bottom S/D regions 104 and 108. The bottom spacer 118 can include a dielectric material, such as silicon oxide, silicon nitride, silicon oxynitride, or a combination thereof, and can be formed using known deposition and etching processes. In some embodiments of the present invention, the bottom S/D regions 104 and 108 are made to overlap with edges of the gate material, i.e. overlapping with a bottom end of the high-k gate dielectric film 110. This overlap ensures unimpeded current flow from the transistor channel located directly under the gate stack layers (i.e., the first gate stack 110/116/112 or the second gate stack 110/116/114) and the bottom S/D regions 104 and 108. This can be accomplished by annealing the bottom S/D regions 104 and 108 prior to forming gates to outdiffuse their dopants upward past a top surface of the bottom spacer 118 to form a p-n junction above the top surface of the bottom spacer 118.

In some embodiments of the present invention, the fins 102 and 106 are patterned using a hard mask 120. The hard mask 120 includes any suitable hard mask material, such as, for example, a silicon nitride. The hard mask 120 can be formed utilizing a deposition process such as, for example, CVD, plasma enhanced chemical vapor deposition (PECVD), chemical solution deposition, or evaporation. In some embodiments of the invention, the hard mask 120 is formed by a thermal process such as, for example, oxidation or nitridation. The hard mask 120 can have a thickness of about 5 nm to 150 nm, for example, from 30 nm to 60 nm.

An interlayer dielectric (ILD) 122 is formed over the VFET structure 100. The ILD 122 can be any suitable dielectric material, such as, for example, a silicon oxide, and can be formed using any suitable process. In some embodiments of the invention, the ILD 122 is planarized to a surface of the WFMs 112 and 114 and/or the common dipole layer 116 using, for example, CMP. In some embodiments of the invention, the CMP can be utilized to remove excess portions of the ILD 122 selective to the WFMs 112 and 114, the common dipole layer 116, and/or the fins 102 and 106.

Figure 2:
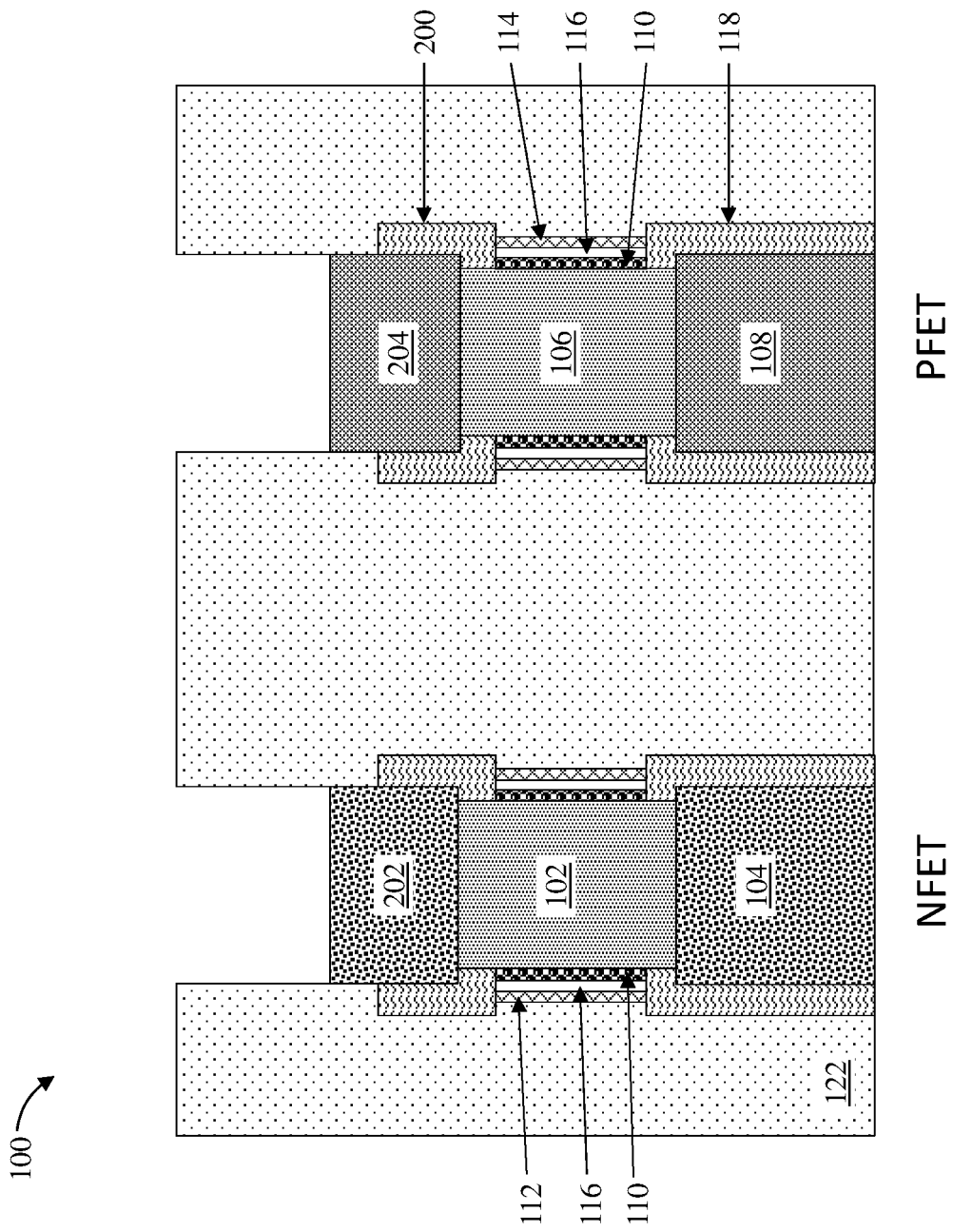

FIG. 2 depicts a cross-sectional view of the VFET structure 100 after forming a top spacer 200 and top S/D regions 202 and 204 during an intermediate operation of the exemplary method of fabricating a semiconductor device according to one or more embodiments of the invention. The top spacer 200 can be formed over the high-k gate dielectric film 110, the WFMs 112 and 114, and the common dipole layer 116, as well as on sidewalls of the fins 102 and 106. The primary function of the top spacer 200 is to vertically isolate conductive gate layers (i.e., n-type WFM 112 and p-type WFM 114) from the respective top S/D regions 202 and 204. The top spacer 200 can include a dielectric material, such as silicon oxide, silicon nitride, silicon oxynitride, or a combination thereof, and can be formed using known deposition and etching processes. In some embodiments of the invention, the top spacer 200 can include a same material as the bottom spacer 118.

The top S/D regions 202 and 204 are formed on exposed portions of the fins 102 and 106, respectively. The top S/D regions 202 and 204 can each be an epitaxial layer epitaxially grown using known processes. In some embodiments of the present invention, the top S/D region 202 is an n-type top S/D and the top S/D region 204 is a p-type top S/D. In some embodiments of the present invention, the top S/D region 202 is formed in a similar manner and composition as the bottom S/D region 104. In some embodiments of the present invention, the top S/D region 204 is formed in a similar manner and composition as the bottom S/D region 108, however, a low-temperature epitaxial process is highly preferred due to inducing large threshold voltage shifts in formed gates at temperatures above about 500 C. In some embodiments of the present invention, the top S/D region 202 includes SiP and the top S/D region 204 includes SiGe. In some embodiments, the top S/D regions 202 and 204 are made to overlap with the edges of the gate material, i.e. overlapping with a top end of the high-k gate dielectric film 110. The overlap ensures unimpeded current flow from the transistor channel located directly under the gate stack layers (i.e., the first gate stack 110/116/112 or the second gate stack 110/116/114) and the top S/D regions 202 and 204. This can be accomplished by implanting the top S/D regions 202 and 204 with respective n-type and p-type dopants at a sufficient implantation energy such that the dopants pass beyond the bottom surface of the top spacer 200 to form a p-n junction below the bottom surface of the top spacer 200. Advantageously, the implantation can be conducted at an elevated temperature to avoid any amorphization of the fins 102 and 106.

As discussed previously herein, epitaxial materials can be grown from gaseous or liquid precursors. In some embodiments of the invention of the invention, the gas source for the deposition of epitaxial semiconductor materials can include a silicon containing gas source, a germanium containing gas source, or a combination thereof. Epitaxial materials can be grown using, for example, VPE, MBE, or LPE. Epitaxial silicon, silicon germanium, and/or carbon doped silicon (Si:C) can be doped during deposition (in-situ doped) by adding n-type dopants (e.g., phosphorus or arsenic) or p-type dopants (e.g., boron or gallium), depending on the type of transistor. The dopant concentration in the top S/D regions 202 and 204 can range from about $1 \times 10^{19}$ cm$^{-3}$ to about $2 \times 10^{21}$ cm$^{-3}$, for example, between about $2 \times 10^{20}$ cm$^{-3}$ and about $1 \times 10^{21}$ cm$^{-3}$.

Figure 3:
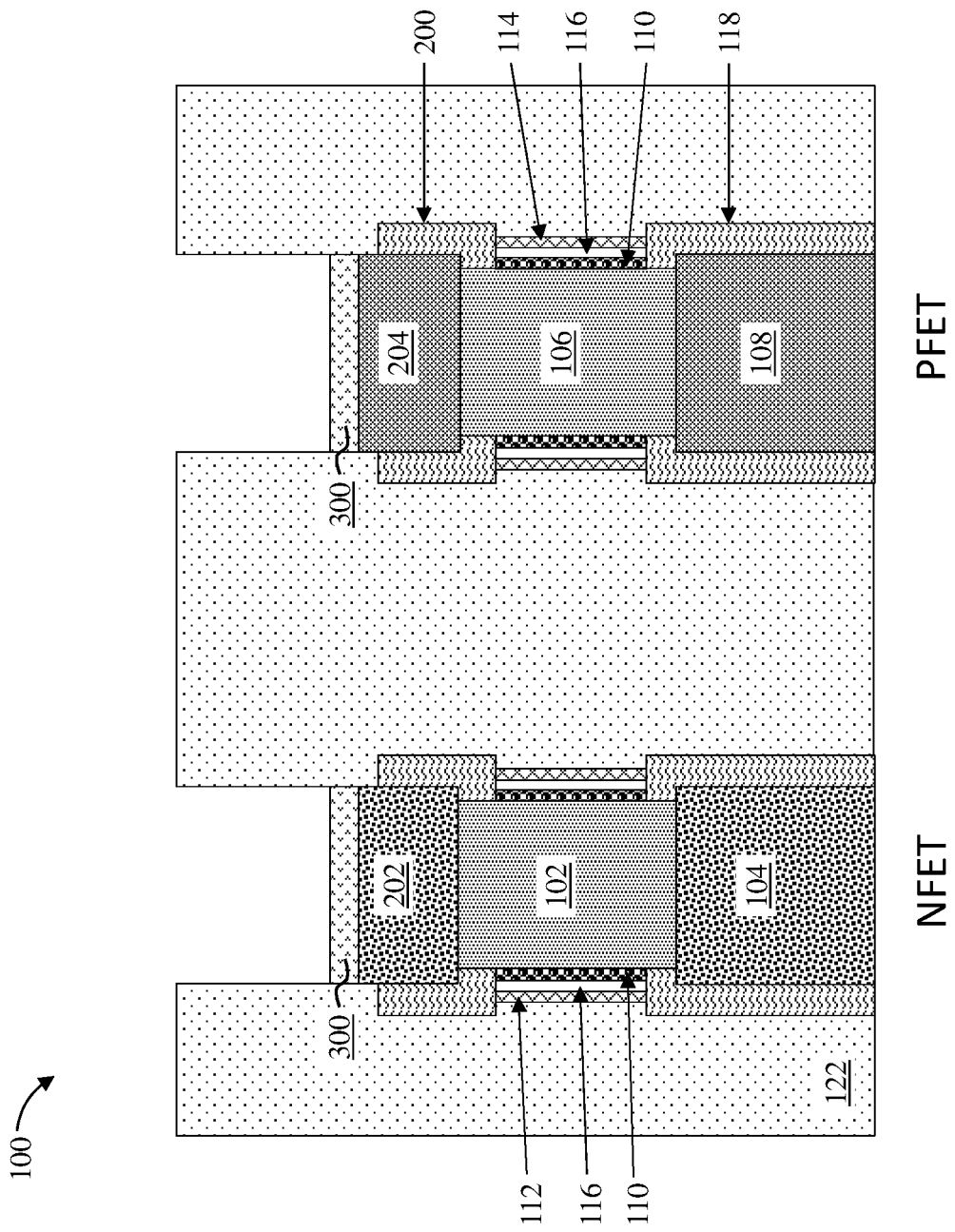

FIG. 3 depicts a cross-sectional view of the VFET structure 100 after forming a trench epitaxy layer 300 on exposed portions of the top S/D regions 202 and 204 during an intermediate operation of the exemplary method of fabricating a semiconductor device according to one or more embodiments of the invention. The trench epitaxy layer 300 can be epitaxially grown using, for example, VPE, MBE, or LP. Low-temperature epitaxial processes are highly preferred due to inducing large threshold voltage shifts in formed gates at temperatures above about 500 C. In some embodiments of the present invention, the trench epitaxy layer 300 includes SiP. In some embodiments of the present invention, the trench epitaxy layer 300 includes SiP having a same P concentration as the top S/D region 202. In some embodiments of the present invention, the trench epitaxy layer 300 includes SiP having a higher P concentration than the top S/D region 202. In some embodiments of the present invention, the trench epitaxy layer 300 is formed to a thickness of less than 20 nm, for example, about 1 to 5 nm, although other thicknesses are within the contemplated scope of the invention.

Figure 4:
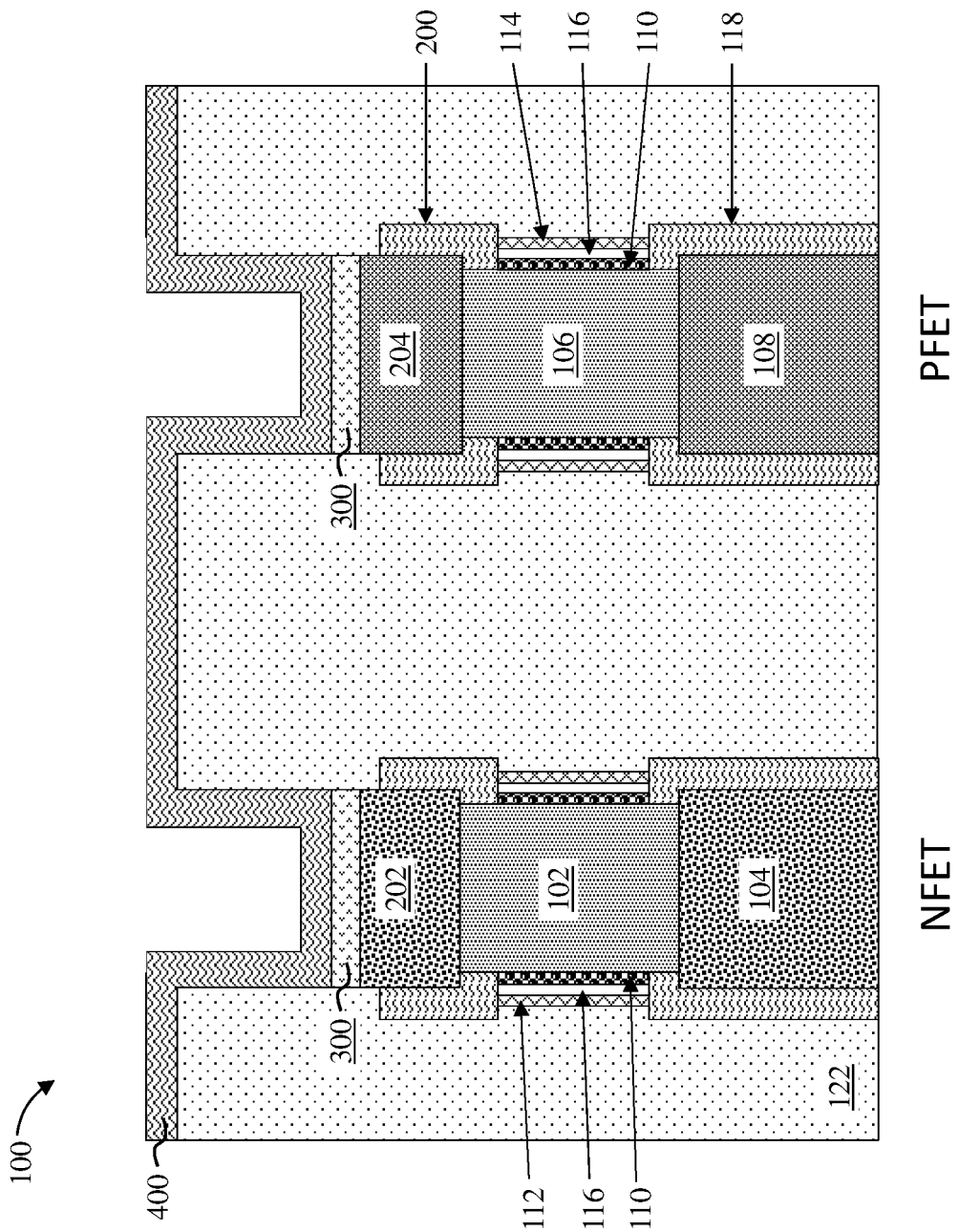

FIG. 4 depicts a cross-sectional view of the VFET structure 100 after conformally forming a liner 400 over the ILD 112 and the trench epitaxy layer 300 during an intermediate operation of the exemplary method of fabricating a semiconductor device according to one or more embodiments of the invention. In some embodiments of the invention, the liner 400 is conformally deposited using, for example, ALD. In some embodiments of the invention, the liner 400 is conformally formed to a thickness of about 2 nm to about 7 nm, although other thicknesses are within the contemplated scope of the invention. The liner 400 can include a dielectric material, such as silicon oxide, silicon nitride, silicon oxynitride, or a combination thereof. In some embodiments of the present invention, the liner 400 includes a silicon oxide.

Figure 5:
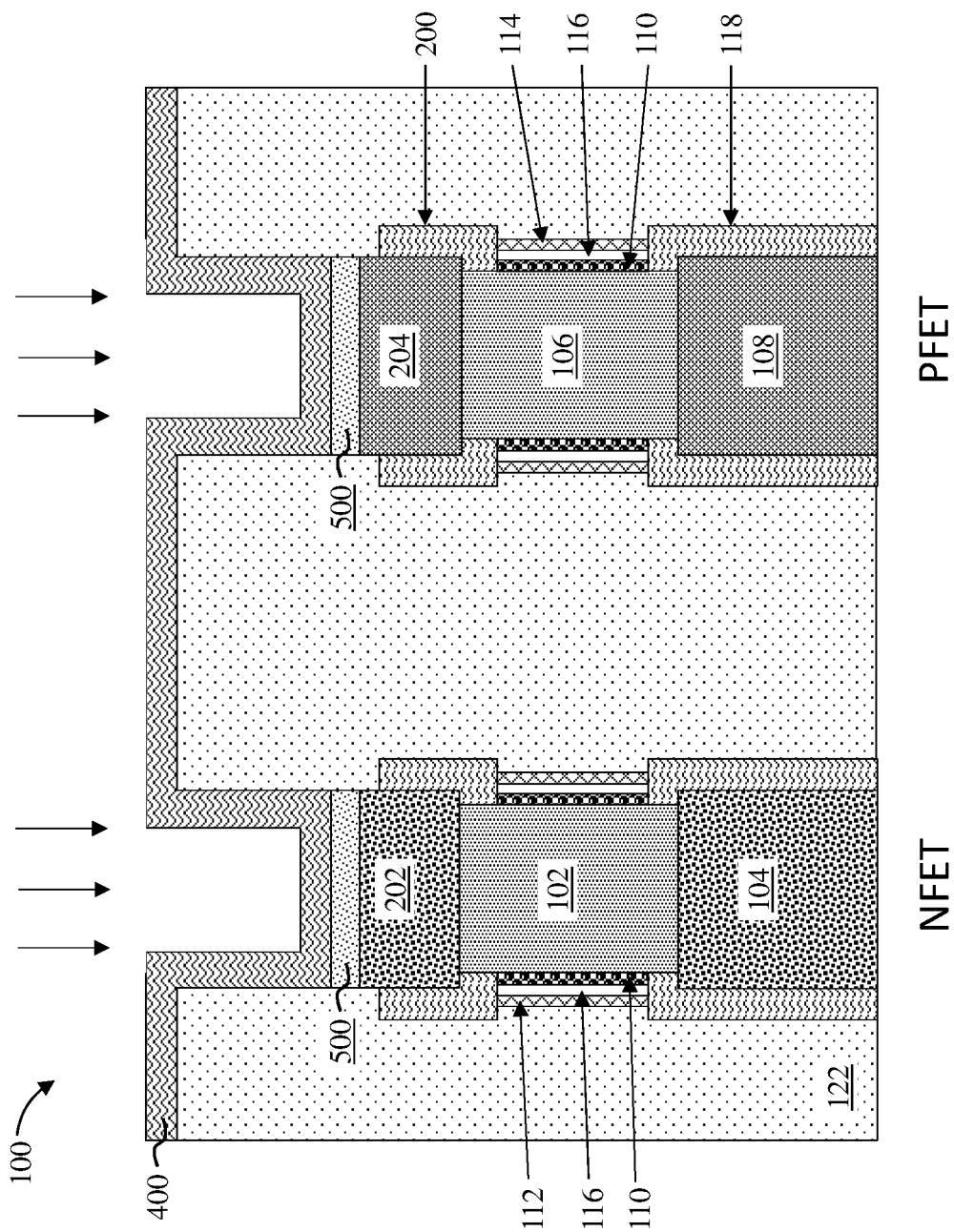

FIG. 5 depicts a cross-sectional view of the VFET structure 100 after a dopant implantation and subsequent SPE/LPE recrystallization during an intermediate operation of the exemplary method of fabricating a semiconductor device according to one or more embodiments of the invention. In some embodiments of the present invention, n-type dopants (e.g., phosphorus) are implanted into the trench epitaxy layer 300. The dopant concentration is well above maximum phosphorus chemical solubility in silicon of $1.5 \times 10^{21}$ cm$^{-3}$ and can range from $2 \times 10^{21}$ cm$^{-3}$ to $7 \times 10^{21}$ cm$^{-3}$, or between $3 \times 10^{21}$ cm$^{-3}$ and $6 \times 10^{21}$ cm$^{-3}$. The phosphorus implantation serves two purposes. The phosphorus implantation increases the concentration of phosphorus in the trench epitaxy layer 300 relative to the top S/D region 202 and well above the maximum phosphorus chemical solubility in silicon. In other words, the top S/D region 202 can be SiP having a first P concentration and the trench epitaxy layer 300 can be SiP having a second, higher P concentration.

The phosphorus implantation also serves to disorder (amorphize) the trench epitaxy layer 300. Once amorphized, a subsequent SPE/LPE recrystallization converts the trench epitaxy layer 300 to a SPE/LPE layer 500 made of metastable Si:P alloy. In some embodiments of the present invention, the SPE/LPE layer 500 is a SiP metastable alloy with a homogenous phosphorus content of above about 6 atomic percent or $3 \times 10^{21}$ cm$^{-3}$. During recrystallization, implanted dopant ions are activated (i.e., dopants are properly located in the desired substitutional sites). A fast recrystallization process allows for activating dopants in excess of their maximum chemical solid solubility and preserves them in this metastable phase. Recrystallization of the SPE/LPE layer 500 can be accomplished using known fast annealing processes. In some embodiments of the present invention, fast recrystallization is accomplished using a peak temperature of about 800 to 1000 degrees Celsius for a few hundreds of microseconds (e.g., less than 10 milliseconds and preferably from about 100 microseconds to about 1 millisecond). In some embodiments of the present invention, fast recrystallization is accomplished using a peak temperature of about 1150 to 1250 degrees Celsius for less than 1 microsecond (e.g., from about 10 to about 500 nanoseconds). In this case, the amorphous layer is first converted into liquid state and then the liquid solidifies into crystalline layer 500 containing metastable SiP alloy. This process is referred to as liquid phase epitaxial re-growth or LPE.

Figure 6:
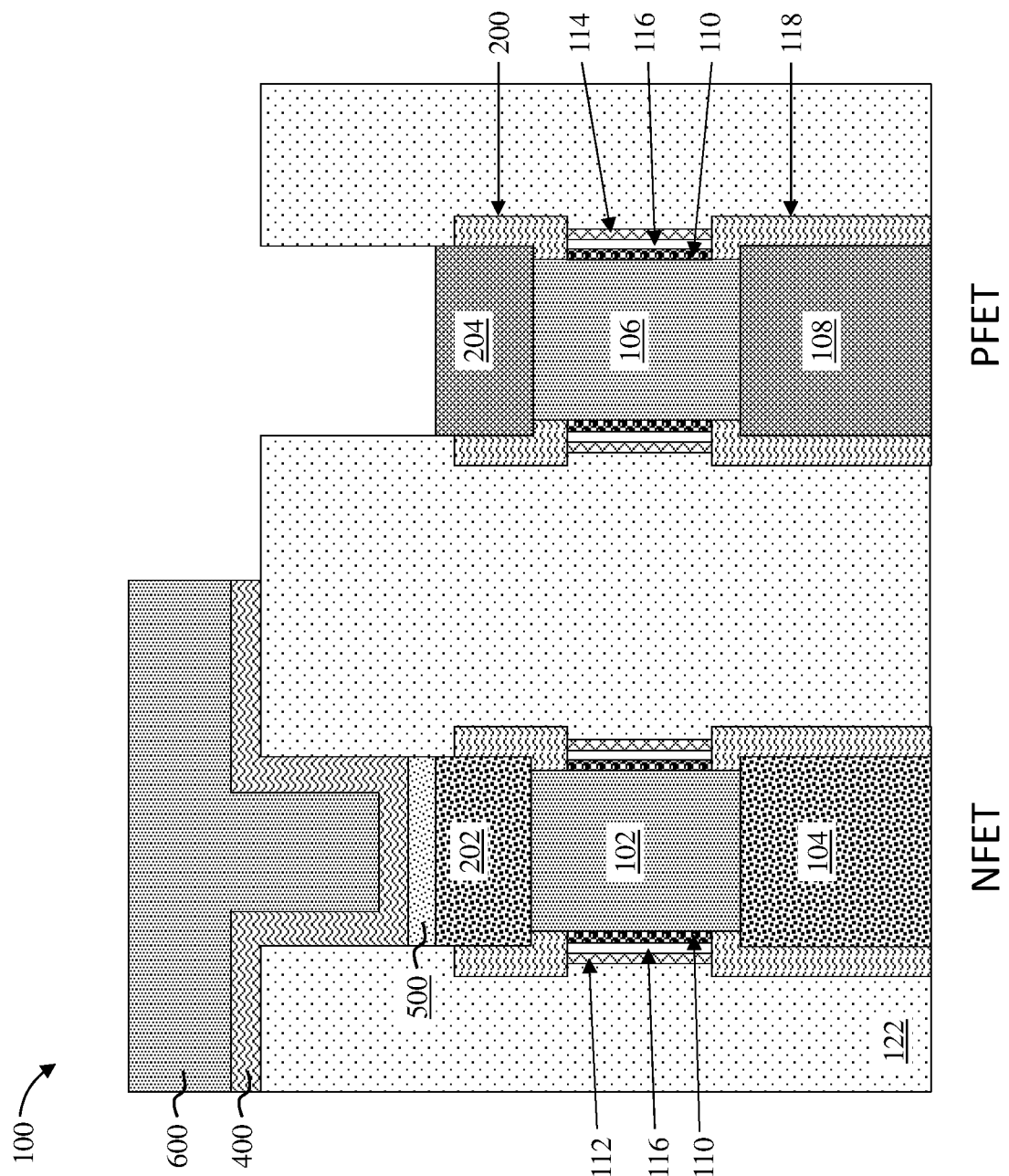

FIG. 6 depicts a cross-sectional view of the VFET structure 100 after forming a mask 600 over the NFET region and removing the liner 400 and SPE/LPE layer 500 from the PFET region during an intermediate operation of the exemplary method of fabricating a semiconductor device according to one or more embodiments of the invention. The mask 600 includes any suitable soft mask material, such as, for example, an optical planarization layer OPL, also known as an optical dielectric layer ODL. In some embodiments of the present invention, the mask 600 is patterned to open the PFET region.

The portion of the liner 400 in the PFET region is then removed to expose the SPE/LPE layer 500. The liner 400 can be removed using any suitable process, such as, for example, a wet etch, a dry etch, or a combination thereof. The exposed SPE/LPE layer 500 is then removed to expose a surface of the top S/D region 204 using, for example, a wet etch, a dry etch, or a combination thereof. In some embodiments of the present invention, the exposed SPE/LPE layer 500 is removed selective to the top S/D region 204. For example, Si can be removed selective to SiGe using a base chemistry such as tetramethyl ammonium hydroxide (TMAH) or ammonium hydroxide (NH$_4$OH).

Figure 7:
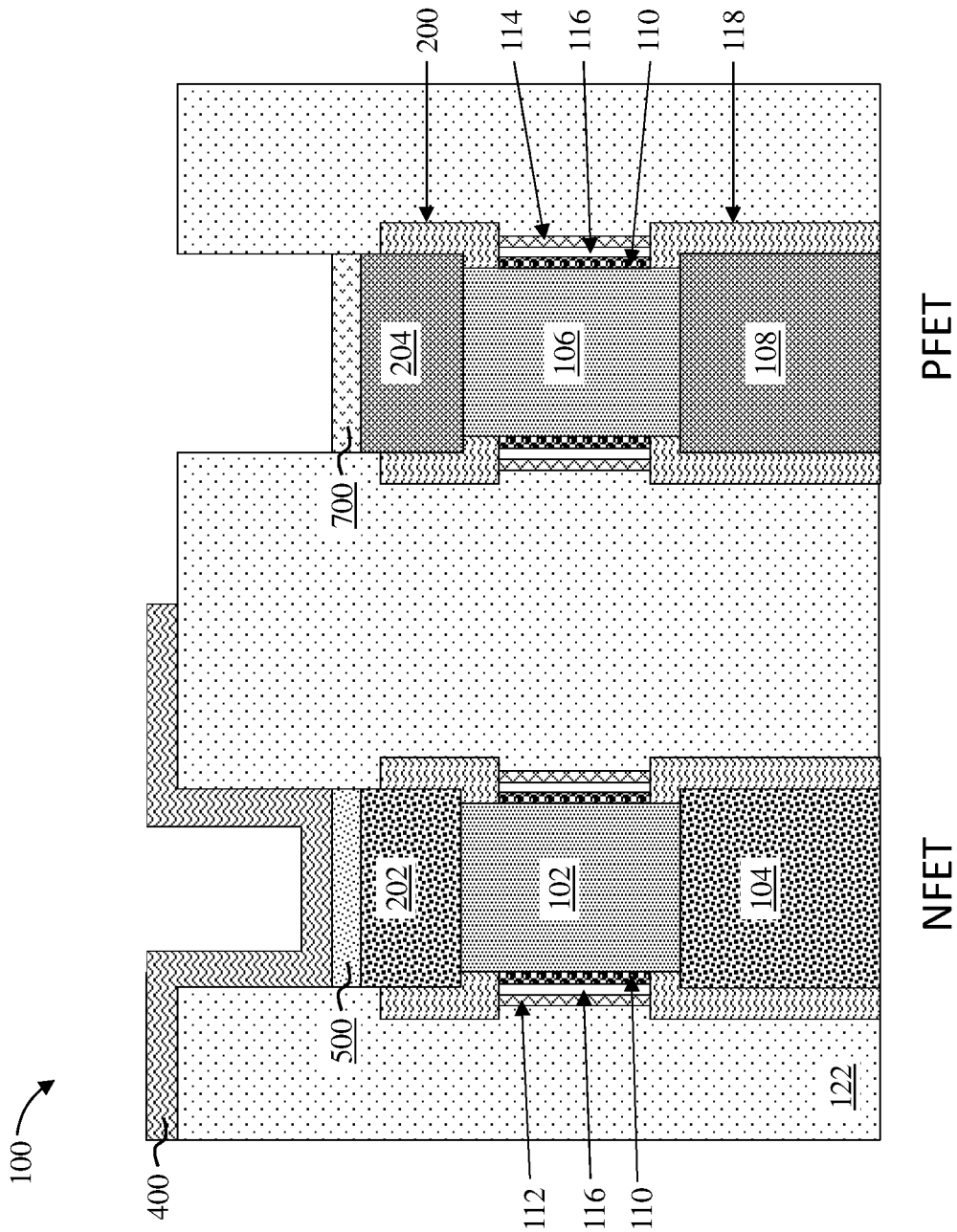

FIG. 7 depicts a cross-sectional view of the VFET structure 100 after removing the mask 600 and forming a trench epitaxy layer 700 over the top S/D region 204 in the PFET region during an intermediate operation of the exemplary method of fabricating a semiconductor device according to one or more embodiments of the invention. The mask 600 can be removed using any suitable process, such as, for example, stripping or ashing. In some embodiments of the present invention, the trench epitaxy layer 700 is selectively epitaxially grown on the exposed surface of the top S/D region 204. In other words, the remaining portion of the liner 400 in the NFET region prevents growth of the trench epitaxy layer 700 over the top S/D region 202 and SPE/LPE layer 500. Low-temperature epitaxial processes are highly preferred due to inducing large threshold voltage shifts in formed gates at temperatures above about 500 C. In some embodiments of the present invention, the trench epitaxy layer 700 includes germanium doped boron (Ge:B) or silicon germanium doped boron (SiGe:B) having a higher germanium concentration than the top S/D region 204. For example, if the top S/D region 204 is SiGe$_{0.5}$ then the trench epitaxy layer 700 is Ge$_x$:B or SiGe$_x$:B where x is greater than 0.5. In some embodiments of the present invention, the trench epitaxy layer 700 is grown to a same thickness as the SPE/LPE layer 500 (within about 10, 20 percent), although other thicknesses are within the contemplated scope of the invention.

Figure 8:
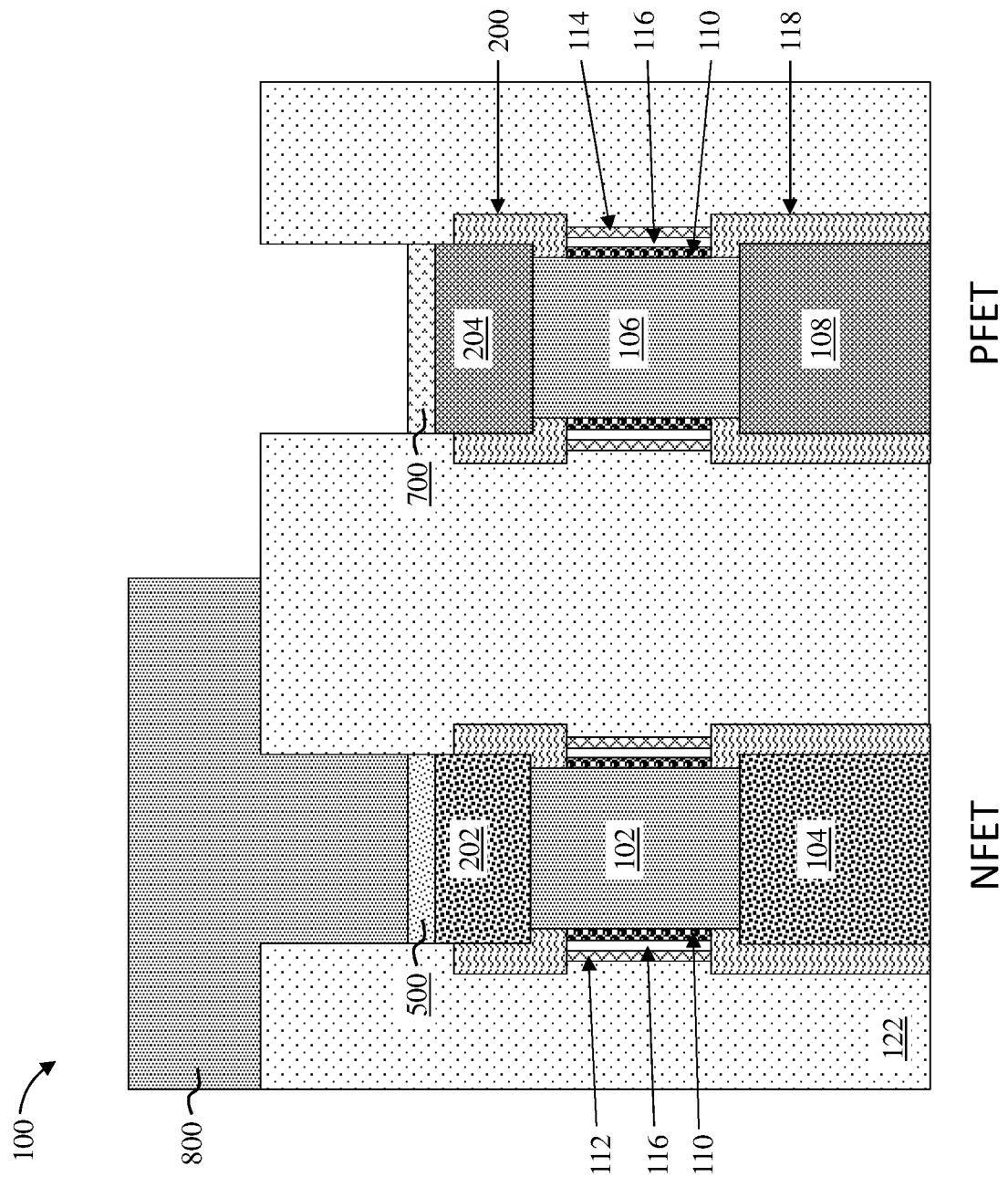

FIG. 8 depicts a cross-sectional view of the VFET structure 100 after removing the liner 400 from the NFET region and covering the SPE/LPE layer 700 with a mask 800 during an intermediate operation of the exemplary method of fabricating a semiconductor device according to one or more embodiments of the invention. The liner 400 can be removed using any suitable process, such as, for example, a wet etch, a dry etch, or a combination thereof. After removing the liner 400, the mask 800 is formed to block the NFET region. The mask 800 can be formed in a similar manner and composition as the mask 600. In some embodiments of the present invention, the mask 800 includes an OPL spin-on layer. The mask 800 can be patterned to open the PFET region.

Figure 9:
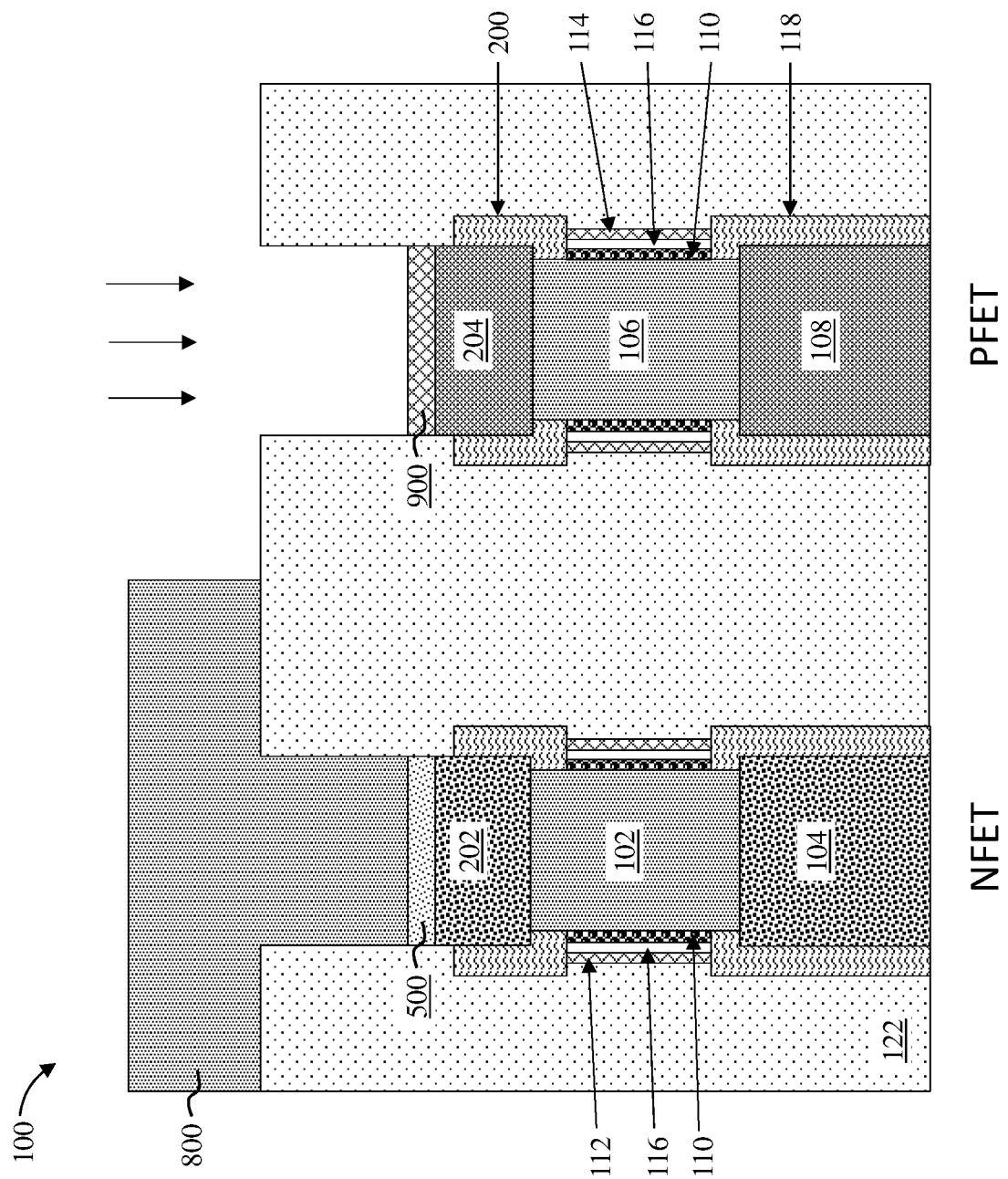

FIG. 9 depicts a cross-sectional view of the VFET structure 100 after a dopant implantation and subsequent recrystallization during an intermediate operation of the exemplary method of fabricating a semiconductor device according to one or more embodiments of the invention. In some embodiments of the present invention, p-type dopants (e.g., Ga) are implanted into the trench epitaxy layer 700. The dopant concentration is well above maximum gallium chemical solubility in pure germanium of about $5 \times 10^{20}$ cm$^{-3}$ and can range from $1 \times 10^{21}$ cm$^{-3}$ to $7 \times 10^{21}$ cm$^{-3}$, or between $1 \times 10^{21}$ cm$^{-3}$ and $5 \times 10^{21}$ cm$^{-3}$. The gallium implantation serves to disorder (amorphize) the trench epitaxy layer 700. Once amorphized, a subsequent fast recrystallization converts the trench epitaxy layer 700 to a SPE/LPE layer 900 made of metastable SiGe:B:Ga alloy. In some embodiments of the present invention, the SPE/LPE layer 900 is a metastable SiGe:B:Ga alloy with a homogenous gallium content of above about 3 atomic percent or $1.5 \times 10^{21}$ cm$^{-3}$. During recrystallization, implanted dopant ions are activated (i.e., dopants are properly located in the desired substitutional sites). A fast recrystallization process allows for activating dopants in excess of their maximum chemical solid solubility and preserves them in this metastable phase. Recrystallization of the SPE/LPE layer 900 can be accomplished using known fast annealing processes. In some embodiments of the present invention, fast recrystallization is accomplished using a peak temperature of about 700 to 900 degrees Celsius for a few hundreds of microseconds (e.g., less than 10 milliseconds and preferably from about 100 microseconds to about 1 millisecond). In some embodiments of the present invention, fast recrystallization is accomplished using a peak temperature of about 1000 to 1150 degrees Celsius for less than 1 microsecond (e.g., from about 10 to about 500 nanoseconds). In this case, the amorphous layer is first converted into liquid state and then the liquid solidifies into crystalline layer 900 containing metastable SiGe:B:Ga alloy.

Figure 10:
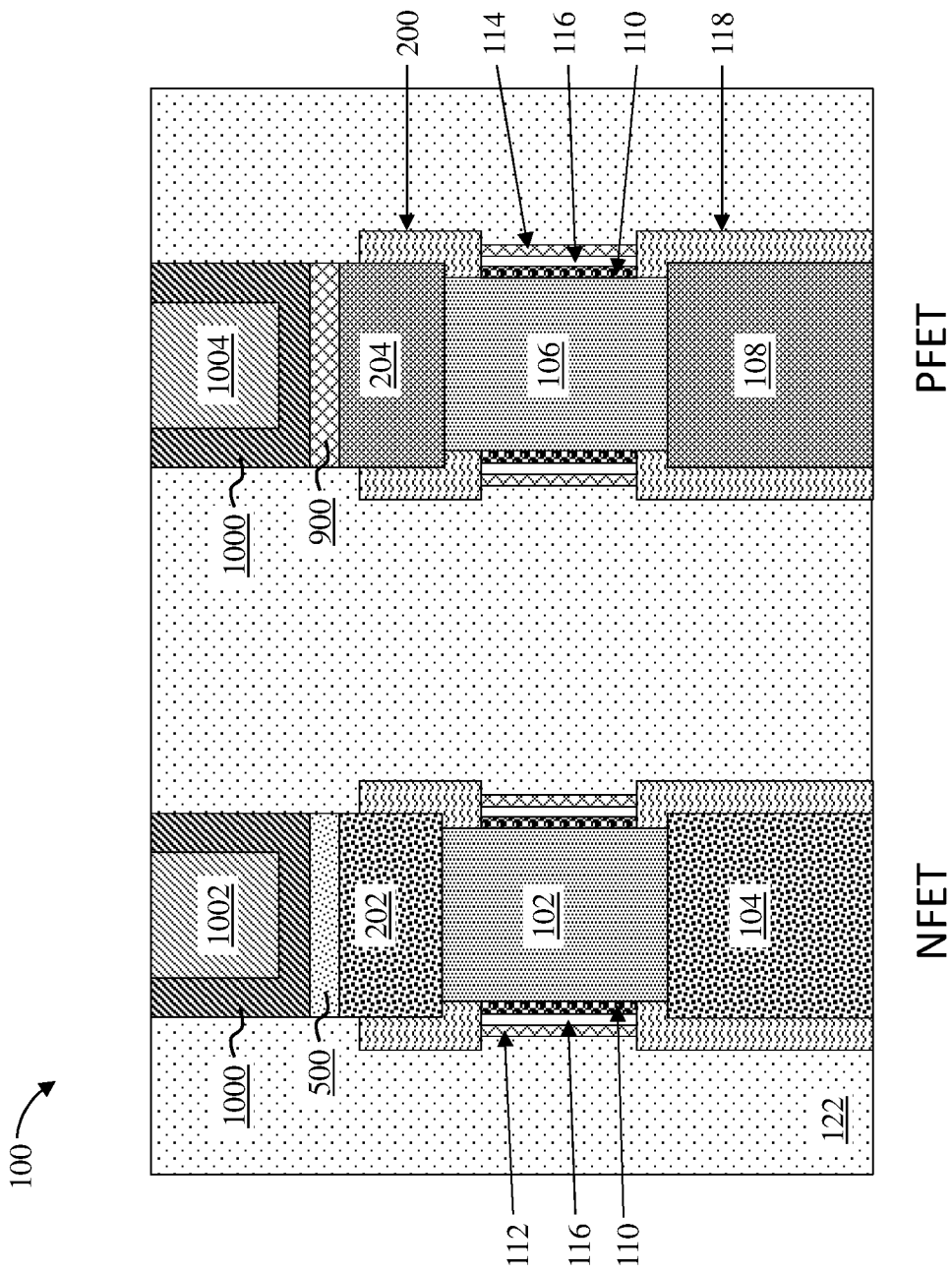

FIG. 10 depicts a cross-sectional view of the VFET structure 100 after forming a metal liner 1000, NFET top S/D contact 1002 (contact 1002), and PFET top S/D contact 1004 (contact 1004) during an intermediate operation of the exemplary method of fabricating a semiconductor device according to one or more embodiments of the invention. The top contacts 1002 and 1004 can be formed using known metallization techniques. In some embodiments of the invention the thickness of the ILD 122 is increased by depositing additional dielectric material prior to forming the top contacts 1002 and 1004. The ILD 122 can then be patterned into open trenches (not depicted) using known processes, such as a wet or dry etch. In some embodiments of the invention, the top contacts 1002 and 1004 are overfilled into the trenches, forming overburdens above a surface of the ILD 122. The overburden can then be planarized using, for example, CMP.

The top contacts 1002 and 1004 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments of the invention, the top contacts 1002 and 1004 include tungsten and the metal liner 1000 is a Ti/TiN liner. The metal liner 1000 is a barrier that prevents metal in the top contacts 1002 and 1004 from diffusing into, or doping, the surrounding materials, which can degrade their properties. Silicon, for example, forms deep-level traps when doped with copper. An ideal barrier metal liner must limit metal diffusivity sufficiently to chemically isolate the conductor from the surrounding materials and should have a high electrical conductivity, for example, tantalum nitride and tantalum (TaN/Ta), titanium, titanium nitride, cobalt, ruthenium, and manganese. Advantageously, the respective metastable dopant-semiconductor alloys of SPE/LPE layers 500 and 900 allow for semiconductor-metal junctions (formed between these layers and the metallic liner 1000) with very low contact resistivities of less than about $2 \times 10^{-9}$ ohm-cm$^2$ for both n-FETs and p-FETs, and, in the case of LPE-formed layers 500/900 of less than about $1 \times 10^{-9}$ ohm-cm$^2$.

Figure 11:
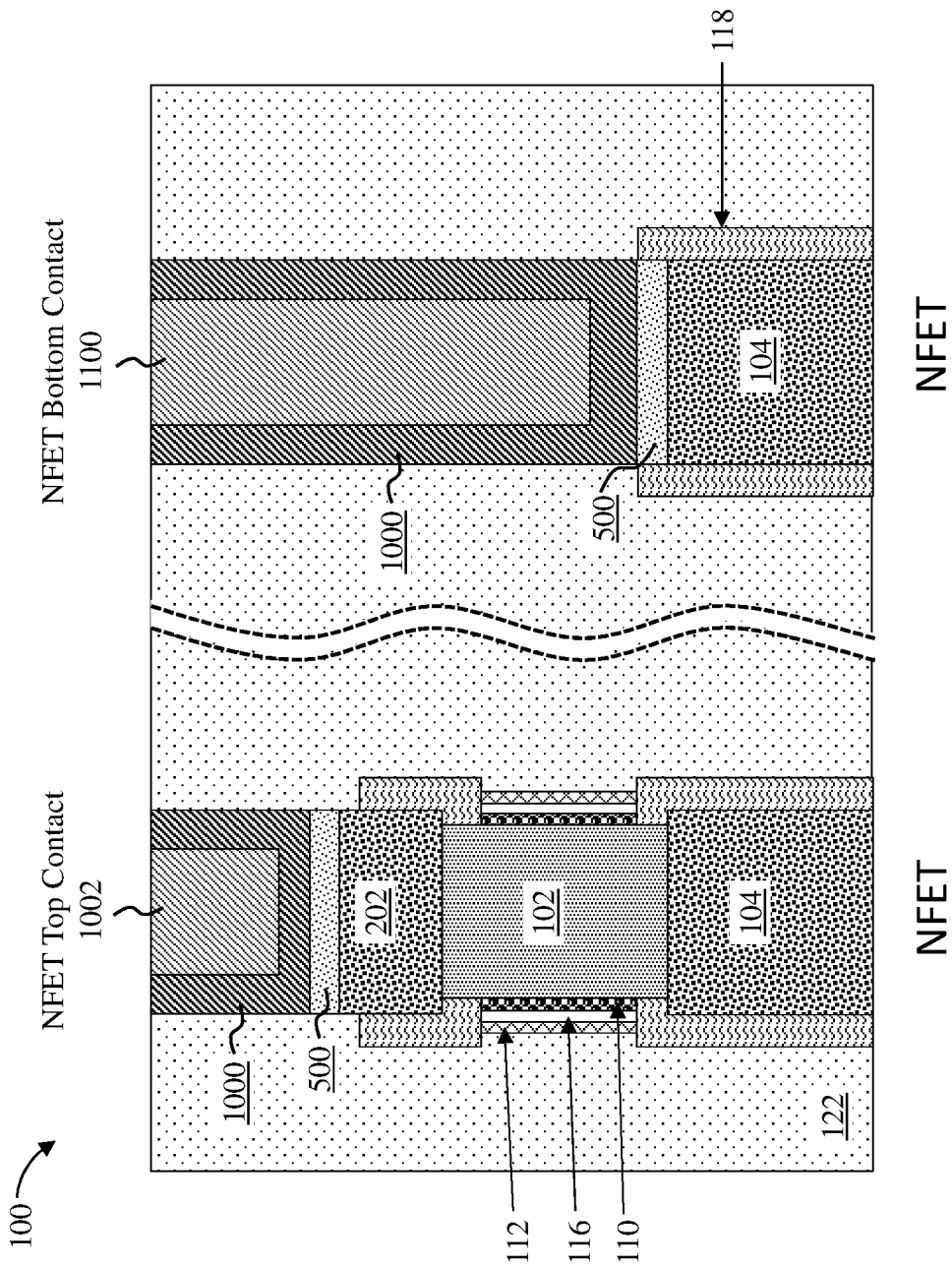

FIG. 11 depicts a cross-sectional view of the VFET structure 100 after forming the contact 1002 and a bottom S/D contact 1100 (contact 1100) in the NFET region according to one or more embodiments of the invention. The contact 1100 can be formed in a like manner and composition as the contact 1002 but is on another portion of the bottom S/D region 104. As depicted in FIG. 11, a portion of the SPE/LPE layer 500 is formed between the bottom S/D region 104 and the contact 1100. In some embodiments of the present invention, the SPE/LPE layer 500 is formed concurrently over the bottom S/D region 104 and the top S/D region 202.

Figure 12:
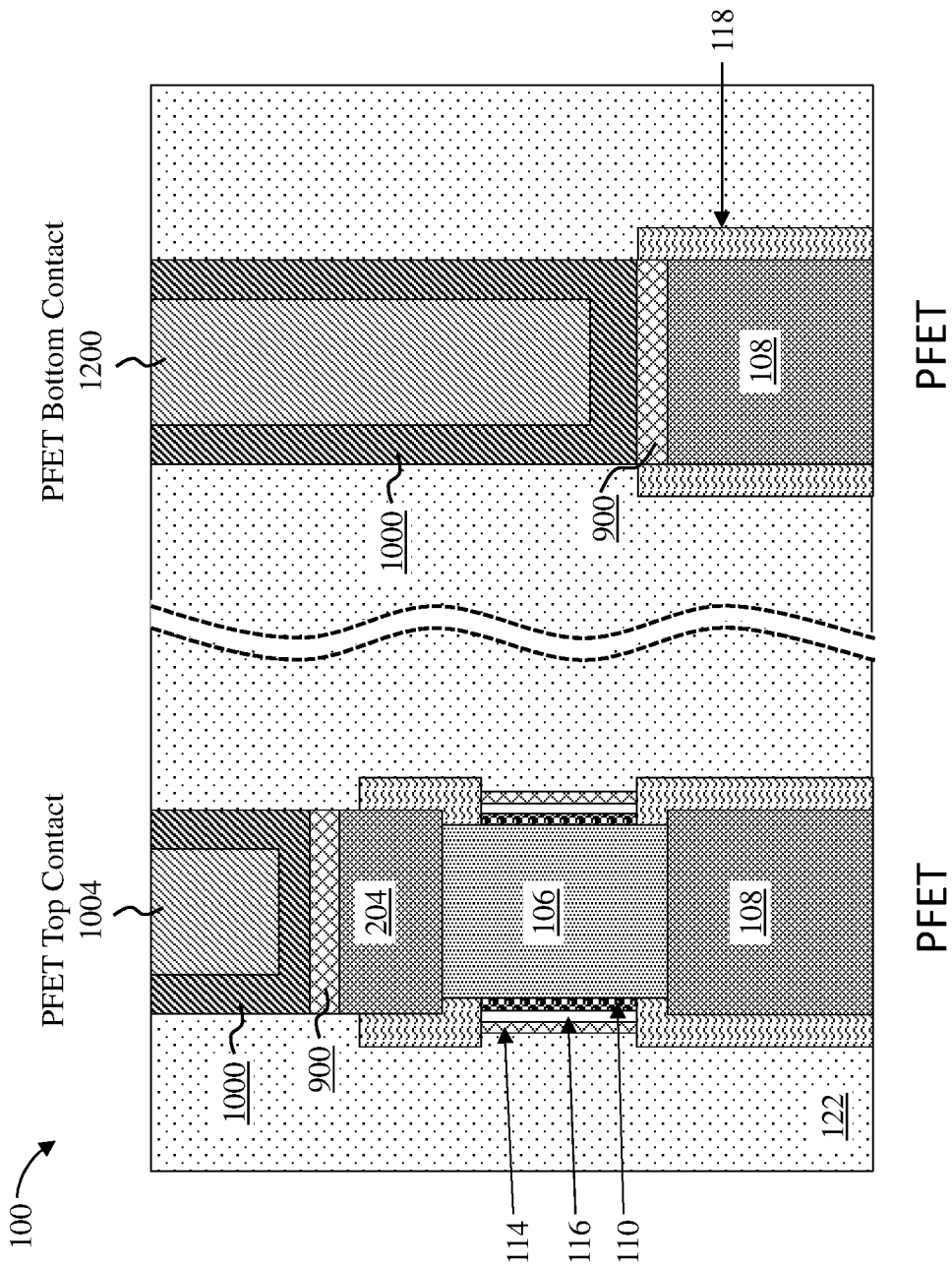

FIG. 12 depicts a cross-sectional view of the VFET structure 100 after forming the contact 1004 and a bottom S/D contact 1200 (contact 1200) in the PFET region according to one or more embodiments of the invention. The contact 1200 can be formed in a like manner and composition as the contact 1004 but is on another portion of the bottom S/D region 108. As depicted in FIG. 12, a portion of the SPE/LPE layer 900 is formed between the bottom S/D region 108 and the contact 1200. In some embodiments of the present invention, the SPE/LPE layer 900 is formed concurrently over the bottom S/D region 108 and the top S/D region 204.

Figure 13:
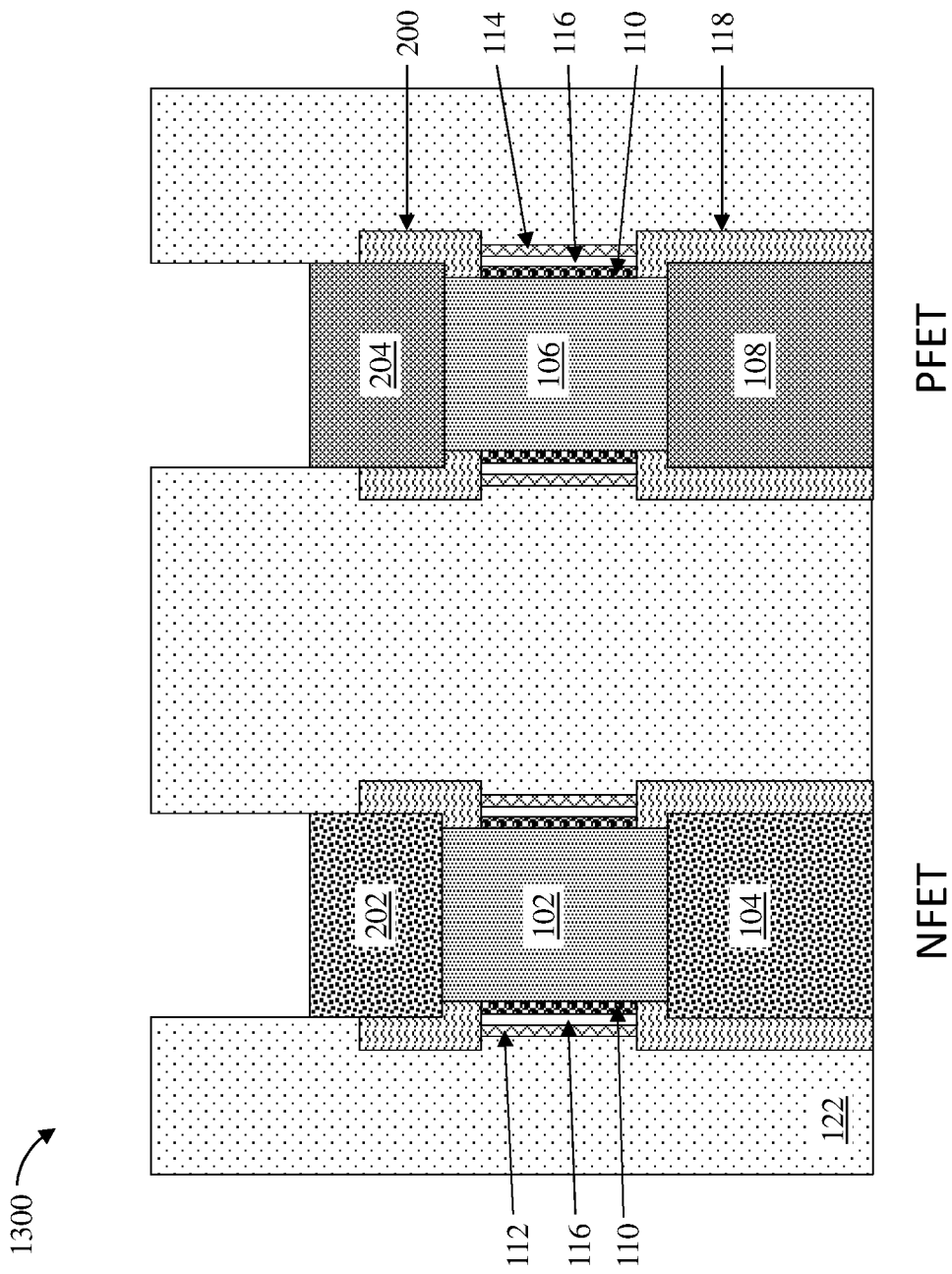
FIGS. 13-19 depict cross-sectional views of a second embodiment of a semiconductor structure after various processing operations according to one or more embodiments of the invention.

FIGS. 13-19 depict a cross-sectional view of an alternative VFET structure 1300 formed during various intermediate operations of fabricating a semiconductor device according to one or more embodiments of the invention. The VFET structure 1300 detailed in FIGS. 13-19 employs no additional soft block masks (i.e. a maskless embodiment) for creating high-performance nFETs and pFETs with low contact resistance structures enabled by respective SPE or LPE layers and with centered threshold voltages enabled by a common dipole layer. As depicted in FIG. 13, the VFET structure 1300 is initially formed in a similar manner as the VFET structure 100 depicted in FIG. 2.

Figure 14:
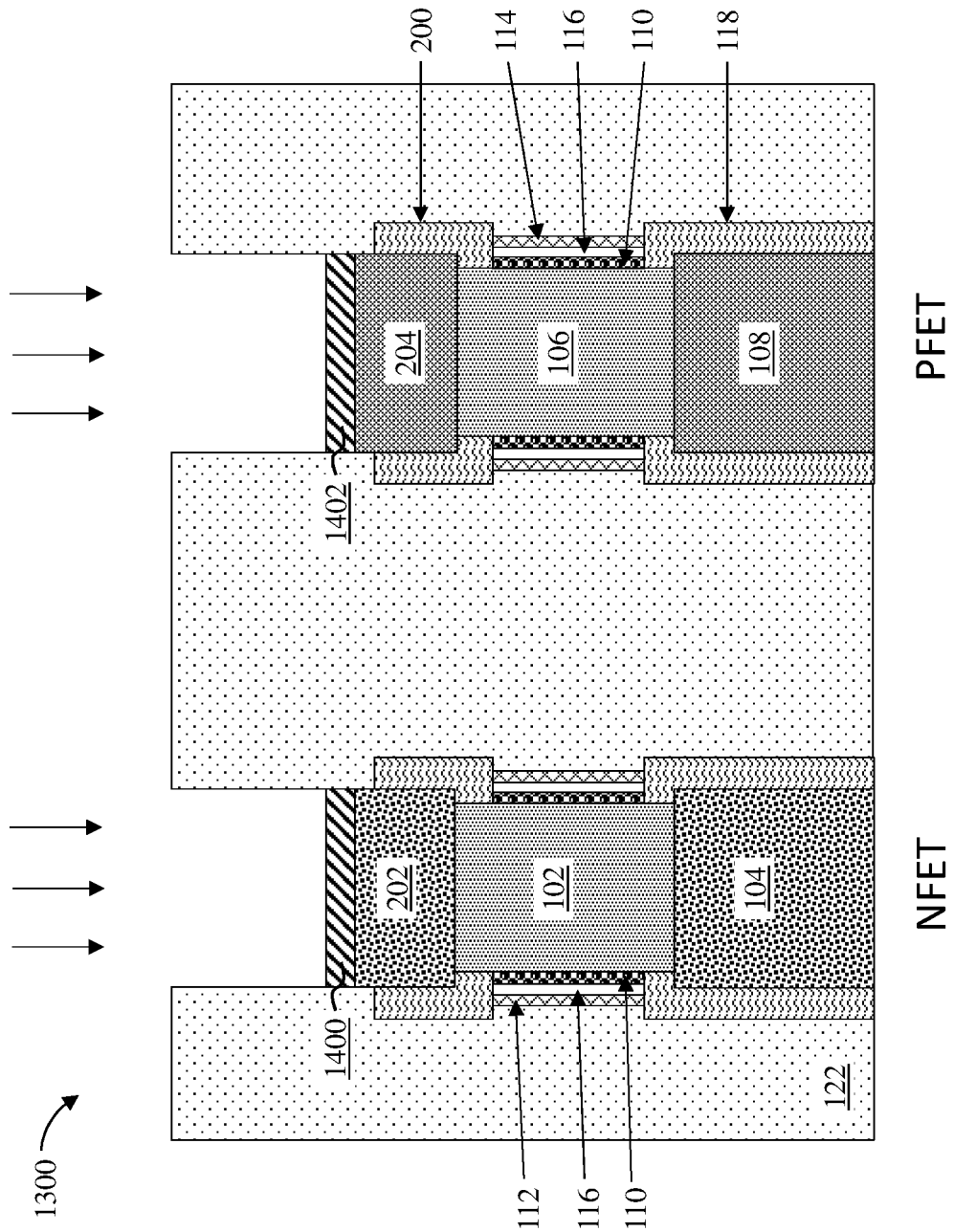

FIG. 14 depicts a cross-sectional view of the VFET structure 1300 after a blanket dopant implantation during an intermediate operation of the exemplary method of fabricating a semiconductor device according to one or more embodiments of the invention. In some embodiments of the present invention, p-type dopants (e.g., Ga) are implanted into the top S/D regions 202 and 204 to form doped layers 1400 and 1402, respectively. The dopant concentration well above maximum gallium chemical solubility in pure germanium of about $5 \times 10^{20}$ cm$^{-3}$ and can range from $1 \times 10^{21}$ cm$^{-3}$ to $7 \times 10^{21}$ cm$^{-3}$, or between $1 \times 10^{21}$ cm$^{-3}$ and $5 \times 10^{21}$ cm$^{-3}$. The gallium implantation serves to disorder (amorphize) a portion of the top S/D regions 202 and 204 (which becomes, e.g., the doped layers 1400 and 1402). In some embodiments of the present invention, the Ga implantation amorphizes about 4 to 10 nm of the top S/D regions 202 and 204. In some embodiments of the present invention, the doped layer 1400 includes amorphous gallium doped SiP (a-SiP:Ga) and the doped layer 1402 includes amorphous gallium doped SiGe (a-SiGe:Ga).

Figure 15:
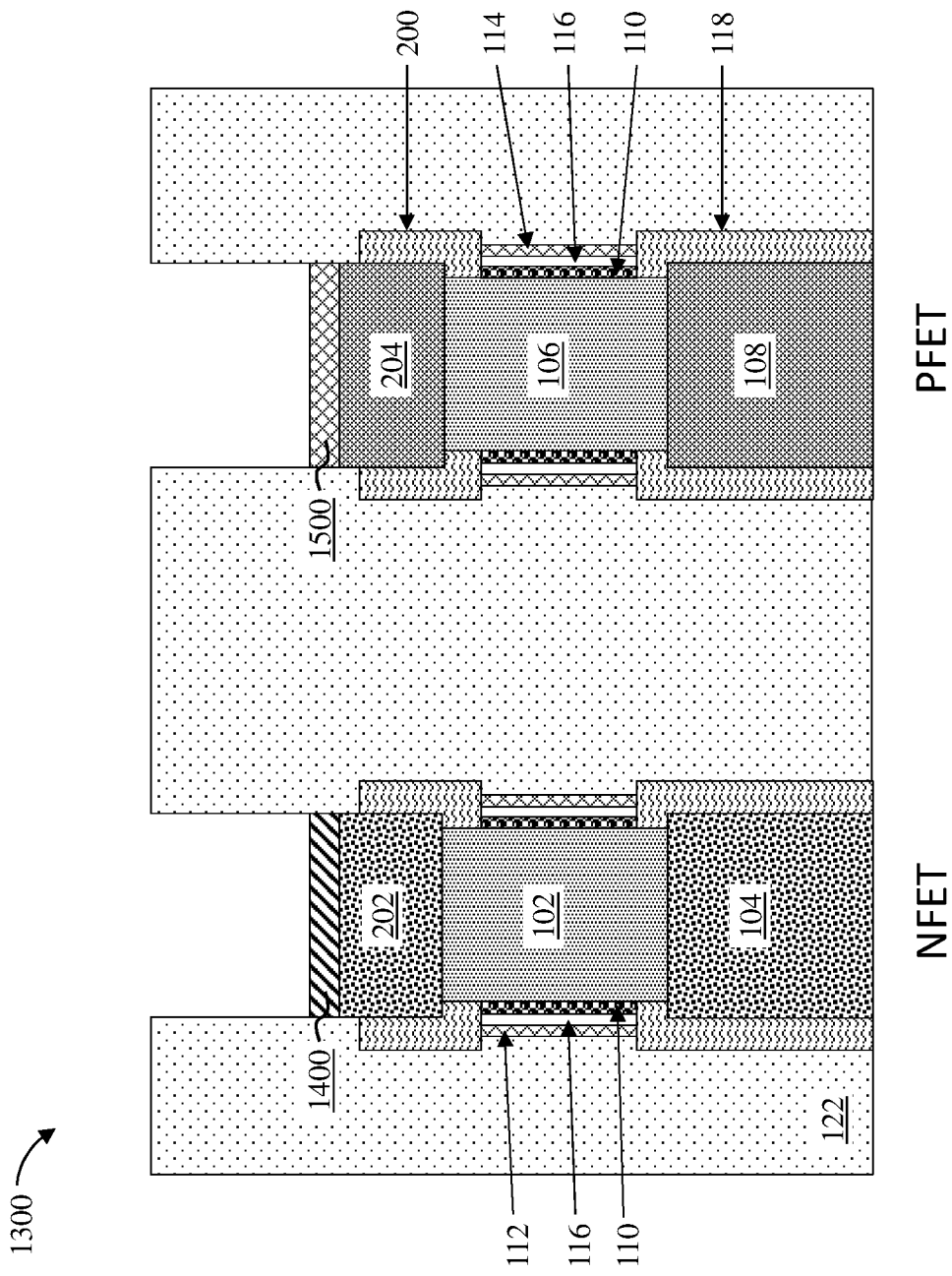

FIG. 15 depicts a cross-sectional view of the VFET structure 1300 after recrystallization during an intermediate operation of the exemplary method of fabricating a semiconductor device according to one or more embodiments of the invention. Once amorphized, a SPE/LPE process selectively recrystallizes the doped layer 1402 to a SPE/LPE layer 1500. This selective recrystallization does not recrystallize the doped layer 1400. Selective recrystallization is possible when the doped layer 1400 includes SiP and the doped layer 1402 includes SiGe having a Ge concentration of more than about 30 atomic percent, for example, 40 to 65 percent.

In some embodiments of the present invention, the SPE/LPE layer 1500 is crystalline gallium doped silicon germanium (c-SiGe:Ga) with homogenous Ga concentration well in excess of its maximum chemical solubility in underlying SiGe material. During recrystallization, implanted dopant ions are activated (i.e., dopants are properly located in the desired substitutional sites). Recrystallization of the SPE/ LPE layer 1500 can be accomplished using, for example, millisecond-scale laser annealing such as laser spike annealing (LSA) at a peak temperature of about 700 to 750 degrees Celsius for a few hundreds of microseconds (e.g., less than 10 milliseconds and preferably from about 100 microseconds to about 1 millisecond). The peak temperature is adjusted depending on the germanium concentration in the SiGe. $SiGe_x$ (x between 0.4 and 0.65) will recrystallize at peak temperatures above about 700 degrees Celsius while Si will recrystallize at peak temperatures above about 850 degrees Celsius. This difference in peak temperatures provides a process window between 700 and 850 degrees Celsius.

Figure 16:
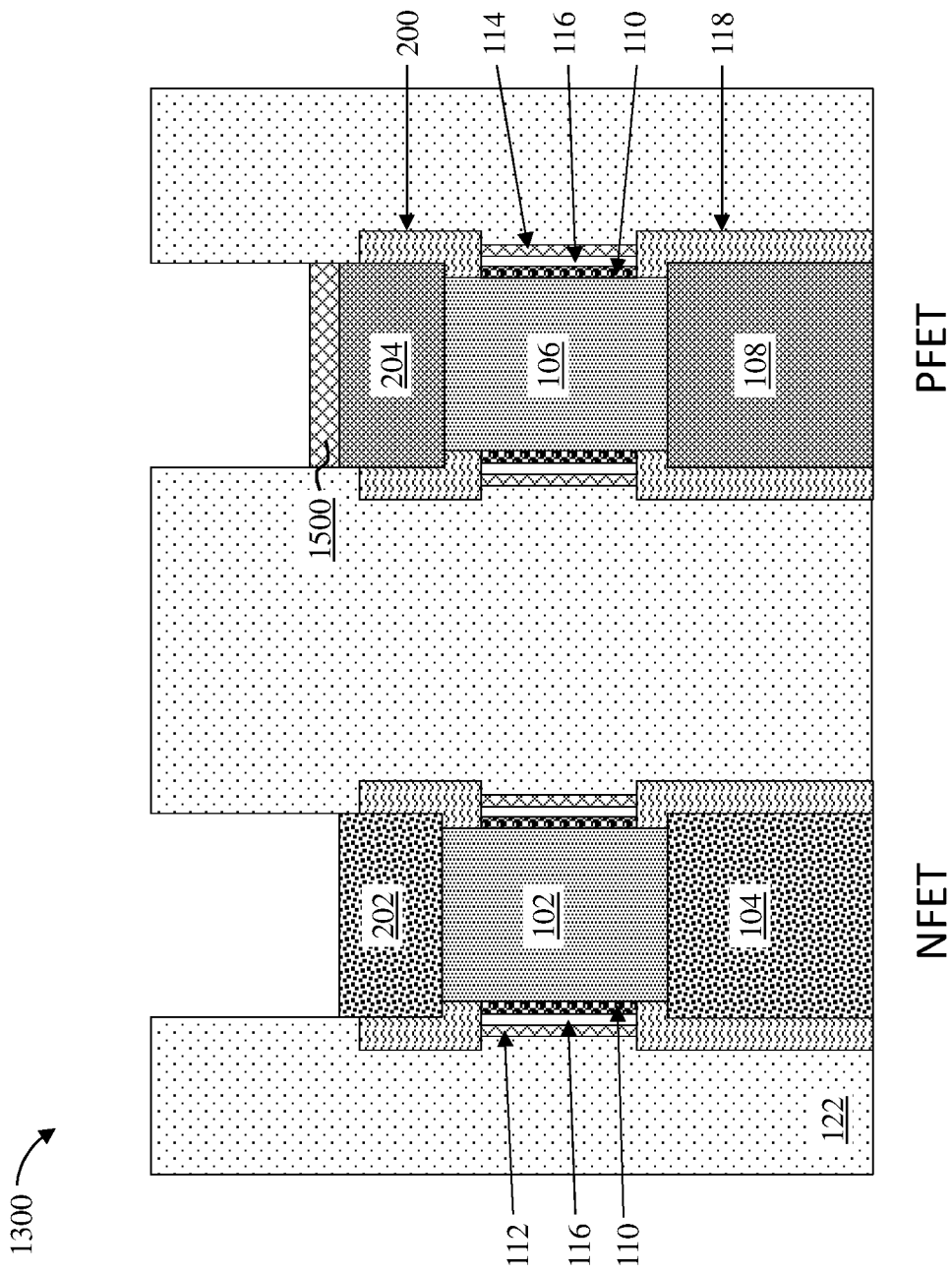

FIG. 16 depicts a cross-sectional view of the VFET structure 1300 after selectively removing the doped layer 1400 during an intermediate operation of the exemplary method of fabricating a semiconductor device according to one or more embodiments of the invention. As discussed previously herein, the doped layer 1400 is amorphous (e.g., a-SiP:Ga) while the SPE/LPE layer 1500 has a crystalline structure (e.g., c-SiGe:Ga). The top S/D region 202, epitaxially grown, also has a crystalline structure. In some embodiments of the present invention, the amorphous doped layer 1400 is removed selective to the crystalline SPE/LPE layer 1500 and top S/D region 202. The amorphous doped layer 1400 can be selectively removed using known wet etchants, for example, a sequence of DHF, $H_2SO_4$, and $NH_4OH$ wet treatments.

Figure 17:
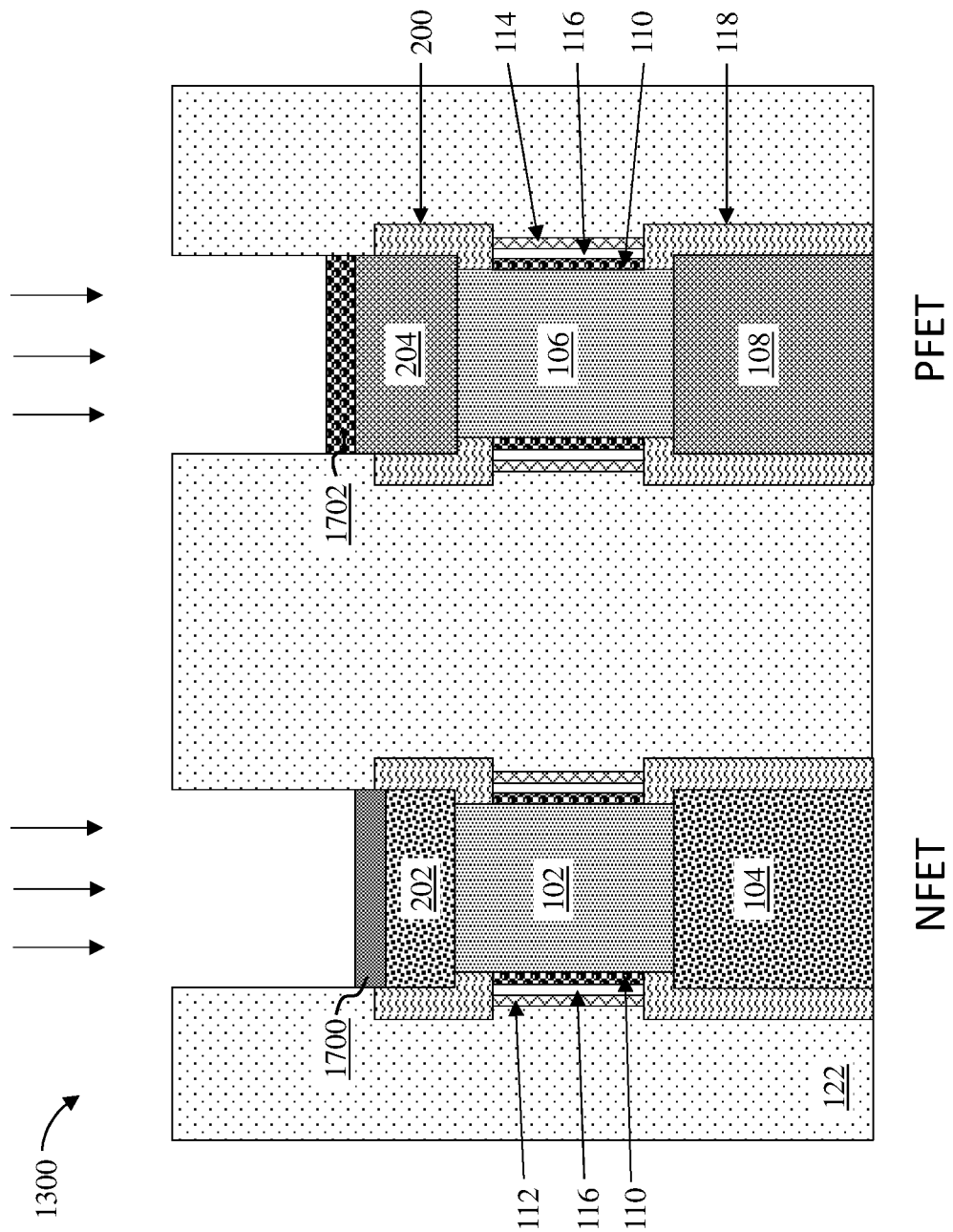

FIG. 17 depicts a cross-sectional view of the VFET structure 1300 after a pre-amorphization implant (PAI) during an intermediate operation of the exemplary method of fabricating a semiconductor device according to one or more embodiments of the invention. The PAI serves to prepare the NFET and PFET regions for SPE/LPE by amorphizing the surface of the top S/D region 202 and the SPE/LPE layer 1500 to form the amorphous layers 1700 and 1702, respectively. In some embodiments of the present invention, the top S/D region 202 is amorphized to a depth of about 4 to 5 nm, although other depths are within the contemplated scope of the invention. In some embodiments of the present invention, the PAI includes low dose germanium that does not substantially alter chemical composition of layers 1700 and 1702 but completely amorphizes them (i.e., about $2\times10^{14}$ $cm^{-2}$). In some embodiments of the present invention, the amorphous layer 1700 includes amorphous SiP (a-SiP) and the amorphous layer 1702 includes amorphous gallium doped SiGe (a-SiGe:Ga).

Figure 18:
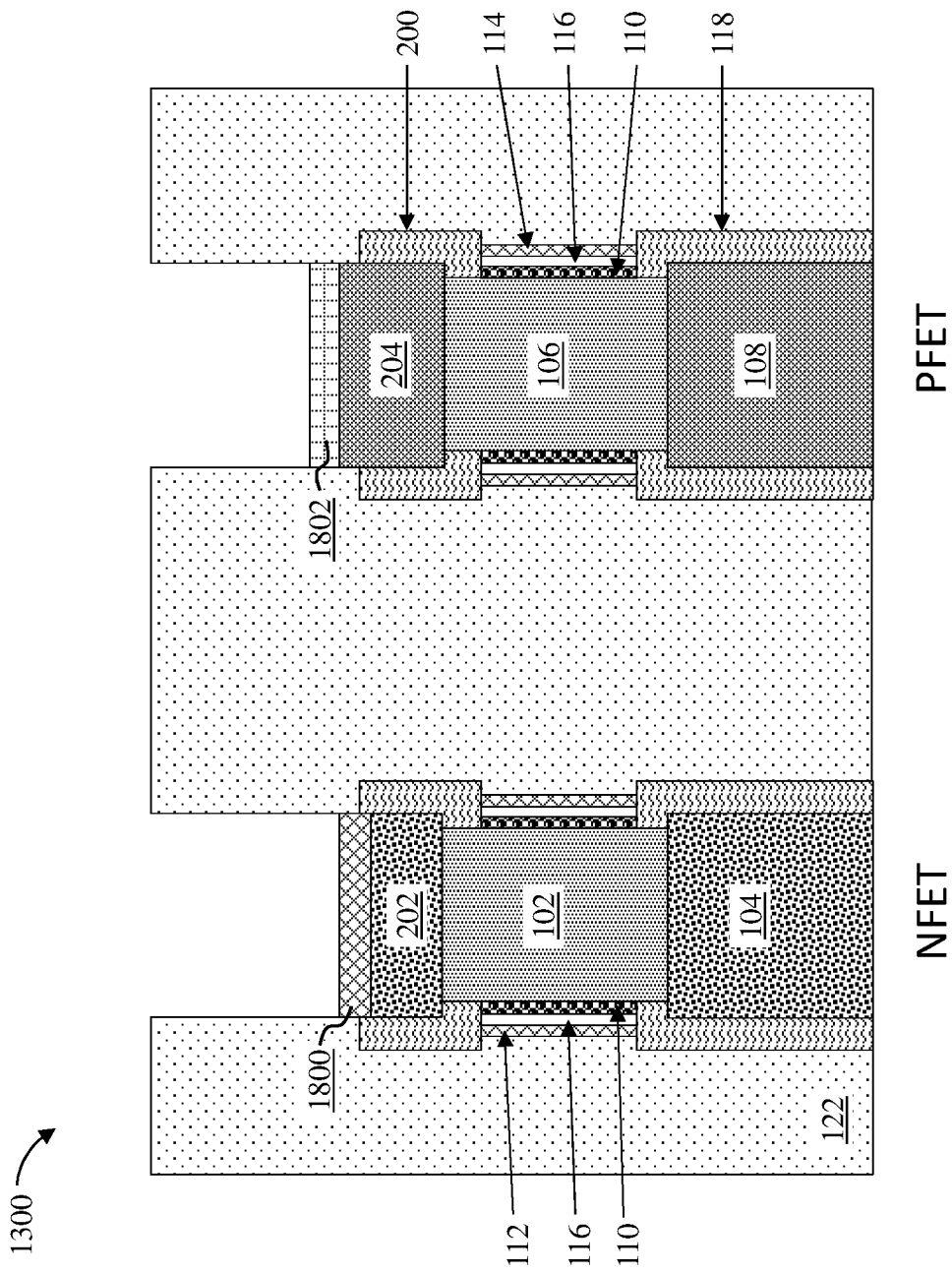

FIG. 18 depicts a cross-sectional view of the VFET structure 1300 after recrystallization during an intermediate operation of the exemplary method of fabricating a semiconductor device according to one or more embodiments of the invention. Once amorphized, a SPE/LPE process simultaneously recrystallizes both amorphous layers 1700 and 1702 to form SPE/LPE layers 1800 and 1802, respectively. In some embodiments of the present invention, the SPE/LPE layer 1800 is crystalline metastable dopant-semiconductor alloy SiP (c-SiP) and the SPE/LPE layer 1802 is crystalline gallium-SiGe alloy (c-SiGe:Ga).

During recrystallization, implanted dopant ions are activated (i.e., dopants are properly located in the desired substitutional sites). Recrystallization of the SPE/LPE layers 1800 and 1802 can be accomplished using, for example, LSA at a peak temperature of about 900 degrees Celsius a few hundreds of microseconds (e.g., less than 10 milliseconds and preferably from about 100 microseconds to about 1 millisecond). As discussed previously herein, this recrystallization process can cause a threshold voltage shift of about ±40 to 50 mV (n-FET increases, p-FET absolute value decreases) which is recovered by the common dipole layer 116.

Figure 19:
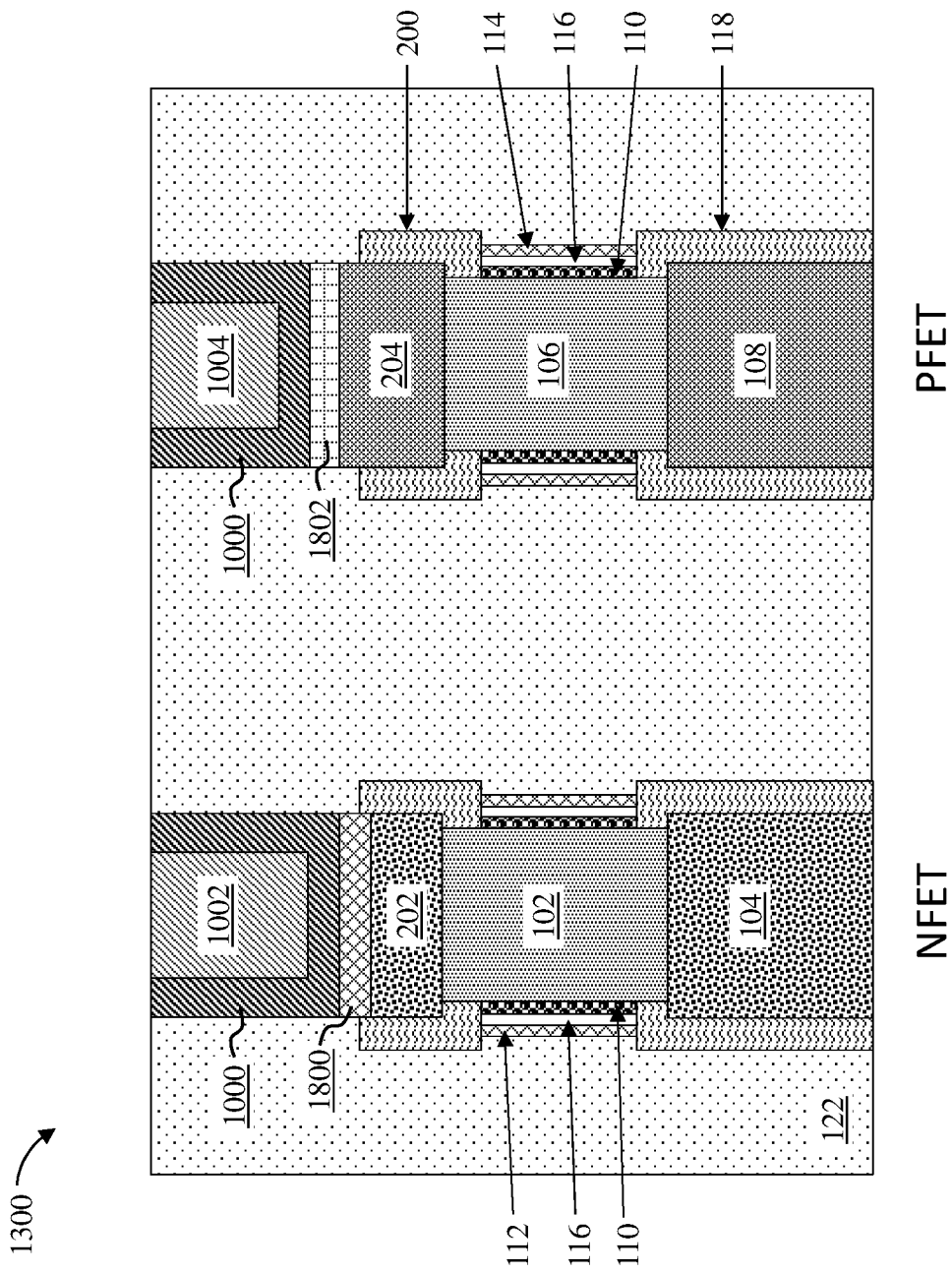

FIG. 19 depicts a cross-sectional view of the VFET structure 1300 after forming a metal liner 1000, NFET top S/D contact 1002 (contact 1002), and PFET top S/D contact 1004 (contact 1004) during an intermediate operation of the exemplary method of fabricating a semiconductor device according to one or more embodiments of the invention. As discussed previously herein, the top contacts 1002 and 1004 can be formed using known metallization techniques and can be made of any suitable conducting material, such as, for example, tungsten. In some embodiments of the invention the thickness of the ILD 122 is increased by depositing additional dielectric material prior to forming the top contacts 1002 and 1004. The ILD 122 can then be patterned into open trenches (not depicted) using known processes, such as a wet or dry etch. In some embodiments of the invention, the top contacts 1002 and 1004 are overfilled into the trenches, forming overburdens above a surface of the ILD 122. The overburden can then be planarized using, for example, CMP. Advantageously, the respective metastable dopant-semiconductor alloys of SPE/LPE layers 1800 and 1802 allow for semiconductor-metal junctions (formed between these layers and the metallic liner 1000) with very low contact resistivities of less than about $2\times10^{-9}$ ohm-$cm^2$ for both n-FETs and p-FETs, and, in the case of LPE-formed layers 1800/1802 of less than about $1\times10^{-9}$ ohm-$cm^2$.

Figure 20:
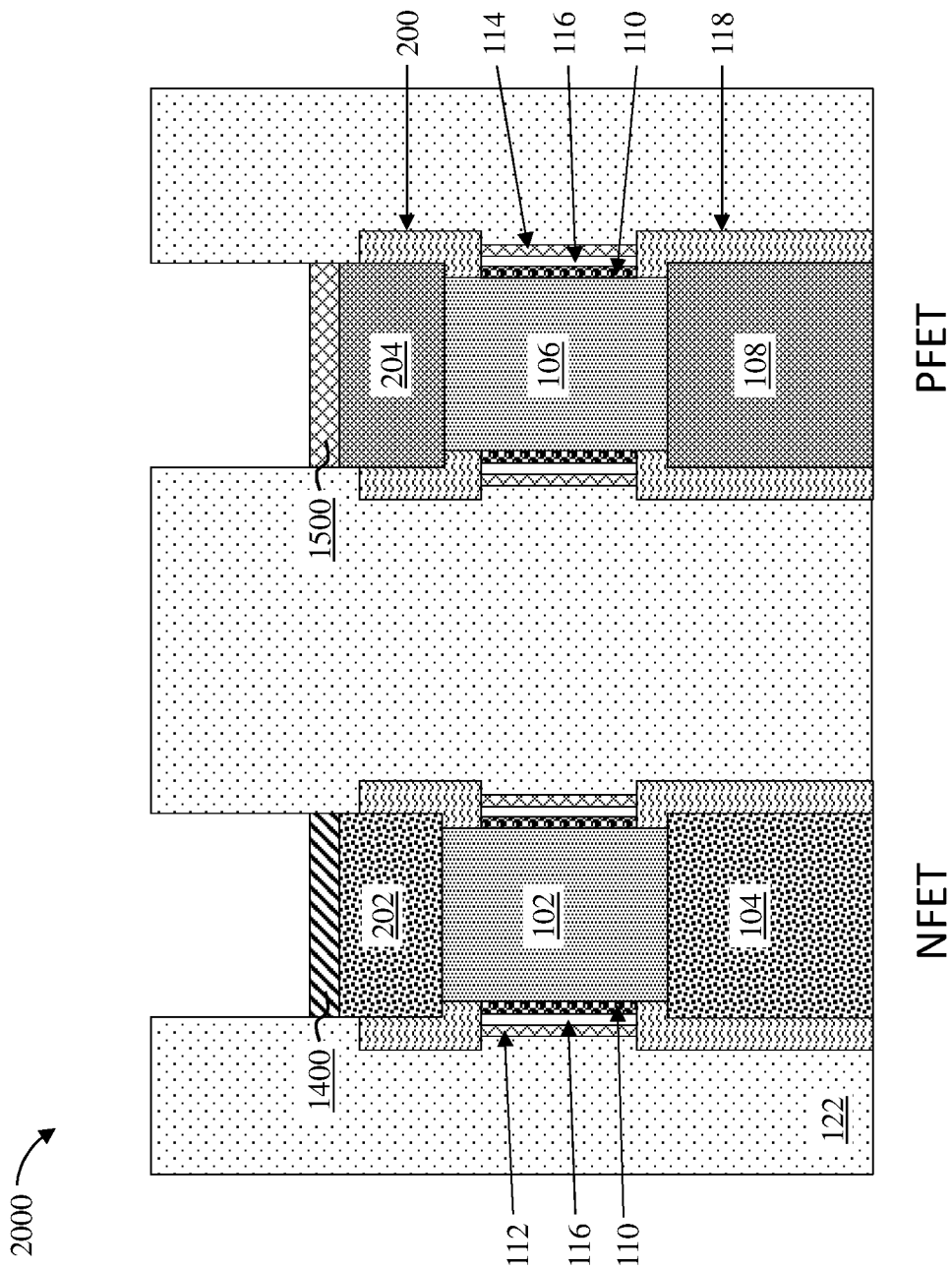
FIGS. 20-24 depict cross-sectional views of a third embodiment of a semiconductor structure after various processing operations according to one or more embodiments of the invention.

FIGS. 20-24 depict a cross-sectional view of an alternative VFET structure 2000 formed during various intermediate operations of fabricating a semiconductor device according to one or more embodiments of the invention. The VFET structure 2000 detailed in FIGS. 20-24 employs one soft block mask for creating high-performance nFETs and pFETs with low contact resistance structures enabled by respective SPE and/or LPE layers and with centered threshold voltages enabled by a common dipole layer. As depicted in FIG. 20, the VFET structure 2000 is initially formed in a similar manner as the VFET structure 1300 depicted in FIG. 15.

Figure 21:
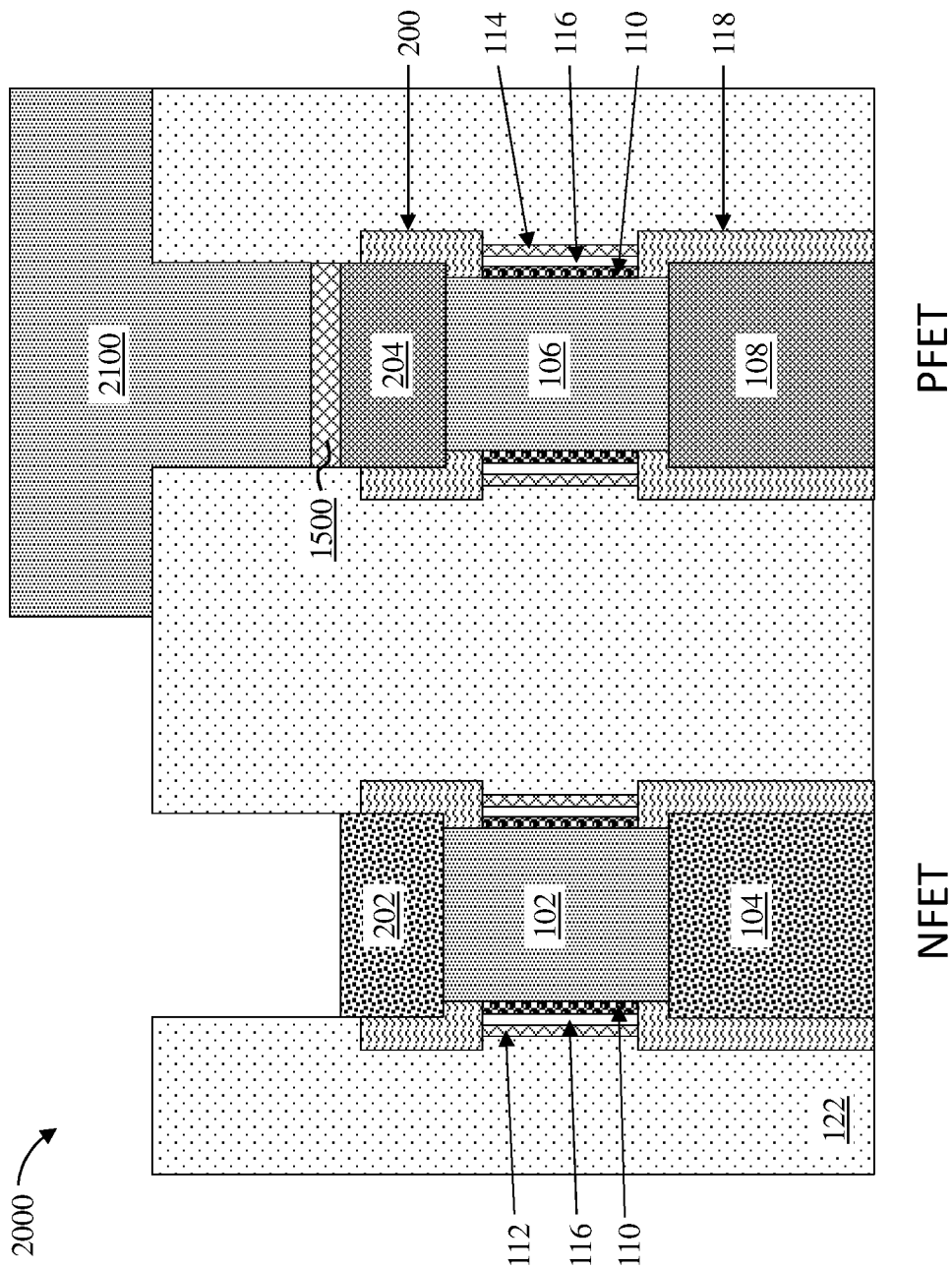

FIG. 21 depicts a cross-sectional view of the VFET structure 100 after forming a mask 2100 over the PFET region and removing the doped layer 1400 from the NFET region during an intermediate operation of the exemplary method of fabricating a semiconductor device according to one or more embodiments of the invention. The mask 2100 includes any suitable soft mask material, such as, for example, an OPL spin-on material. In some embodiments of the present invention, the mask 2100 is patterned to open the NFET region.

The doped layer 1400 in the NFET region is then removed to expose the top S/D region 202. As discussed previously herein, the doped layer 1400 is amorphous (e.g., a-SiP:Ga) while the top S/D region 202, epitaxially grown, has a crystalline structure (e.g., c-SiP). In some embodiments of the present invention, the amorphous doped layer 1400 is removed selective to the crystalline top S/D region 202. The amorphous doped layer 1400 can be selectively removed using known wet etchants, for example, a sequence of DHF, $H_2SO_4$, and $NH_4OH$ wet etchants.

Figure 22:
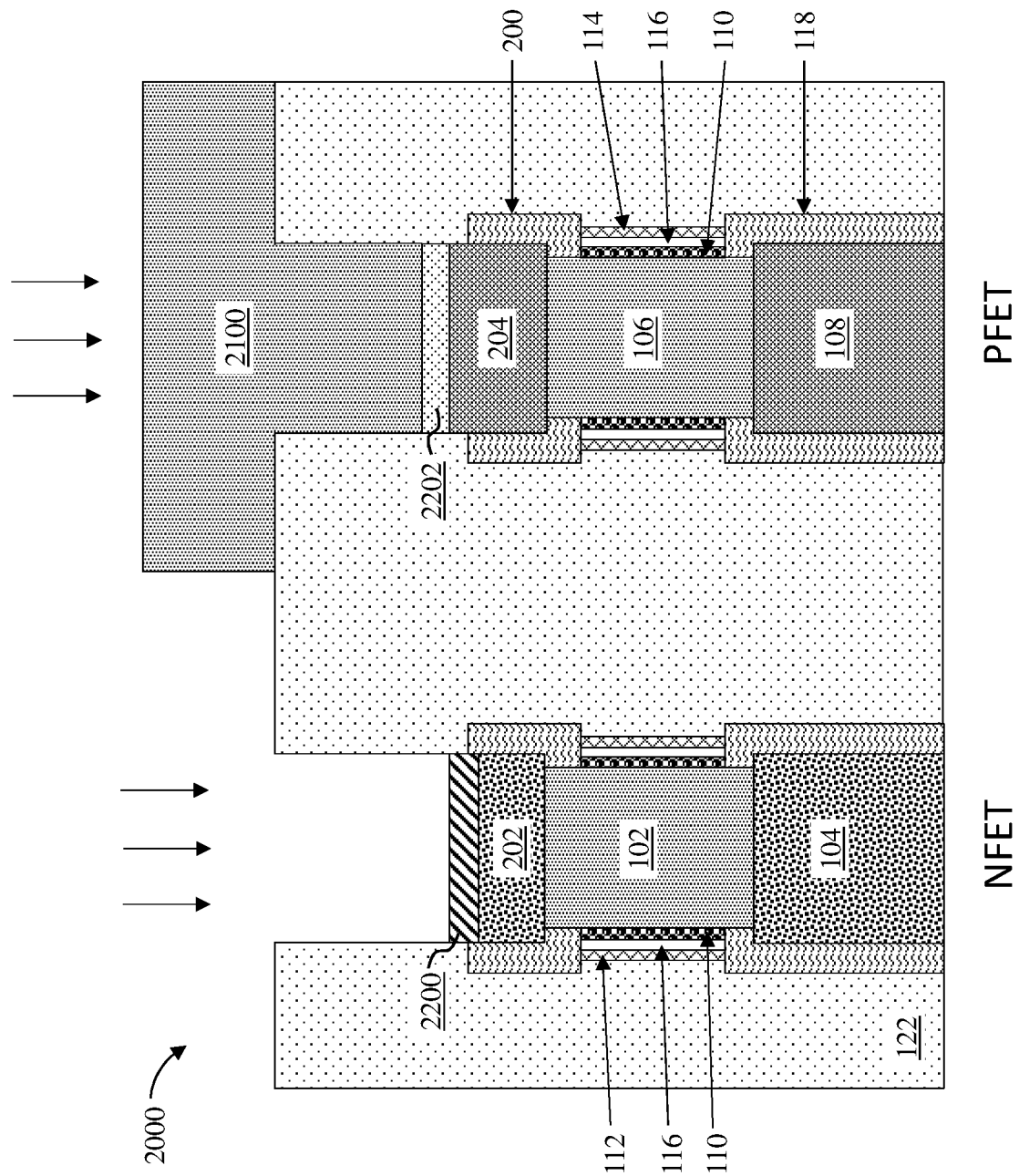

FIG. 22 depicts a cross-sectional view of the VFET structure 2000 after a PAI during an intermediate operation of the exemplary method of fabricating a semiconductor device according to one or more embodiments of the invention. The PAI serves to prepare the NFET and PFET regions for SPE/LPE by amorphizing the surface of the top S/D region 202 and the SPE/LPE layer 1500 to form the amorphous layers 2200 and 2202, respectively. In some embodiments of the present invention, the top S/D region 202 is amorphized to a depth of about 4 to 5 nm, although other depths are within the contemplated scope of the invention. In some embodiments of the present invention, the PAI includes an n-type dopant. In some embodiments of the present invention, the PAI includes a 2 keV P ion implantation at an ion dose of about $2 \times 10^{15}$ cm$^{-2}$. The mask 2100 blocks the P ions from implanting into the amorphous layer 2202 (i.e., into the top of the PFET S/D). In some embodiments of the present invention, the amorphous layer 2200 is amorphous SiP (a-SiP) and the amorphous layer 2202 is amorphous gallium doped SiGe (a-SiGe:Ga).

Figure 23:
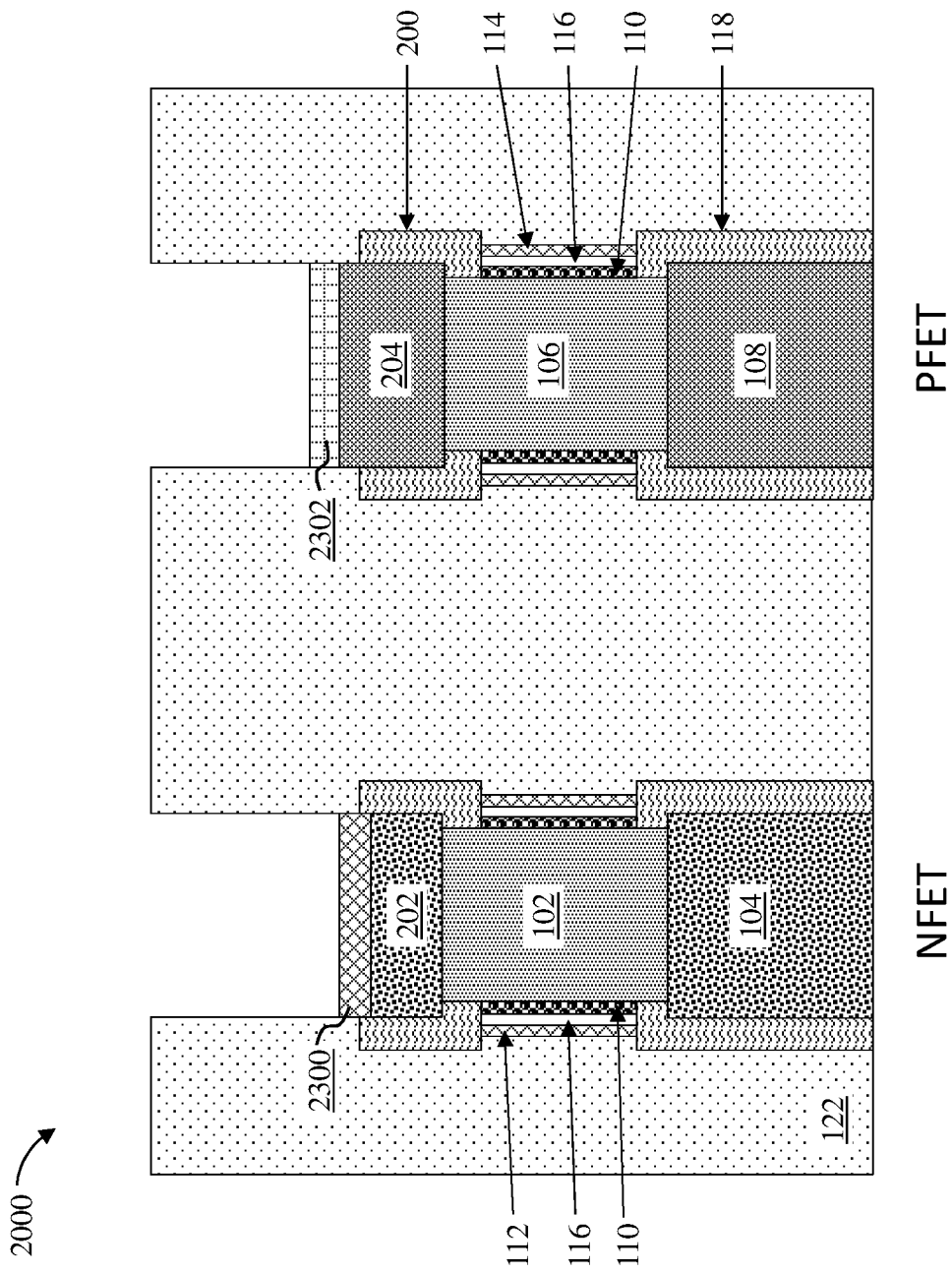

FIG. 23 depicts a cross-sectional view of the VFET structure 2000 after recrystallization during an intermediate operation of the exemplary method of fabricating a semiconductor device according to one or more embodiments of the invention. Once amorphized, the mask 2100 is removed and a SPE/LPE process simultaneously recrystallizes both amorphous layers 2200 and 2202 to form SPE/LPE layers 2300 and 2302, respectively. In some embodiments of the present invention, the SPE/LPE layer 2300 is crystalline SiP (c-SiP) and the SPE/LPE layer 2302 is crystalline gallium doped SiGe (c-SiGe:Ga).

During recrystallization, implanted dopant ions are activated (i.e., dopants are properly located in the desired substitutional sites). Recrystallization of the SPE/LPE layers 2300 and 2302 can be accomplished using, for example, LSA at a peak temperature of about 900 degrees Celsius a few hundreds of microseconds (e.g., less than 10 milliseconds and preferably from about 100 microseconds to about 1 millisecond). As discussed previously herein, this recrystallization process can cause a threshold voltage shift of about ±40 to 50 mV (n-FET increases, p-FET absolute value decreases) which is recovered by the common dipole layer 116.

Figure 24:
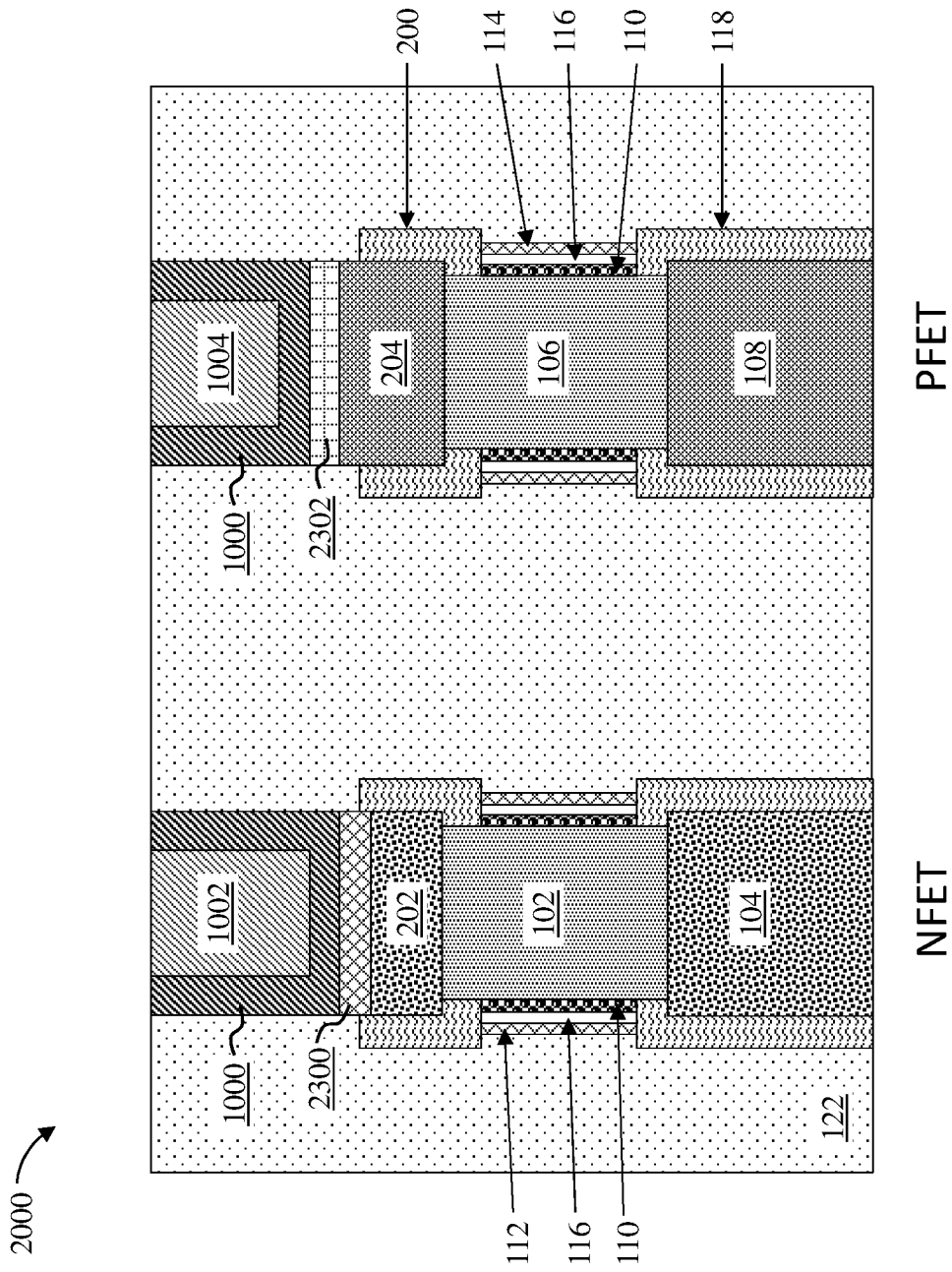

FIG. 24 depicts a cross-sectional view of the VFET structure 2000 after forming a metal liner 1000, NFET top S/D contact 1002 (contact 1002), and PFET top S/D contact 1004 (contact 1004) during an intermediate operation of the exemplary method of fabricating a semiconductor device according to one or more embodiments of the invention. As discussed previously herein, the top contacts 1002 and 1004 can be formed using known metallization techniques and can be made of any suitable conducting material, such as, for example, tungsten. In some embodiments of the invention the thickness of the ILD 122 is increased by depositing additional dielectric material prior to forming the top contacts 1002 and 1004. The ILD 122 can then be patterned into open trenches (not depicted) using known processes, such as a wet or dry etch. In some embodiments of the invention, the top contacts 1002 and 1004 are overfilled into the trenches, forming overburdens above a surface of the ILD 122. The overburden can then be planarized using, for example, CMP. Advantageously, the respective metastable dopant-semiconductor alloys of SPE/LPE layers 2300 and 2302 allow for semiconductor-metal junctions (formed between these layers and the metallic liner 1000) with very low contact resistivities of less than about $2 \times 10^{-9}$ ohm-cm$^2$ for both n-FETs and p-FETs, and, in the case of LPE layers 2300/2302 of less than about $1 \times 10$ ohm-cm$^2$.

Figure 25:
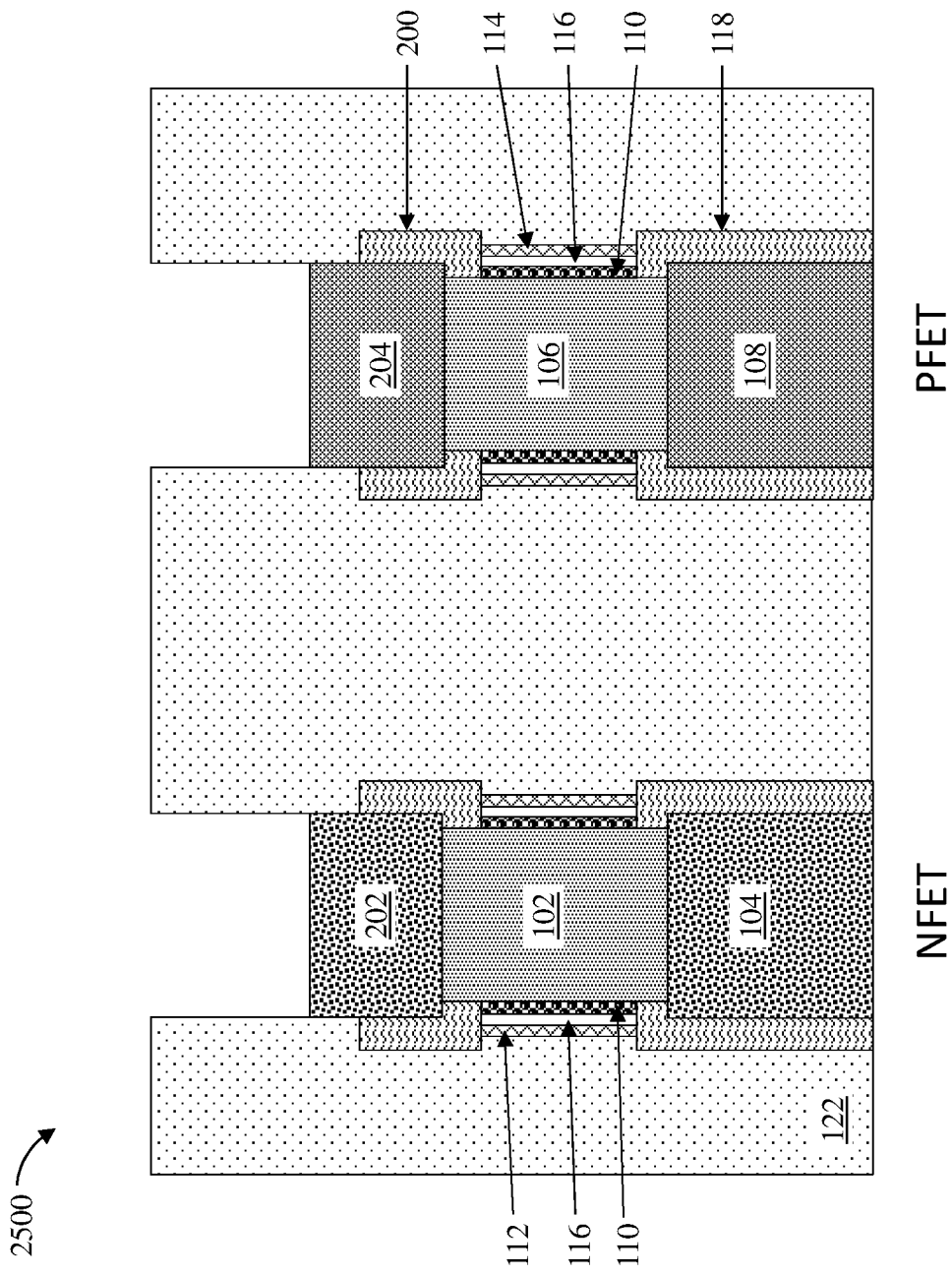
FIGS. 25-31 depict cross-sectional views of a forth embodiment of a semiconductor structure after various processing operations according to one or more embodiments of the invention.

FIGS. 25-31 depict a cross-sectional view of an alternative VFET structure 2500 formed during various intermediate operations of fabricating a semiconductor device according to one or more embodiments of the invention. The VFET structure 2500 detailed in FIGS. 25-31 employs one soft block mask for creating high-performance nFETs and pFETs with low contact resistance structures enabled by respective SPE or LPE layers and with centered threshold voltages enabled by a common dipole layer. As depicted in FIG. 25, the VFET structure 2500 is initially formed in a similar manner as the VFET structure 100 depicted in FIG. 2.

Figure 26:
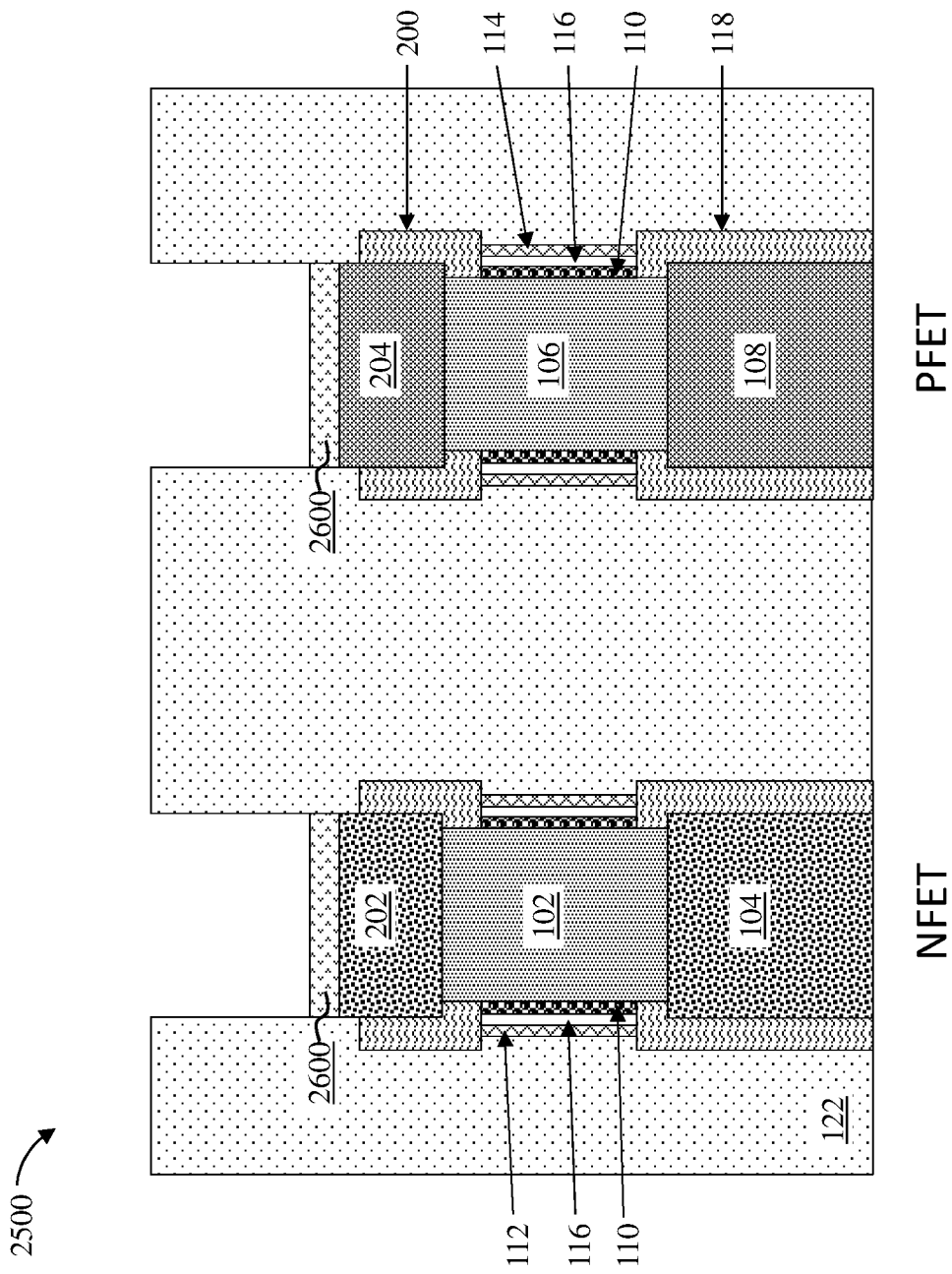

FIG. 26 depicts a cross-sectional view of the VFET structure 2500 after forming a trench epitaxy layer 2600 on exposed portions of the top S/D regions 202 and 204 during an intermediate operation of the exemplary method of fabricating a semiconductor device according to one or more embodiments of the invention. The trench epitaxy layer 2600 can be epitaxially grown using, for example, VPE, MBE, or LP. Low-temperature epitaxial processes are highly preferred due to inducing large threshold voltage shifts in formed gates at temperatures above about 500 C. In some embodiments of the present invention, the trench epitaxy layers 2600 are Ge layers. In some embodiments of the present invention, the trench epitaxy layer 2600 is doped with boron ions at an ion concentration of $1 \times 10^{18}$ cm$^{-3}$ to $1 \times 10^{20}$ cm$^{-3}$. In some embodiments of the present invention, the trench epitaxy layer 2600 is formed to a thickness of less than 20 nm, for example, about 2 to 4 nm, although other thicknesses are within the contemplated scope of the invention.

Figure 27:
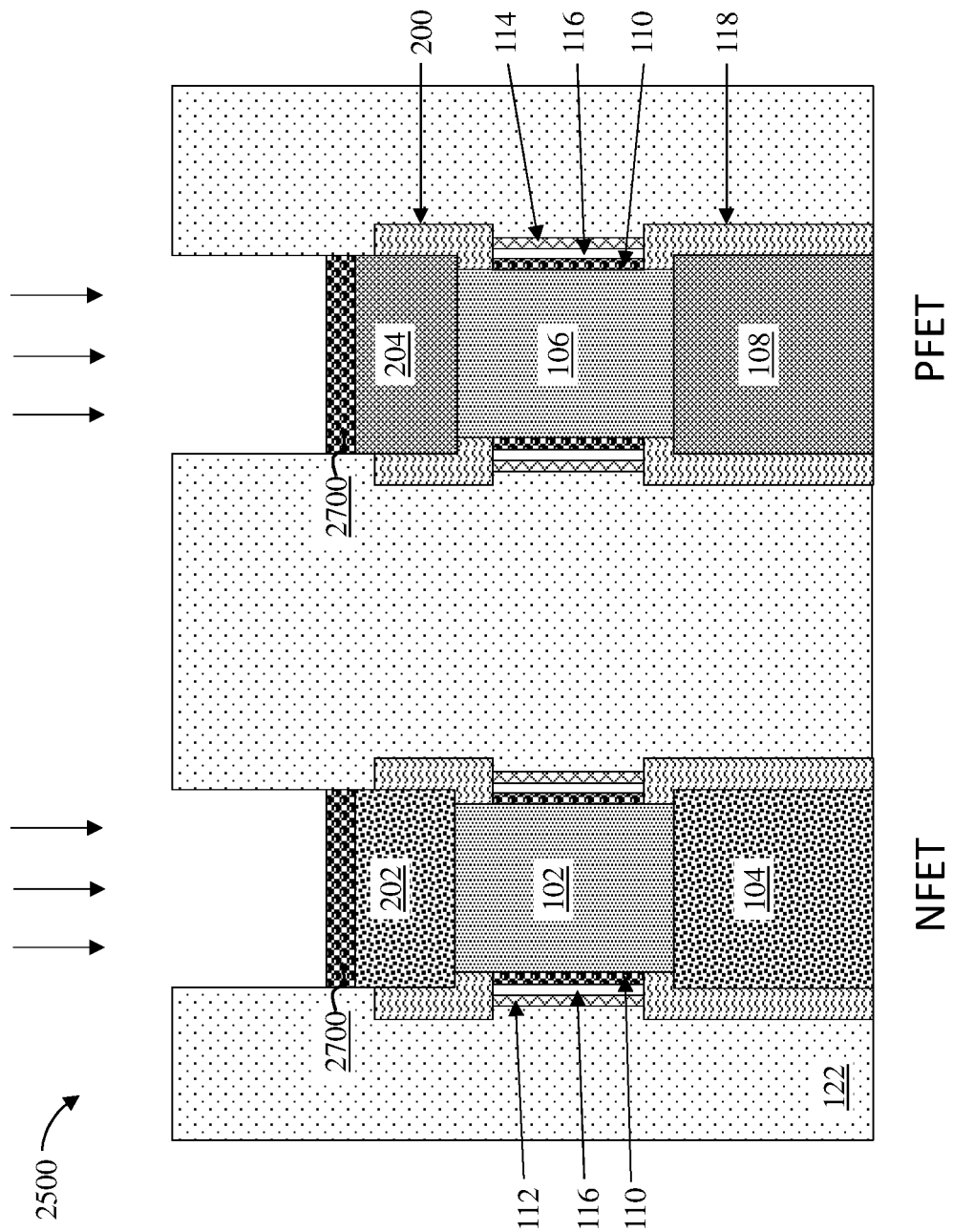

FIG. 27 depicts a cross-sectional view of the VFET structure 2500 after a blanket dopant implantation during an intermediate operation of the exemplary method of fabricating a semiconductor device according to one or more embodiments of the invention. In some embodiments of the present invention, p-type dopants (e.g., Ga) are implanted into the trench epitaxy layer 2600 to form a doped layer 2700. The dopant concentration is well above maximum gallium chemical solubility in pure germanium of about $5 \times 10^{20}$ cm$^{-3}$ and can range from $1 \times 10^{21}$ cm$^{-3}$ to $7 \times 10^{21}$ cm$^3$, or between $1 \times 10^{21}$ cm$^{-3}$ and $5 \times 10^{21}$ cm$^{-3}$. The gallium implantation serves to disorder (amorphize) the trench epitaxy layer 2600 (which becomes, e.g., the doped layer 2700). In some embodiments of the present invention, the doped layer 2700 includes amorphous gallium doped germanium (a-Ge:Ga).

Figure 28:
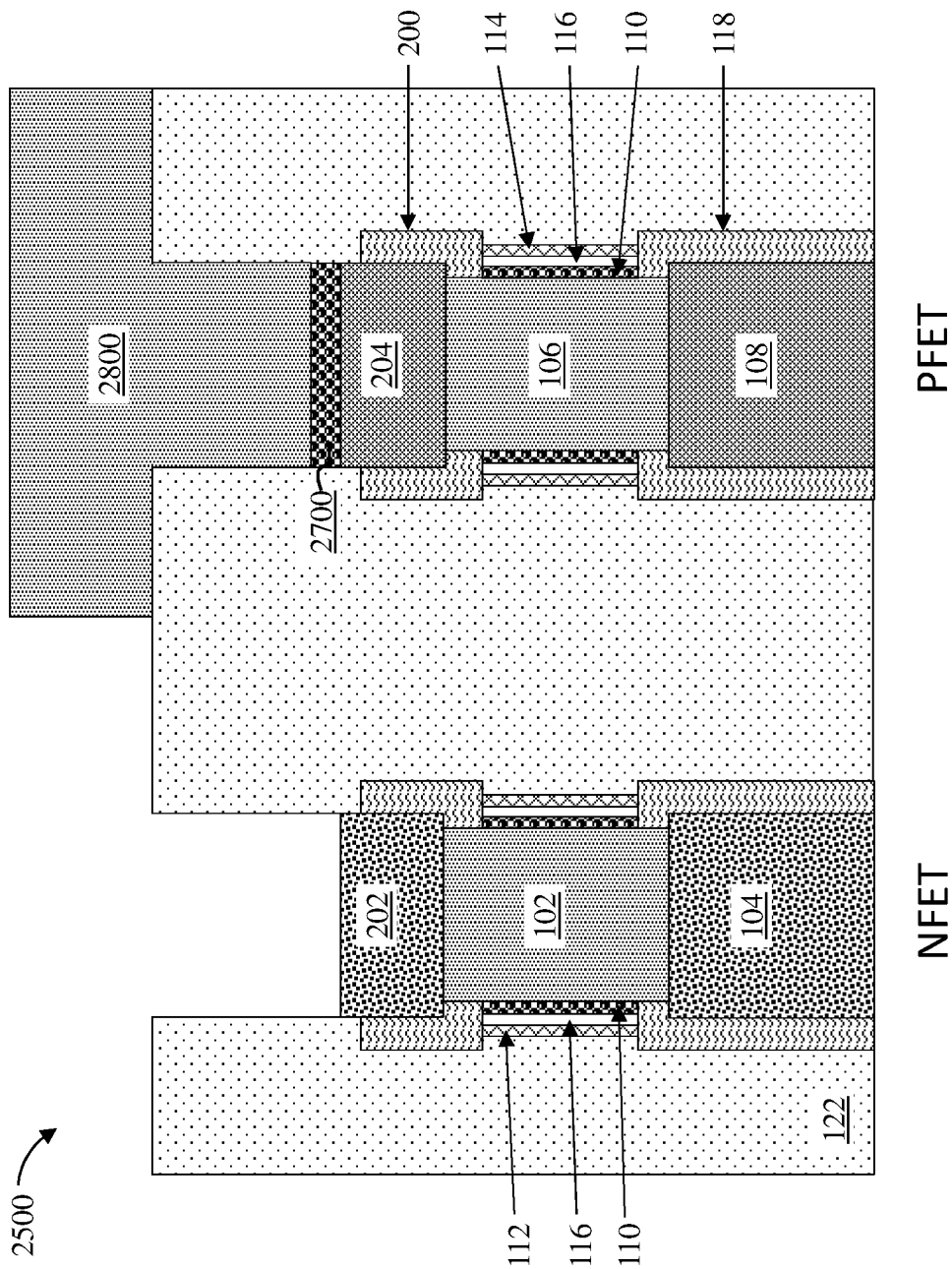

FIG. 28 depicts a cross-sectional view of the VFET structure 2500 after forming a soft or hard mask 2800 over the PFET region and removing the doped layer 2700 from the NFET region during an intermediate operation of the exemplary method of fabricating a semiconductor device according to one or more embodiments of the invention. The mask 2800 can include any suitable soft mask material, such as, for example, an OPL spin-on material. In some embodiments of the present invention, the mask 2100 is patterned to open the NFET region.

The doped layer 2700 in the NFET region is then removed to expose the top S/D region 202. As discussed previously herein, the doped layer 2700 is amorphous (e.g., a-Ge:Ga) while the top S/D region 202, epitaxially grown, has a crystalline structure (e.g., c-SiP). In some embodiments of the present invention, the amorphous doped layer 2700 is removed selective to the crystalline top S/D region 202. The amorphous doped layer 2700 can be selectively removed using known wet etchants, for example, a sequence of DHF, NH$_4$OH, H$_2$SO$_4$, and H$_2$O$_2$ wet treatments.

Figure 29:
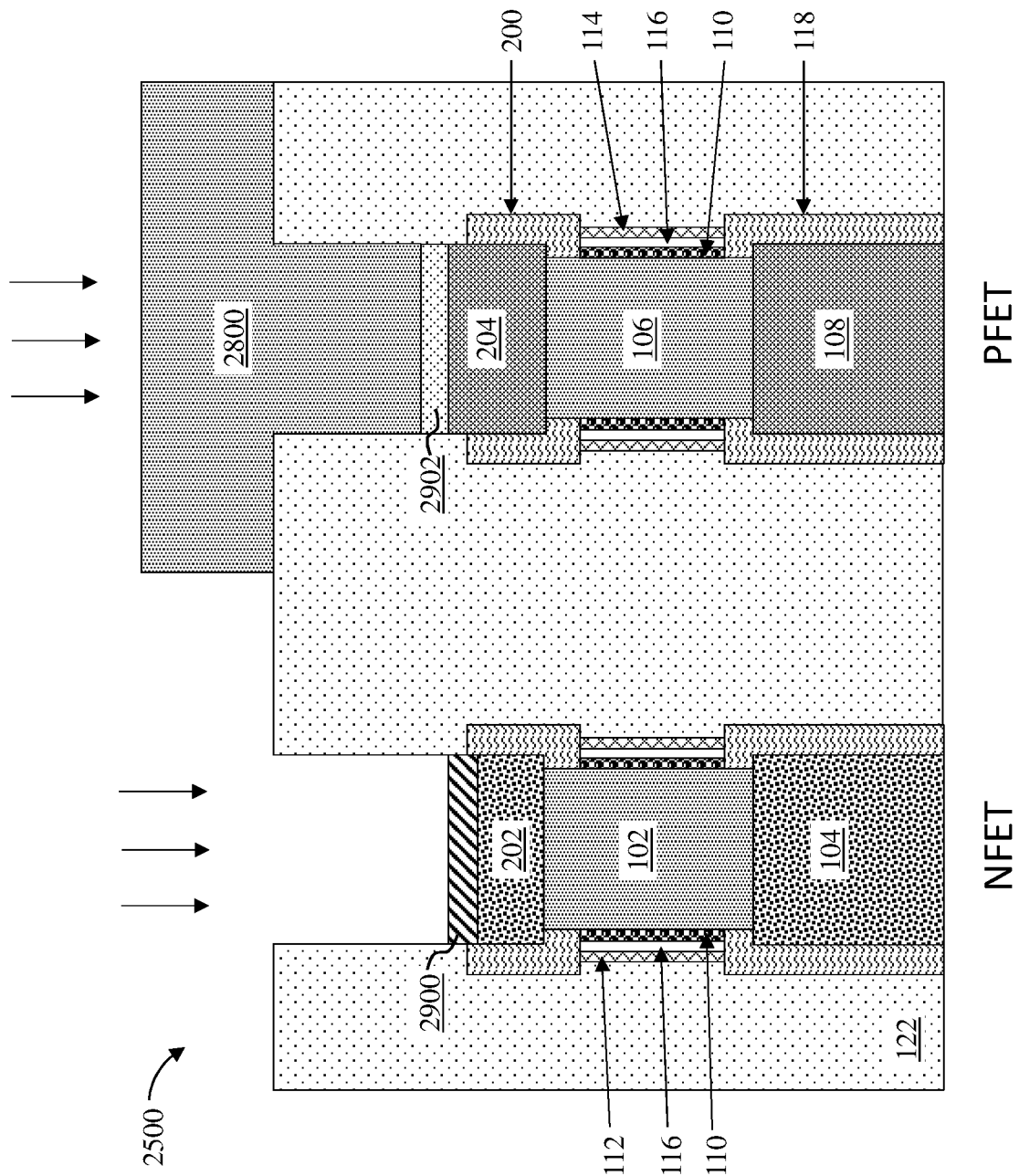

FIG. 29 depicts a cross-sectional view of the VFET structure 2500 after a PAI during an intermediate operation of the exemplary method of fabricating a semiconductor device according to one or more embodiments of the invention. The PAI serves to prepare the NFET and PFET regions for SPE/LPE by amorphizing the surface of the top S/D region 202 and the doped layer 2700 to form the amorphous layers 2900 and 2902, respectively. In some embodiments of the present invention, the top S/D region 202 is amorphized to a depth of about 4 to 5 nm, although other depths are within the contemplated scope of the invention. In some embodiments of the present invention, the PAI includes an n-type dopant. In some embodiments of the present invention, the PAI includes a 2 keV P ion implantation at an ion concentration of about $2 \times 10^{15}$ cm$^{-2}$. In some embodiments of the present invention, the amorphous layer 2900 is amorphous SiP (a-SiP) and the amorphous layer 2902 is amorphous gallium doped germanium (a-Ge:Ga).

Figure 30:
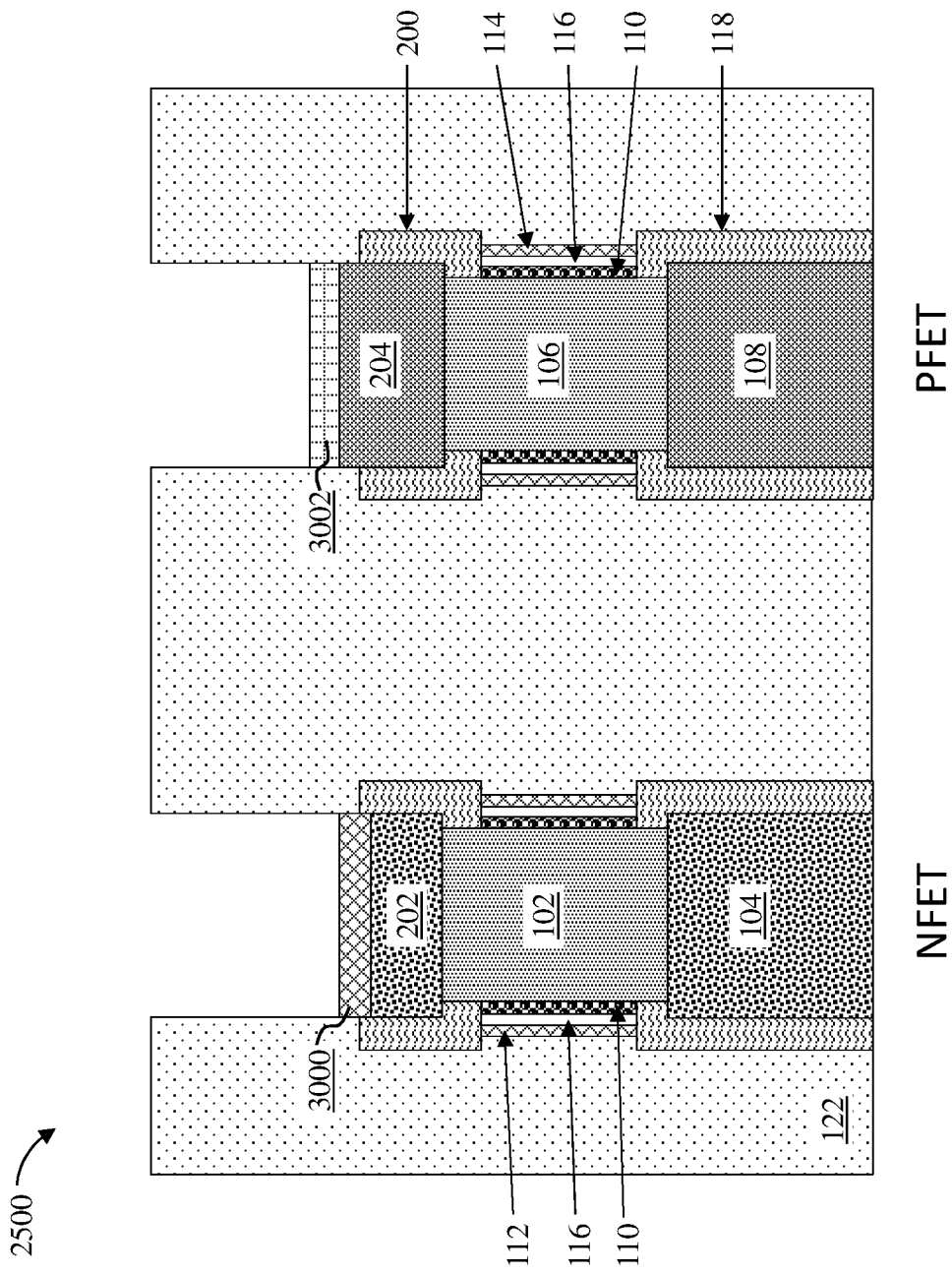

FIG. 30 depicts a cross-sectional view of the VFET structure 2500 after recrystallization during an intermediate operation of the exemplary method of fabricating a semiconductor device according to one or more embodiments of the invention. Once amorphized, the mask 2800 is removed and a SPE/LPE process simultaneously recrystallizes both amorphous layers 2900 and 2902 to form SPE/LPE layers 3000 and 3002, respectively. In some embodiments of the present invention, the SPE/LPE layer 3000 is crystalline metastable semiconductor-dopant alloy SiP (c-SiP) and the SPE/LPE layer 3002 is crystalline gallium germanium metastable alloy (c-Ge:Ga).

During recrystallization, implanted dopant ions are activated (i.e., dopants are properly located in the desired substitutional sites). Recrystallization of the SPE/LPE layers 3000 and 3002 can be accomplished using, for example, LSA at a peak temperature of about 900 degrees Celsius a few hundreds of microseconds (e.g., less than 10 milliseconds and preferably from about 100 microseconds to about 1 millisecond). As discussed previously herein, this recrystallization process can cause a threshold voltage shift of about ±40 to 50 mV (n-FET increases, p-FET absolute value decreases) which is recovered by the common dipole layer 116.

Figure 31:
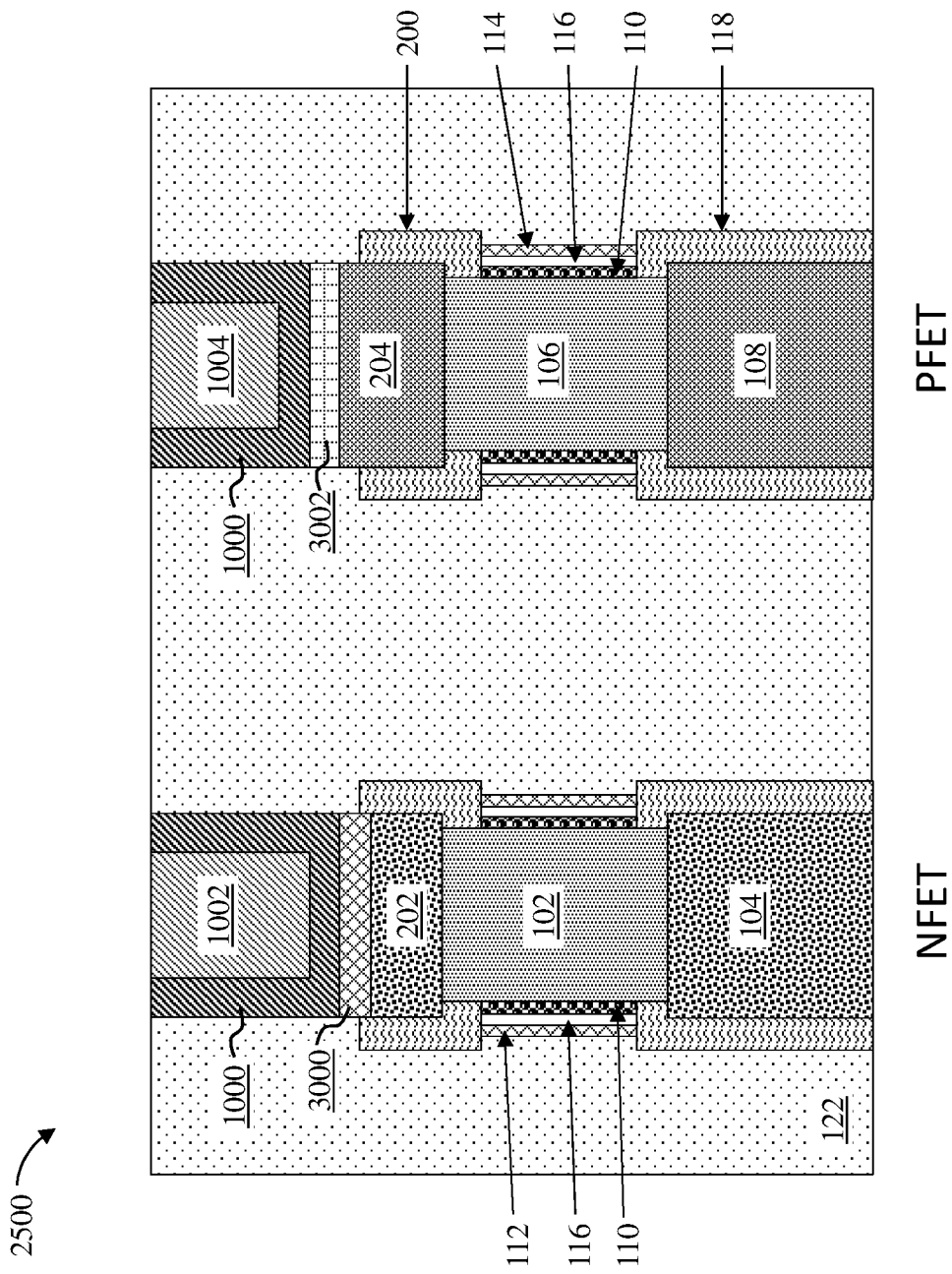

FIG. 31 depicts a cross-sectional view of the VFET structure 2500 after forming a metal liner 1000, NFET top S/D contact 1002 (contact 1002), and PFET top S/D contact 1004 (contact 1004) during an intermediate operation of the exemplary method of fabricating a semiconductor device according to one or more embodiments of the invention. As discussed previously herein, the top contacts 1002 and 1004 can be formed using known metallization techniques and can be made of any suitable conducting material, such as, for example, tungsten. In some embodiments of the invention the thickness of the ILD 122 is increased by depositing additional dielectric material prior to forming the top contacts 1002 and 1004. The ILD 122 can then be patterned into open trenches (not depicted) using known processes, such as a wet or dry etch. In some embodiments of the invention, the top contacts 1002 and 1004 are overfilled into the trenches, forming overburdens above a surface of the ILD 122. The overburden can then be planarized using, for example, CMP. Advantageously, the respective metastable dopant-semiconductor alloys of SPE/LPE layers 3000 and 3002 allow for semiconductor-metal junctions (formed between these layers and the metallic liner 1000) with very low contact resistivities of less than about $2 \times 10^{-9}$ ohm-cm$^2$ for both n-FETs and p-FETs, and, in the case of LPE layers 3000/3002 of less than about $1 \times 10$ ohm-cm$^2$.

Figure 32:
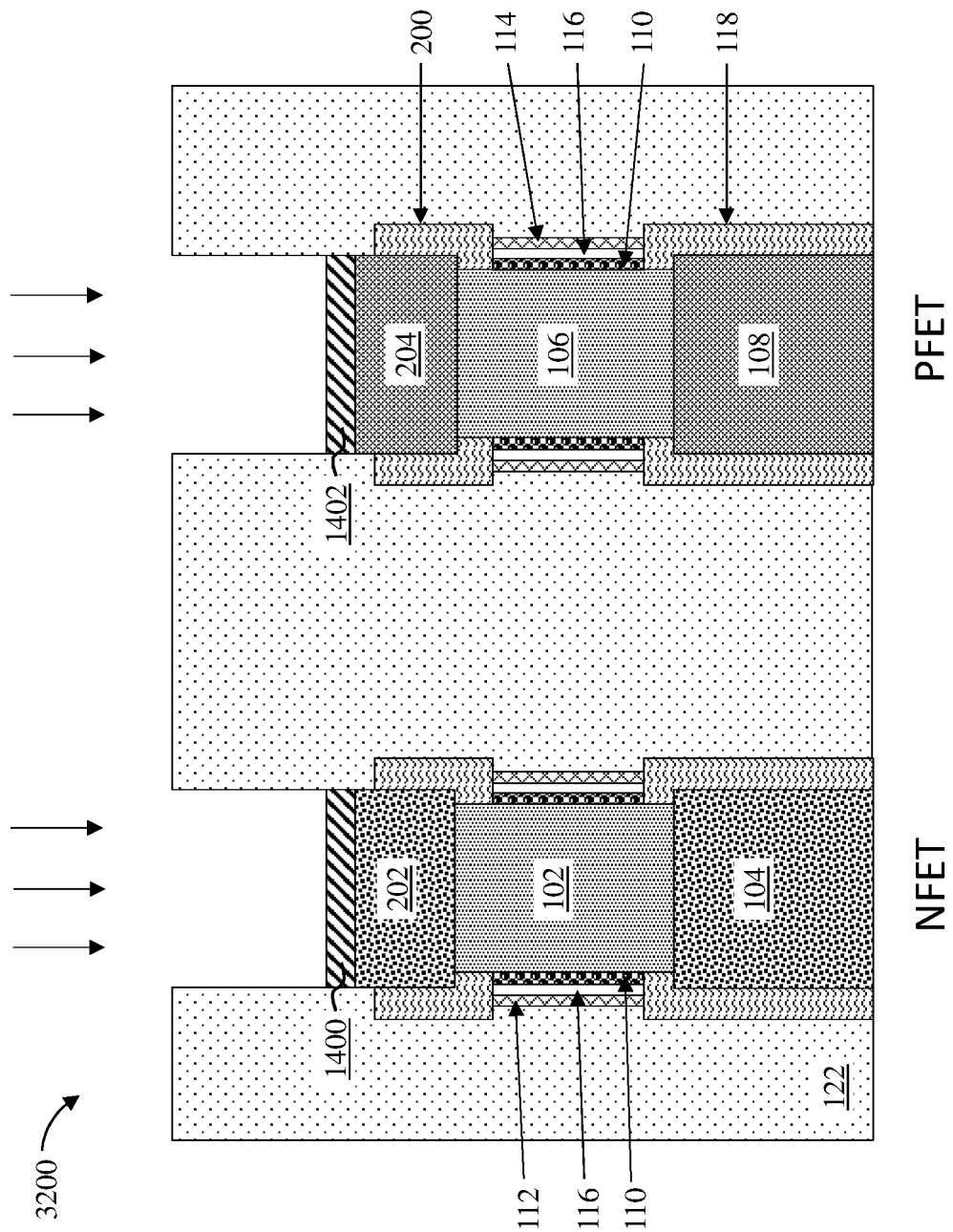
FIGS. 32-37 depict cross-sectional views of a fifth embodiment of a semiconductor structure after various processing operations according to one or more embodiments of the invention.

FIGS. 32-37 depict a cross-sectional view of an alternative VFET structure 3200 formed during various intermediate operations of fabricating a semiconductor device according to one or more embodiments of the invention. The VFET structure 3200 detailed in FIGS. 32-37 employs no additional soft block masks (i.e. a maskless embodiment) for creating high-performance nFETs and pFETs with low contact resistance structures enabled by respective SPE or LPE layers and with centered threshold voltages enabled by a common dipole layer. As depicted in FIG. 32, the VFET structure 3200 is initially formed in a similar manner as the VFET structure 1300 depicted in FIG. 14.

Figure 33:
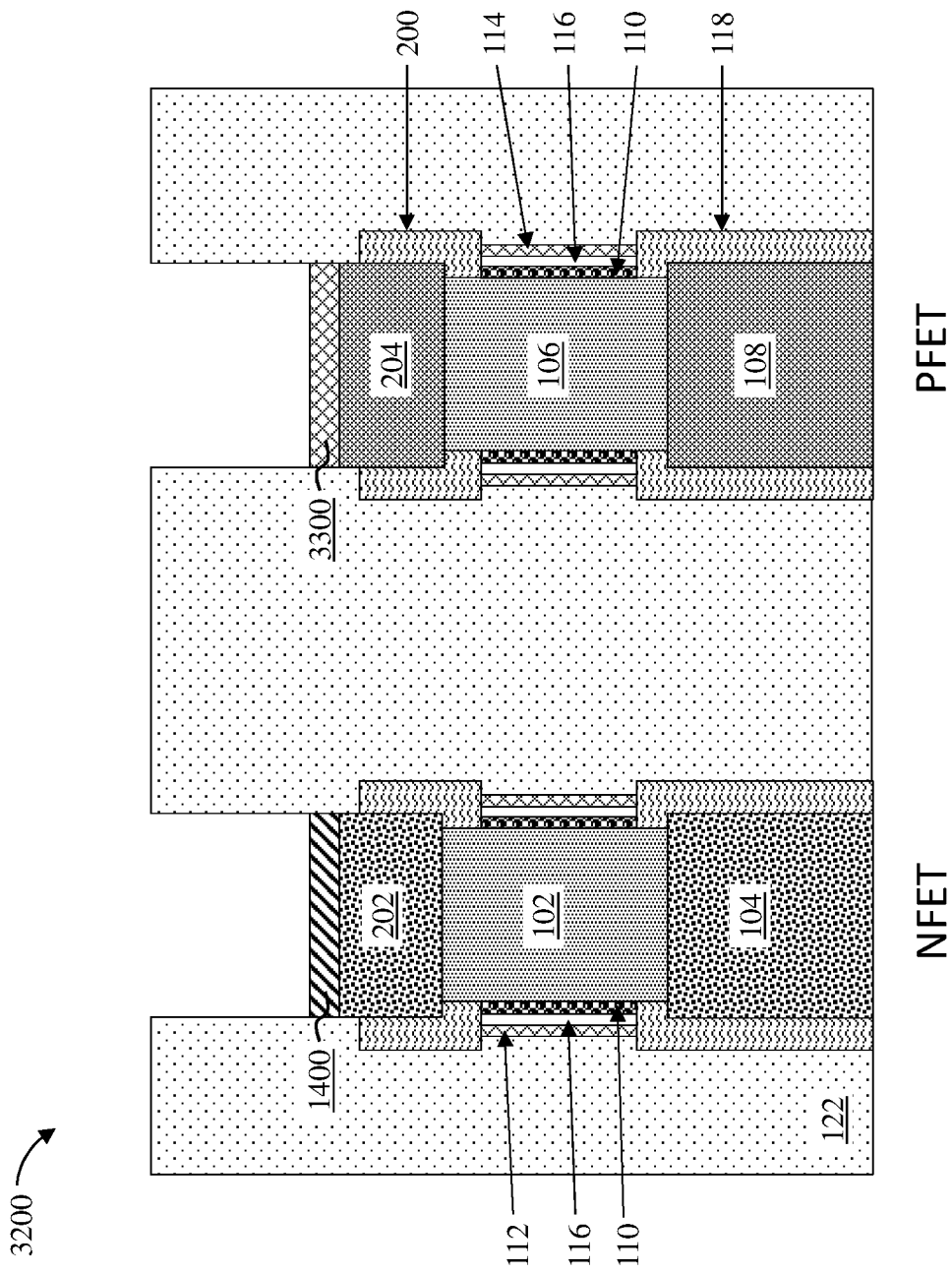

FIG. 33 depicts a cross-sectional view of the VFET structure 3200 after selective recrystallization of the doped layer 1402 during an intermediate operation of the exemplary method of fabricating a semiconductor device according to one or more embodiments of the invention. As discussed previously herein, in some embodiments of the present invention, the doped layer 1402 includes amorphous gallium doped silicon germanium (a-SiGe:Ga). Once the doped layers 1400 and 1402 are amorphized, a liquid phase epitaxy (LPE) process selectively recrystallizes the doped layer 1402 to form a LPE layer 3300. Selective recrystallization of the amorphous doped layer 1402 is accomplished using a nanosecond laser melt anneal at a peak temperature of greater than 1000 degrees Celsius but less than 1150 degrees Celsius for about 100 nanoseconds. The peak temperature is adjusted based on the Ge content of the SiGe such that a-SiGe alloy melts while a-SiP remains amorphous. The melting point of amorphous SiP alloys is above about 1150 C. After the LPE nanosecond anneal, the doped layer 1400 remains a-SiP:Ga while the LPE layer 3300 is crystallized to form crystalline gallium doped silicon germanium (c-SiGe:Ga).

Figure 34:
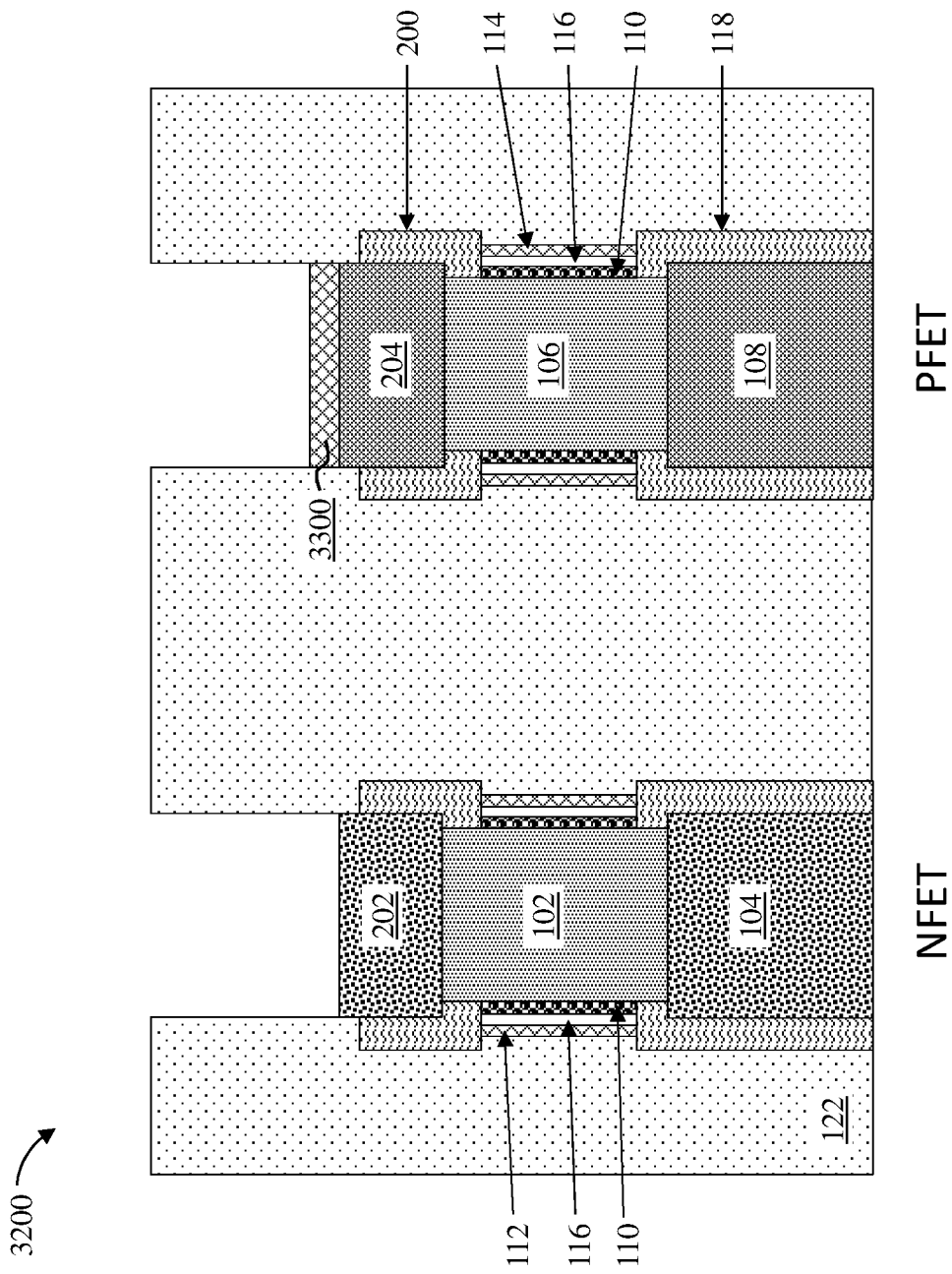

FIG. 34 depicts a cross-sectional view of the VFET structure 3200 after selectively removing the doped layer 1400 during an intermediate operation of the exemplary method of fabricating a semiconductor device according to one or more embodiments of the invention. The doped layer 1400 can be removed using, for example, a wet etch selective to the LPE layer 3300.

Figure 35:
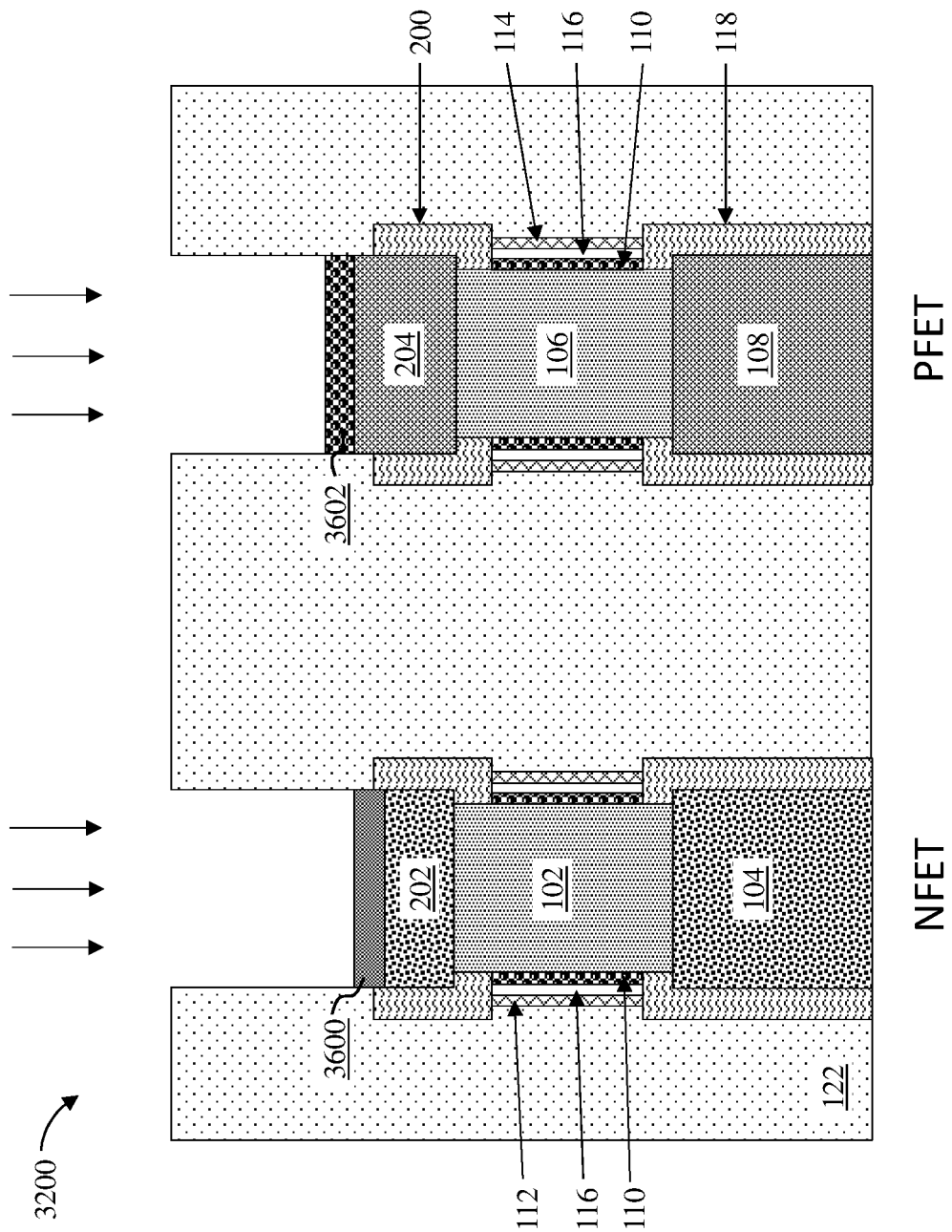

FIG. 35 depicts a cross-sectional view of the VFET structure 3200 after a pre-amorphization implant (PAI) during an intermediate operation of the exemplary method of fabricating a semiconductor device according to one or more embodiments of the invention. The PAI serves to prepare the NFET and PFET regions for SPE/LPE by amorphizing the surface of the top S/D region 202 and the LPE layer 3300 to form the amorphous layers 3600 and 3602, respectively. In some embodiments of the present invention, the top S/D region 202 is amorphized to a depth of about 4 to 5 nm, although other depths are within the contemplated scope of the invention. In some embodiments of the present invention, the PAI includes low dose germanium that does not alter chemical composition of layers 3600 and 3602 but fully amorphizes them (i.e., about $2 \times 10^{14}$ cm$^{-2}$). In some embodiments of the present invention, the amorphous layer 3600 is amorphous SiP (a-SiP) and the amorphous layer 3602 is crystalline gallium doped silicon germanium (c-SiGe:Ga).

Figure 36:
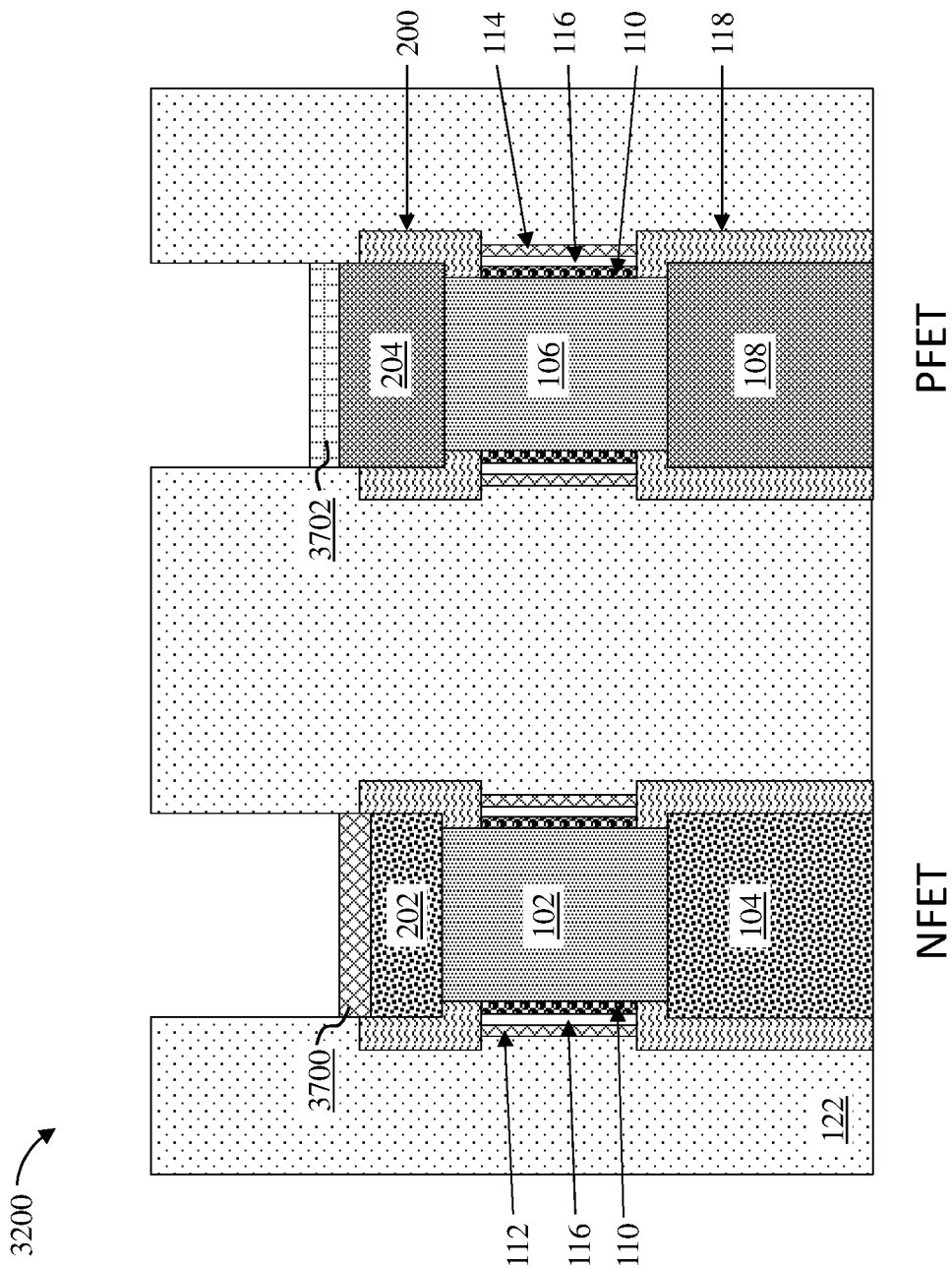

FIG. 36 depicts a cross-sectional view of the VFET structure 3200 after recrystallization during an intermediate operation of the exemplary method of fabricating a semiconductor device according to one or more embodiments of the invention. Once amorphized, a SPE/LPE process simultaneously recrystallizes both amorphous layers 3600 and 3602 to form SPE/LPE layers 3700 and 3702, respectively. In some embodiments of the present invention, the SPE/LPE layer 3700 is crystalline metastable SiP alloy (c-SiP) and the SPE/LPE layer 3702 is crystalline metastable gallium silicon germanium alloy (c-SiGe:Ga).

During recrystallization, implanted dopant ions are activated (i.e., dopants are properly located in the desired substitutional sites). Recrystallization of the SPE/LPE layers 3700 and 3702 can be accomplished using, for example, LSA at a peak temperature of about 900 degrees Celsius for a few hundreds of microseconds (e.g., less than 10 milliseconds and preferably from about 100 microseconds to about 1 millisecond). Alternatively, LPE recrystallization of the amorphous layers 3600 and 3602 (forming LPE layers 3700 and 3702, respectively) can be accomplished using, for example, a nanosecond laser melt anneal at a peak temperature of greater than 1200 degrees Celsius for about 100 nanoseconds. As discussed previously herein, this recrystallization process can cause a threshold voltage shift of about ±40 to 50 mV (n-FET increases, p-FET absolute value decreases) which is recovered by the common dipole layer 116.

Figure 37:
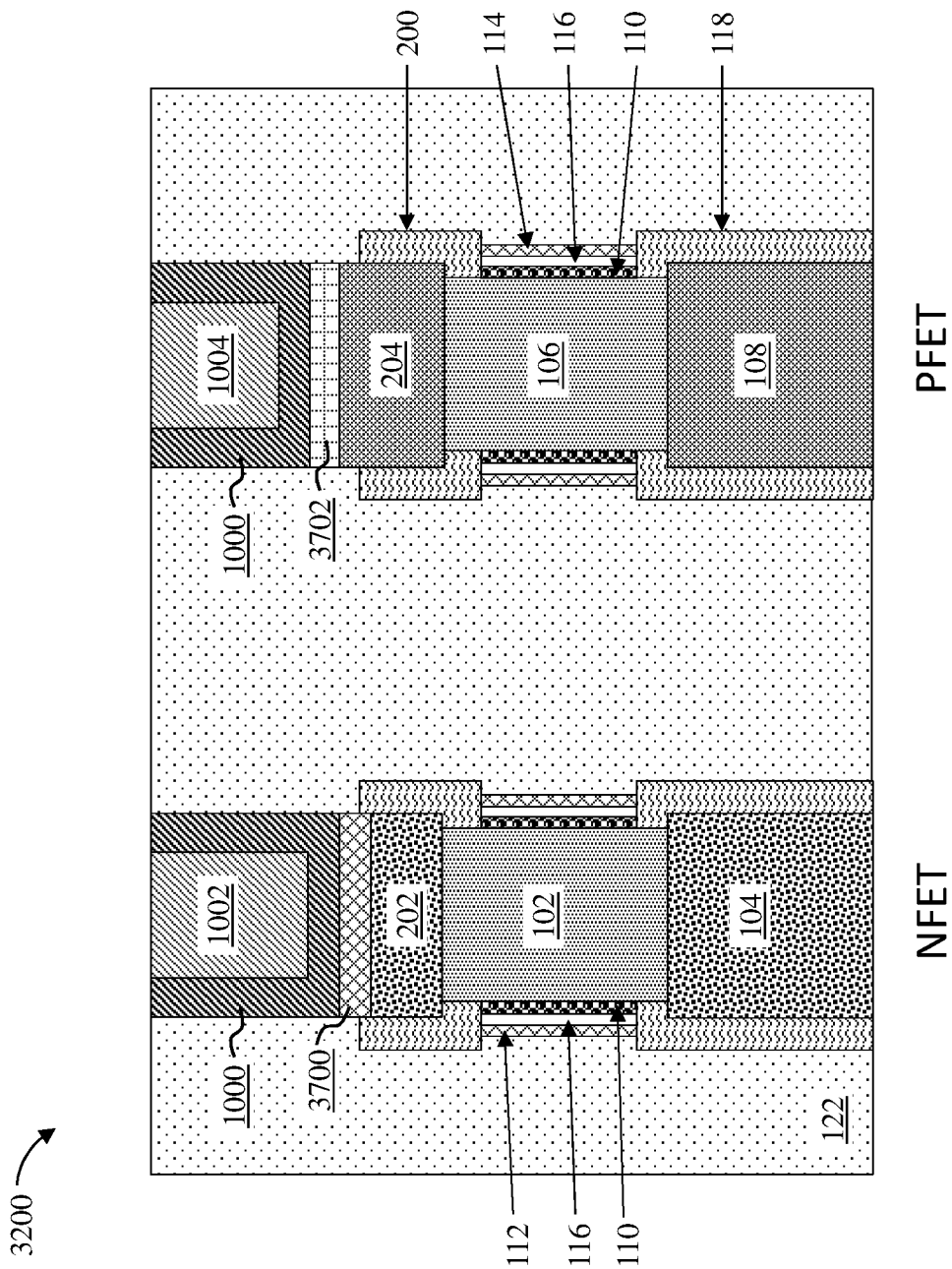

FIG. 37 depicts a cross-sectional view of the VFET structure 3200 after forming a metal liner 1000, NFET top S/D contact 1002 (contact 1002), and PFET top S/D contact 1004 (contact 1004) during an intermediate operation of the exemplary method of fabricating a semiconductor device according to one or more embodiments of the invention. As discussed previously herein, the top contacts 1002 and 1004 can be formed using known metallization techniques and can be made of any suitable conducting material, such as, for example, tungsten. In some embodiments of the invention the thickness of the ILD 122 is increased by depositing additional dielectric material prior to forming the top contacts 1002 and 1004. The ILD 122 can then be patterned into open trenches (not depicted) using known processes, such as a wet or dry etch. In some embodiments of the invention, the top contacts 1002 and 1004 are overfilled into the trenches, forming overburdens above a surface of the ILD 122. The overburden can then be planarized using, for example, CMP. Advantageously, the respective metastable dopant-semiconductor alloys of SPE/LPE layers 3700 and 3702 allow for semiconductor-metal junctions (formed between these layers and the metallic liner 1000) with very low contact resistivities of less than about $2 \times 10^{-9}$ ohm-cm$^2$ for both n-FETs and p-FETs, and, in the case of LPE layers 3700/3702 of less than about $1 \times 10$ ohm-cm$^2$.

Figure 38:
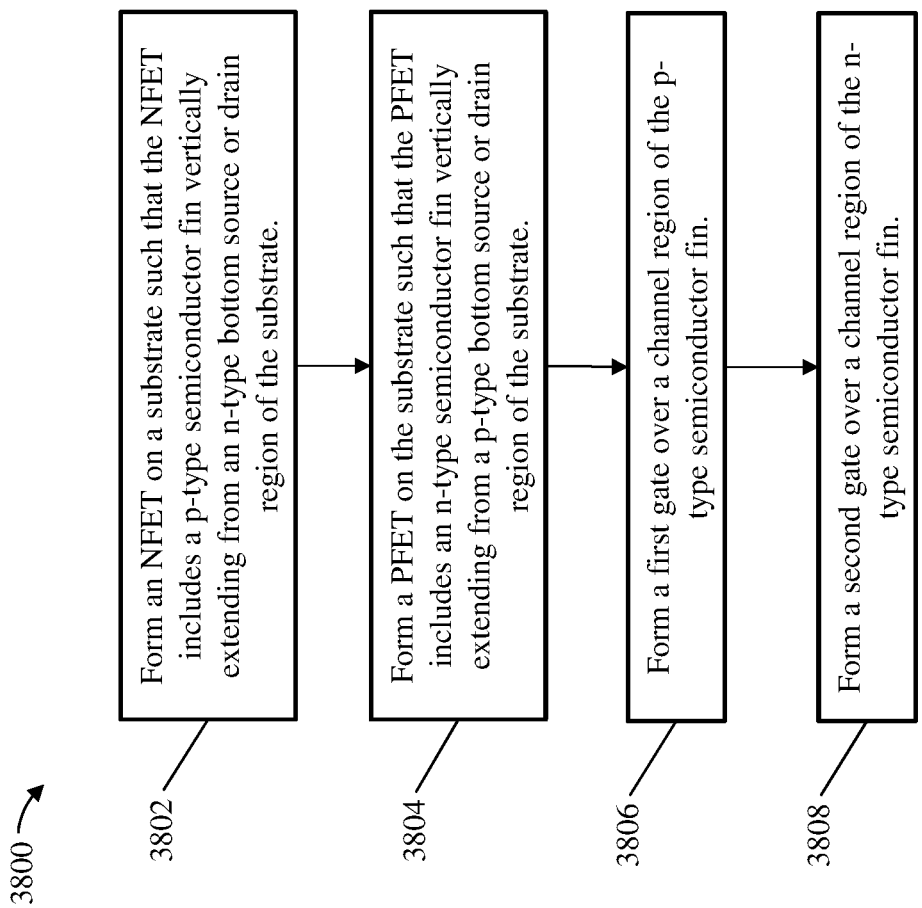
FIG. 38 depicts a flow diagram illustrating a method according to one or more embodiments of the invention.

FIG. 38 depicts a flow diagram 3800 illustrating a method for forming a semiconductor device according to one or more embodiments of the invention. As shown at block 3802, an NFET is formed on a substrate. The NFET includes a p-type semiconductor fin vertically extending from an n-type bottom source or drain region of the substrate. At block 3804, a PFET is formed on a substrate. The PFET includes an n-type semiconductor fin vertically extending from a p-type bottom source or drain region of the substrate. The semiconductor fins can be formed in a similar manner as the fins 102 and 106 (as depicted in FIG. 1) according to one or more embodiments.

As shown at blocks 3806 and 3808, a first gate is formed over a channel region of the p-type semiconductor fin and a second gate is formed over a channel region of the n-type semiconductor fin. The gates each include a common dipole layer for threshold voltage centering as previously described herein.

Figure 39:
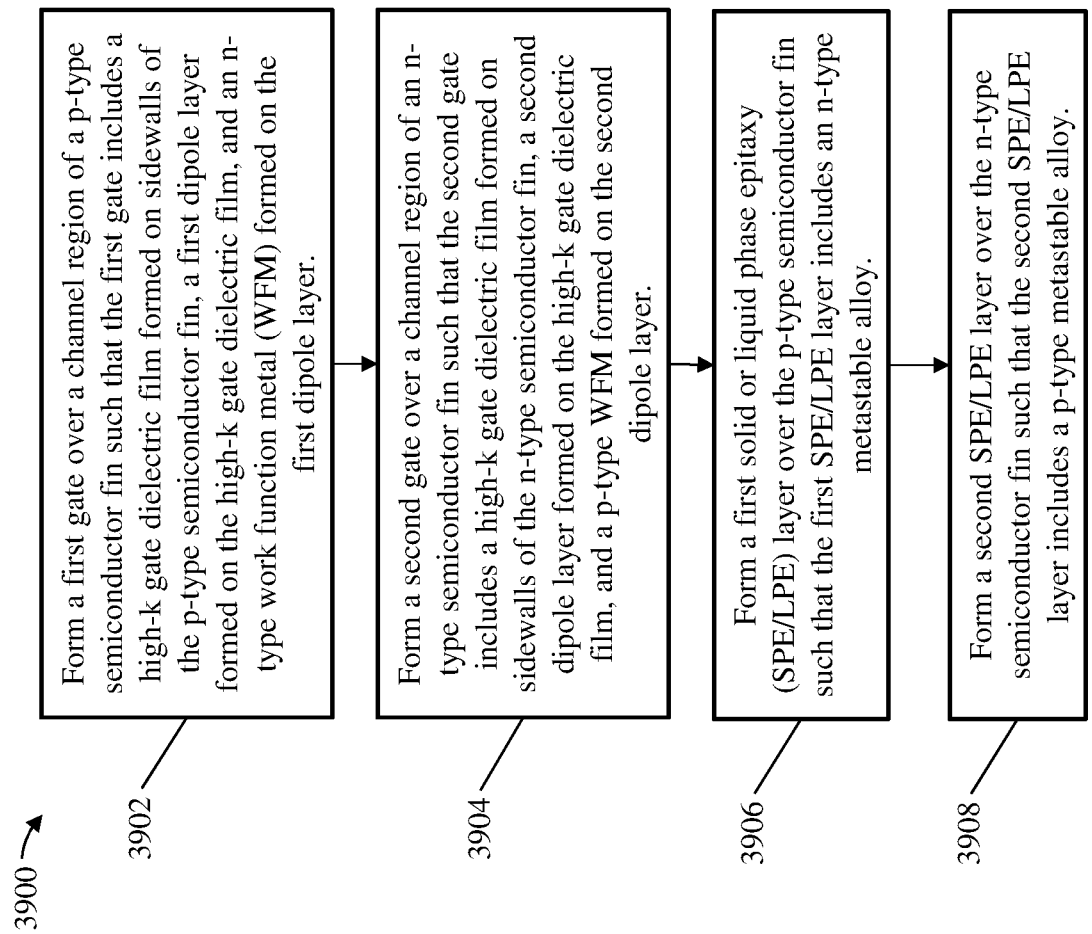
FIG. 39 depicts a flow diagram illustrating a method according to one or more embodiments of the invention.

FIG. 39 depicts a flow diagram 3900 illustrating a method for forming a semiconductor device according to one or more embodiments of the invention. As shown at block 3902, a first gate is formed over a channel region of a p-type semiconductor fin such that the first gate includes a high-k gate dielectric film formed on sidewalls of the p-type semiconductor fin, a first dipole layer formed on the high-k gate dielectric film, and an n-type work function metal (WFM) formed on the first dipole layer.

As shown at block 3904, a second gate is formed over a channel region of an n-type semiconductor fin such that the second gate includes a high-k gate dielectric film formed on sidewalls of the n-type semiconductor fin, a second dipole layer formed on the high-k gate dielectric film, and a p-type WFM formed on the second dipole layer. The first and second dipole layers are common dipole layers that provide threshold voltage centering as previously described herein.

As shown at block 3906, a first SPE/LPE layer is formed over the p-type semiconductor fin such that the first SPE/LPE layer includes an n-type metastable alloy. The first SPE/LPE layer can be formed in a similar manner as the SPE/LPE layer 500 (as depicted in FIG. 10), the SPE/LPE layer 1800 (as depicted in FIG. 19), the SPE/LPE layer 2300 (as depicted in FIG. 24), the SPE/LPE layer 3000 (as depicted in FIG. 31), or the SPE/LPE layer 3700 (as depicted in FIG. 37), according to one or more embodiments. The first SPE/LPE layer is alloyed with n-type dopants as described previously herein.

As shown at block 3908, a second SPE/LPE layer is formed over the n-type semiconductor fin such that the second SPE/LPE layer includes a p-type metastable alloy. The second SPE/LPE layer can be formed in a similar manner as the SPE/LPE layer 900 (as depicted in FIG. 10), the SPE/LPE layer 1802 (as depicted in FIG. 19), the SPE/LPE layer 2302 (as depicted in FIG. 24), the SPE/LPE layer 3002 (as depicted in FIG. 31), or the SPE/LPE layer 3702 (as depicted in FIG. 37), according to one or more embodiments. The second SPE/LPE layer is alloyed with p-type dopants as described previously herein.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising,"

"includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and can not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming an n-type field effect transistor (NFET) on a substrate, the NFET comprising a p type semiconductor fin vertically extending from an n-type bottom source or drain region disposed on the substrate;
    forming a p-type field effect transistor (PFET) on the substrate, the PFET comprising an n-type semiconductor fin vertically extending from a p-type bottom source or drain region disposed on the substrate;
    forming the NFET comprises forming a first gate around a channel region of the p-type semiconductor fin; and
    forming the PFET comprises forming a second gate around a channel region of the n-type semiconductor fin;
    wherein the first gate and the second gate each comprises a dipole layer;
    wherein the NFET and PFET each comprises a threshold voltage of about 150 mV to about 250 mV;
    wherein a difference between the threshold voltages of the NFET and PFET is less than about 50 mV;
    forming a top spacer on the first gate adjacent to sidewalls of the p-type semiconductor fin.

2. The method of claim 1, wherein the dipole layer decreased the threshold voltage of the NFET having the first gate by about 40 to 50 mV and increased an absolute value of the linear threshold voltage of the PFET having the second gate by about 40 to 50 mV.

3. The method of claim 1, further comprising:
    forming an n-type top source or drain region on a surface of the p-type semiconductor fin and a p-type top source or drain region on a surface of the n-type semiconductor fin;
    forming a first epitaxy layer on the n-type top source or drain region, the first epitaxy layer comprising an n-type metastable alloy; and
    forming a second epitaxy layer on the p-type top source or drain region, the second epitaxy layer comprising a p-type metastable alloy.

4. The method of claim 1, wherein the n-type semiconductor fin comprises silicon germanium.

5. The method of claim 4, wherein the n-type semiconductor fin further comprises a germanium content of about 1 to about 50 atomic percent.

6. The method of claim 1, wherein a material of the dipole layers comprises magnesium oxide i (MgO), lanthanum oxide (LaO), or yttrium oxide (YO).

7. The method of claim 3, wherein forming the first epitaxy layer further comprises forming a trench epitaxy layer on the n-type top source or drain region and recrystallizing trench epitaxy layer into the first epitaxy layer.

8. The method of claim 1 further comprising forming a bottom spacer on a sidewall of the n-type bottom source or drain region.

9. The method of claim 3 further comprising forming a first top source or drain contact on a surface of the first epitaxy layer and a second top source or drain contact on a surface of the second epitaxy layer.

10. A method for forming a complementary metal oxide semiconductor (CMOS) device, the method comprising:
    forming a first gate around a channel region of a p-type semiconductor fin for a first transistor, the first gate comprising a high-k gate dielectric film formed on sidewalls of the p-type semiconductor fin, a first dipole layer formed on the high-k gate dielectric film, and an n-type work function metal (WFM) formed on the first dipole layer;
    forming a second gate around a channel region of an n-type semiconductor fin for a second transistor, the second gate comprising a high-k gate dielectric film formed on sidewalls of the n-type semiconductor fin, a second dipole layer formed on the high-k gate dielectric film, and a p-type WFM formed on the second dipole layer;
    forming a first epitaxy layer over the p-type semiconductor fin, the first epitaxy layer comprising an n-type metastable alloy; and
    forming a second epitaxy layer over the n-type semiconductor fin, the second epitaxy layer comprising a p-type metastable alloy;
    wherein the first and second dipole layers comprise identical material;
    wherein the first and second gates each comprise a threshold voltage of about 150 mV to about 250 mV;
    wherein a difference between the threshold voltages of the first and second gates is less than about 50 mV;
    wherein a top spacer is formed on the first gate and adjacent to sidewalk of the p-type semiconductor fin.

11. The method of claim 10, wherein the first dipole layer of the first gate decreased a threshold voltage of the first transistor by about 40 to 50 mV.

12. The method of claim 10, wherein the second dipole layer of the second gate increased the absolute value of a threshold voltage of the second transistor by about 40 to 50 mV.

13. A semiconductor device comprising:
- an NFET on a substrate, the NFET comprising a p-type semiconductor fin vertically extending from an n-type bottom source or drain region disposed on the substrate; and
- a PFET on the substrate, the PFET comprising an n-type semiconductor fin vertically extending from a p-type bottom source or drain region disposed on the substrate; and
- wherein the NFET comprises a first gate formed around a channel region of the p-type semiconductor fin and the PFET comprises a second gate formed around a channel region of the n-type semiconductor fin, the gates each comprising a dipole layer made of an identical material;
- wherein the NFET and PFET each comprises threshold voltage of about 150 mV to about 250 mV;
- wherein a difference between the threshold voltages of the NFET and PFET is less than about 50 mV; wherein
- a top spacer is formed on the first gate and adjacent to sidewalls of the p-type semiconductor fin.

14. The semiconductor device of claim 13, wherein the n-type semiconductor fin comprises SiGe.

15. The semiconductor device of claim 13, wherein the material comprises magnesium oxide (MgO), lanthanum oxide (LaO), or vttrium oxide (YO), the n-type bottom source or drain region comprises SiP, and the p-type bottom source or drain region comprises SiGe.

16. The semiconductor device of claim 13, further comprising:
- an n-type top source or drain region on a surface of the p-type semiconductor fin and a p-type top source or drain region on a surface of the n-type semiconductor fin;
- a first epitaxy layer on the n-type top source or drain region, the first epitaxy layer comprising an n-type metastable alloy; and
- a second epitaxy layer on the p-type top source or drain region, the second epitaxy layer comprising a p-type metastable alloy.

17. The semiconductor device of claim 16, wherein the first epitaxy layer comprises crystalline silicon phosphide (c-SiP) and the second epitaxy layer comprises crystalline gallium doped silicon germanium (c-SiGe:Ga).

18. The semiconductor device of claim 16, wherein the first epitaxy layer comprises crystalline silicon phosphide (c-SiP) and the second epitaxy layer comprises crystalline gallium doped germanium (c-Ge:Ga).

19. The semiconductor device of claim 16, wherein the first epitaxy layer comprises crystalline silicon phosphide (c-SiP) and the second epitaxy layer comprises crystalline boron and gallium doped germanium (c-Ge:B:Ga).

* * * * *